(12) United States Patent
He

(10) Patent No.: US 12,418,985 B2
(45) Date of Patent: Sep. 16, 2025

(54) CONNECTION ASSEMBLY, BOARD-LEVEL ARCHITECTURE, AND COMPUTING DEVICE

(71) Applicant: HUAWEI TECHNOLOGIES CO., LTD., Guangdong (CN)

(72) Inventor: Dapeng He, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 255 days.

(21) Appl. No.: 18/359,977

(22) Filed: Jul. 27, 2023

(65) Prior Publication Data

US 2023/0380066 A1 Nov. 23, 2023

Related U.S. Application Data

(63) Continuation of application No. PCT/CN2021/125695, filed on Oct. 22, 2021.

(30) Foreign Application Priority Data

Jan. 28, 2021 (CN) .......................... 202110121288.8

(51) Int. Cl.
*H05K 1/18* (2006.01)
*H01L 23/00* (2006.01)
*H05K 1/11* (2006.01)

(52) U.S. Cl.
CPC ............. *H05K 1/18* (2013.01); *H01L 24/16* (2013.01); *H05K 1/11* (2013.01); *H01L 2224/16225* (2013.01); *H05K 2201/10984* (2013.01)

(58) Field of Classification Search
CPC .. H05K 1/18; H05K 1/11; H05K 2201/10984; H01L 24/16; H01L 2224/16225
(Continued)

(56) References Cited

U.S. PATENT DOCUMENTS

| 4,667,219 A | 5/1987 | Lee et al. |
| 6,330,164 B1 * | 12/2001 | Khandros ............... H01L 24/11 257/E21.507 |

(Continued)

FOREIGN PATENT DOCUMENTS

| CN | 1744303 A | 3/2006 |
| CN | 101405852 A | 4/2009 |

(Continued)

OTHER PUBLICATIONS

European Search Report for EP Application No. 21922391.4 dated Jun. 6, 2024, 6 pages.

(Continued)

*Primary Examiner* — Andargie M Aychillhum

(57) ABSTRACT

The technology of this disclosure relates to a connection assembly, a board-level architecture, and a computing device. The connection assembly is configured to connect a semiconductor wafer and a lower layer substrate that are disposed opposite to each other, and includes an insulator structure and a plurality of connection terminals that are disposed at spacings. A first end and a second end of any one of the plurality of connection terminals each are provided with a welding structure. The first end is welded to the semiconductor wafer, and the second end is welded to the lower layer substrate. The insulator structure includes a plurality of empty slots provided at spacings. Positions of the plurality of empty slots are in a one-to-one correspondence with positions of the plurality of connection terminals. Any one of the plurality of connection terminals is disposed in any empty slot, to fasten a position of the connection terminal.

26 Claims, 15 Drawing Sheets

(58) Field of Classification Search
USPC .......................................................... 361/783
See application file for complete search history.

(56) References Cited

U.S. PATENT DOCUMENTS

| | | |
|---|---|---|
| 6,786,741 B2 | 9/2004 | Marsiglio et al. |
| 7,456,046 B2 | 11/2008 | Buchwalter et al. |
| 10,468,369 B2 | 11/2019 | Fricker |
| 2011/0001232 A1 | 1/2011 | Weissbach et al. |
| 2014/0055970 A1* | 2/2014 | Crisp .................... H05K 1/181 |
| | | 361/783 |
| 2014/0199895 A1 | 7/2014 | Chui |
| 2019/0027460 A1 | 1/2019 | Fricker |

FOREIGN PATENT DOCUMENTS

| | | |
|---|---|---|
| CN | 106486490 A | 3/2017 |
| CN | 107808860 A | 3/2018 |
| CN | 105206640 B | 4/2020 |
| JP | 2005064339 A | 3/2005 |
| JP | 2007287551 A | 11/2007 |
| WO | 2006084971 A1 | 8/2006 |

OTHER PUBLICATIONS

International Search Report for PCT/CN2021/125695 dated Oct. 22, 2021, 9 pages.

* cited by examiner

Empty slot on an upper bracket

Empty slot on an upper bracket

CONNECTION ASSEMBLY, BOARD-LEVEL ARCHITECTURE, AND COMPUTING DEVICE

CROSS-REFERENCE TO RELATED APPLICATIONS

This application is a continuation of International Application No. PCT/CN2021/125695, file on Oct. 22, 2021, which claims priority to Chinese Patent Application No. 202110121288.8, filed on Jan. 28, 2021. The disclosures of the aforementioned applications are hereby incorporated by reference in their entireties.

TECHNICAL FIELD

This application relates to the chip packaging field, and in particular, to a connection assembly, a board-level architecture, and a computing device.

BACKGROUND

With continuous development of artificial intelligence technologies, electronic devices have increasingly high requirements for computer operation capabilities, and electronic products develop toward light weight, multifunctionality, and low power consumption. Based on the foregoing premise, a system-on-wafer (SoW) technology is a quite competitive direction for next-generation artificial intelligent products. In replacement of a current distributed chip-on-board solution, the system-on-wafer technology can effectively improve computing power, reduce power consumption, and save floor space, to meet requirements for increasingly light, small, short, thin, and low-cost microelectronic products on the market. A size of a chip packaged by using a wafer level chip size package technology is highly miniaturized, and chip costs significantly decrease with a decrease of a chip size and an increase of a wafer size. The wafer level chip size package technology is a technology capable of integrating IC design, wafer manufacturing, packaging and testing, and substrate manufacturing, and is a hot topic in the current packaging field and a future development trend.

Currently, a wafer level chip is usually connected to a printed circuit board (PCB) through land grid array (LGA) packaging or the like. In this solution, a deviation that occurs during connection and assembly can be reduced only by a stress of thousands of kg. High pressure causes a series of problems such as low reliability of a device, a low fitting interface tolerance capability, high energy consumption, and high costs.

SUMMARY

This application relates to a connection assembly and an electronic computing device, to effectively resolve an ultra-large stress retention problem and a low-tolerance fitting capability problem. Certain technical solutions are as follows.

According to a first aspect, the technology of this application relates to a connection assembly, configured to connect a semiconductor wafer and a lower layer substrate that are disposed opposite to each other, and including an insulator structure and a plurality of connection terminals that are disposed at spacings.

A first end and a second end of any one of the plurality of connection terminals each are provided with a welding structure. The first end and the second end are two opposite ends of the connection terminal. The first end is welded to the semiconductor wafer through the welding structure. The second end is welded to the lower layer substrate through the welding structure.

The insulator structure includes a plurality of empty slots provided at spacings. Positions of the plurality of empty slots are in a one-to-one correspondence with positions of the plurality of connection terminals. At least one of the plurality of connection terminals is disposed in a corresponding empty slot, to fasten a position of the connection terminal.

In the foregoing technical solution, a first end and a second end of any one of the plurality of connection terminals each are provided with a welding structure. A conventional press-fit manner is replaced with a welding manner. In an entire process, a press-fit stress or a retention force of thousands of kg applied in the press-fit manner is not needed. This avoids device failures and board-level cracking caused by ultra-large stress, and also reduces power consumption and costs of a device. In addition, the empty slots of the insulator structure have a function of fastening and holding the connection terminals, to effectively avoid lateral deviation or deformation of the connection terminals or bonding between two terminals, and therefore avoid problems such as an open circuit and a short circuit of the connection assembly, and greatly improve reliability of the connection assembly.

In a possible embodiment, the connection terminal includes a body and a connection part, and the connection part is located at, at least, one end of the body and is combined with the welding structure.

In the foregoing technical solution, the connection part is in contact with the welding structure to carry solder, to prevent the solder from extending to the body of the connection terminal. In an actual assembly process, a body of the connection assembly arranged in an array is deformed, for example, bent or side-shifted. If there is solder on the body of the connection assembly, a risk of lap welding between terminals occurs. Therefore, the connection part can further fasten and hold the welding structure, to improve reliability of a device.

In a possible embodiment, both the body and the connection part are cylindrical structures, the connection part is disposed at the first end of the connection terminal, an area of any cross section of the connection part along a vertical direction is greater than an area of any cross section of the body along the vertical direction, and a height of the connection part along the vertical direction is less than a height of the body along the vertical direction.

In the foregoing technical solution, because a cross-sectional area of the connection part is larger than a cross-sectional area of the body, the connection part can have a function of carrying solder, to prevent the solder from extending to the body of the connection terminal. In an actual assembly process, the body of the connection assembly arranged in an array is deformed, for example, bent or side-shifted. If there is solder on the body of the connection assembly, a risk of lap welding between terminals occurs. Therefore, the connection part can further fasten and hold the welding structure, to improve reliability of a device. In addition, because the cross-sectional area is increased, in a process in which the connection assembly is assembled with the lower layer substrate and the semiconductor wafer through solder pads, corresponding positions of the connection terminals and the solder pads can be better calibrated, to improve assembly reliability and a yield.

In a possible embodiment, the welding structure is a solder ball.

The solder ball mentioned in the foregoing technical solution is solder that exceeds a specific size, and the specific size depends on both a size of the solder and a welding area of a solder pad. When the solder reaches a specific size on the solder pad, surface tension of the solder naturally enables the solder to form a spherical structure. It can be understood that a smaller welding area of the solder pad indicates that the solder is more likely to reach a specific size to obtain a solder ball form. Because the solder ball has an extension capability, when a circuit board and the semiconductor wafer are aligned in a press fit, the solder ball and the connection terminal may be adaptively adjusted based on a relative inter-board distance at positions of the solder ball and the connection terminal. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device.

In a possible embodiment, the welding structure includes a solder ball and a solder structure, a surface of the connection part that is away from the body is provided with the solder ball, the second end of the connection terminal is provided with the solder structure, and the solder structure covers a part of the body to fasten the connection terminal.

In the foregoing technical solution, because both the solder structure and the solder ball have a stress absorption capability, when a circuit board and the semiconductor wafer are aligned in a press fit, the connection assembly may be adaptively adjusted based on a relative inter-board distance at a position of the connection assembly. If a horizontal height of the substrate at a local position is large, tensile stress on the connection terminal at the position is also large. In this case, a second end of the body may be away from the solder structure. If a horizontal height of the substrate at a local position is small, compressive stress on the connection terminal at the position is large. In this case, the second end of the body may be close to the solder structure. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device. Compared with a manner in which solder balls are disposed at two ends, a solder capacity of the solder structure is easier to control, and a specific structure and a size of the solder structure may be customized according to an actual requirement. In this way, an amount of solder is controllable, reliability of the connection assembly is improved, and costs are also reduced.

In a possible embodiment, the solder structure includes solder and a solder accommodation structure, the solder is injected into the solder accommodation structure, and a part of the body of the connection terminal is located in the solder accommodation structure and is covered by the solder.

In the foregoing technical solution, the solder accommodation structure is space enclosed by a cavity part region in the insulator structure and an upper surface of the circuit board 201. The space may accommodate filler solder, and a quantity of the filler solder may be adjusted based on actual application.

In a possible embodiment, the solder accommodation structure is a metal enclosure frame with a side surface, or the solder accommodation structure is a metal box with a side surface and a bottom surface, and the bottom surface is a surface facing the lower layer substrate.

In the foregoing technical solution, the solder structure formed by the metal box or the metal enclosure frame and the solder ball have a stress absorption capability. Therefore, when the circuit board and the semiconductor wafer are aligned in a press fit, the connection assembly may be adaptively adjusted based on a relative inter-board distance at a position of the connection assembly. In an entire process, a press-fit stress or a retention force of thousands of kg applied in a conventional manner is not needed. This avoids device failures and board-level cracking caused by ultra-large stress, and also reduces power consumption and costs of a device.

In a possible embodiment, the connection assembly further includes a solder mask layer, the solder mask layer and the insulator structure are stacked, the solder mask layer includes a plurality of through grooves provided at spacings, positions of the plurality of through grooves are in a one-to-one correspondence with the positions of the plurality of connection terminals, the through grooves are for forming the solder accommodation structure, and at least one of the plurality of connection terminals penetrates a corresponding empty slot of the insulator structure and is disposed in a corresponding through groove, to fasten a position of the connection terminal.

In the foregoing technical solution, a height of soldering tin can be increased by the solder mask layer, so that a height difference between the connection terminals and a height difference on a surface of the circuit board can be further absorbed. In this way, stress to be transferred to a chip is absorbed by the connection assembly. In an entire process, a press-fit stress or a retention force of thousands of kilograms (kg) applied in a conventional manner is not needed. This avoids device failures and board-level cracking caused by ultra-large stress, and also reduces power consumption and costs of a device.

In a possible embodiment, each empty slot of the insulator structure includes a fastening part region and a cavity part region, the fastening part region and the cavity part region are divided along a vertical direction of the plurality of empty slots, an area of any cross section of the empty slot in the fastening part region is less than an area of any cross section of the empty slot in the cavity part region along the vertical direction, and the fastening part region is for fastening a position of the body of the connection terminal.

In the foregoing technical solution, due to existence of the fastening part region, a position of the connection terminal 401 and a connection status between the connection terminal 401 and the substrate can be effectively fastened. This can effectively avoid tilting, bending, or cracking of the connection terminal caused by a position deviation during press-fitting of the connection assembly, and therefore avoid problems such as a device failure and an open circuit or a short circuit of an electrical connection, and greatly improve reliability of the connection assembly. The cavity part region is for providing abundant filling space for solder. In a board press-fit process, stress applied by the connection terminals to the solder increases. In this case, the solder naturally extends to a surrounding gap. This increases a risk of lap welding between the connection terminals, and therefore causes a short circuit of a device. The cavity part region can greatly alleviate the foregoing problem. In a press-fit stage, the cavity part region provides great extension space for the solder, and absorbs outward tension of the solder. This greatly alleviates a short circuit problem of the device, and improves reliability of the connection assembly.

In a possible embodiment, the cavity part region is for forming the solder accommodation structure.

In the foregoing technical solution, the solder accommodation structure is directly formed by the cavity part region. This simplifies a manufacturing process and a processing technique of the solder accommodation structure, and reduces manufacturing costs of a connector. In addition, in a press-fit stage, the cavity part region provides great extension space for solder, and absorbs outward tension of the solder. This greatly alleviates a short circuit problem of a device, and improves reliability of the connection assembly.

In a possible embodiment, the welding structure is a solder ball, and the connection terminal is welded to the semiconductor wafer and the lower layer substrate through the solder ball.

In the foregoing technical solution, a conventional press-fit manner is replaced with a welding manner. In an entire process, a press-fit stress or a retention force of thousands of kg applied in the press-fit manner is not needed. This avoids device failures and board-level cracking caused by ultra-large stress, and also reduces power consumption and costs of a device. In addition, the empty slots of the insulator structure have a function of fastening and holding the connection terminals, to effectively avoid lateral deviation or deformation of the connection terminals or bonding between two terminals, and therefore avoid problems such as an open circuit and a short circuit of the connection assembly, and greatly improve reliability of the connection assembly.

In a possible embodiment, the body is a deformable structure, to adjust a height of the connection terminal along a vertical direction or displacement of the connection terminal along a horizontal direction.

In the foregoing technical solution, the deformable structure can further absorb a deviation difference between the circuit board 201 and the semiconductor wafer 101. In this way, stress to be transferred to the wafer 101 is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device. The deformable structure can absorb inter-board stress. In addition, compared with a standard spring structure, a loop structure with a bending capability has a shorter extension length, and therefore has a shorter conduction line. During electronic assembly, resistance is smaller, and a through-current capability of an electrical signal is stronger.

In a possible embodiment, the deformable structure is a spring structure. The spring structure has a larger deformation range to some extent, and therefore can be used at some positions with large displacement deviations.

In a possible embodiment, the deformable structure is a loop structure including a plurality of "C"-shaped structures connected head to tail along the vertical direction.

In the foregoing technical solution, the two types of structures can absorb inter-board stress. In addition, compared with a standard spring structure, the loop structure with a bending capability has a shorter extension length, and therefore has a shorter conduction line. During electronic assembly, resistance is smaller, and a through-current capability of an electrical signal is stronger.

In a possible embodiment, the connection part is located at the first end and the second end, and at least one of the first end and the second end is covered by the solder ball. This facilitates connection between the connection assembly, and the circuit board and the semiconductor wafer.

In a possible embodiment, at least four of the plurality of connection terminals form a connection terminal array of M rows×N columns, both M and N are integers greater than or equal to 2, at least four of the plurality of empty slots of the insulator structure form an empty slot array of K rows×J columns, and both K and J are integers greater than or equal to 2. Positions of the connection terminals in the array form can be better calibrated during assembly, so that a yield and reliability can be greatly improved.

According to a second aspect, this application provides a board-level architecture, including a semiconductor wafer, a lower layer substrate, an upper bracket, a lower bracket, and the foregoing connection assembly. The connection assembly is disposed between the semiconductor wafer and the lower layer substrate, to connect the semiconductor wafer to the lower layer substrate.

A plurality of first solder pads are disposed on a surface of the semiconductor wafer that is close to the connection terminal. A plurality of second solder pads are disposed on a surface of the lower layer substrate that is close to the connection terminal. The plurality of first solder pads and the plurality of second solder pads are respectively connected to first ends and second ends of a plurality of corresponding connection terminals.

The upper bracket is fastened to an upper surface of the lower layer substrate through a connection part. The lower bracket is fastened to a lower surface of the lower layer substrate through a connection part.

The upper bracket includes at least one empty slot region provided at spacings, and at least one connection assembly is disposed in a corresponding empty slot region.

In the foregoing technical solution, the upper bracket and/or the lower bracket are mounted to prevent warpage and deformation of a circuit board by using the brackets, so as to avoid problems such as board-level cracking, an electrical open circuit, and a device failure caused by deformation, effectively adjust a gap distance between the circuit board and the semiconductor wafer, and improve stability and reliability of signal conduction.

According to a third aspect, this application provides a board-level architecture, including a semiconductor wafer, a lower layer substrate, and the foregoing connection assembly. The lower layer substrate includes a plurality of blind slots provided at spacings. Positions of the plurality of blind slots are in a one-to-one correspondence with positions of a plurality of connection terminals. The blind slots are for forming a solder accommodation structure, to adjust a displacement difference between the semiconductor wafer and the lower layer substrate along a horizontal direction or a vertical direction.

In the foregoing technical solution, the solder accommodation structure is disposed on the lower layer substrate. Because a size of the solder accommodation structure on the lower layer substrate can be further adjusted, a tolerance between the semiconductor wafer and the lower layer substrate can be further absorbed, to further reduce problems such as device failures caused by stress.

According to a fourth aspect, this application provides a board-level architecture, including a semiconductor wafer, a lower layer substrate, and the foregoing connection assembly. A solder mask layer stacked with the lower layer substrate is provided on an upper surface of the lower layer substrate. The solder mask layer includes a plurality of blind slots provided at spacings. Positions of the plurality of blind slots are in a one-to-one correspondence with positions of a plurality of connection terminals. The blind slots are for forming a solder accommodation structure, to adjust a displacement difference between the semiconductor wafer and the lower layer substrate along a horizontal direction or a vertical direction.

In the foregoing technical solution, a height of soldering tin can be increased by the solder mask layer, so that a height difference between the connection terminals and a height difference on a surface of the circuit board can be further absorbed. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device.

According to a fifth aspect, this application provides a board-level architecture, further including a plurality of spacers, where any spacer structure of the plurality of spacers is disposed between an upper surface of an insulator structure and a lower surface of a semiconductor wafer in a connection assembly, and is configured to control a gap distance between a lower layer substrate and the semiconductor wafer.

In the foregoing technical solution, the spacers are disposed locally. Compared with an upper bracket located between connection assemblies, the spacers can further absorb a local tolerance, to significantly resolve problems such as an open circuit, a board-level failure, and damage caused by an excessively large tolerance, and further improve assembly quality and assembly reliability.

In a possible embodiment, the spacer structures are disposed at four endpoint positions of the insulator structure.

In a possible embodiment, the semiconductor wafer is a chip, a wafer, a wafer assembly, or a printed circuit board provided with a wafer, and the lower layer substrate is a printed circuit board.

According to a sixth aspect, this application provides a connection assembly, including: a plurality of flexible metal wires, where one end of each flexible metal wire is connected to a chip, and the other end of each flexible metal wire is connected to a circuit board; and a support body, where the support body includes M empty slots, the plurality of flexible metal wires are disposed in N empty slots, M is an integer greater than or equal to 2, N is an integer greater than or equal to 1, M is greater than or equal to N, the support body is disposed between the chip and the circuit board, and the empty slots penetrate the support body.

Specifically, the chip may be a single chip, a large-sized chip, a wafer, or the like (collectively referred to as a "chip" below), and the circuit board may be a printed circuit board (PCB) or a substrate such as a glass substrate (collectively referred to as a "circuit board" below). For ease of description, the chip and the circuit board are used as examples in this application.

The flexible metal wire should be a connection wire that has a bending capability under the action of an external force and that has a conducting capability. A material of the flexible metal wire may be in a plurality of forms, for example, gold, aluminum, copper, or a corresponding alloy; or the flexible metal wire may have a metal plating layer, for example, a conventional plating metal material such as nickel or gold.

Because the flexible metal wire may be bent and deformed based on an external force, when different devices with different heights are in a press fit on a surface of the circuit board, the flexible metal wire may be adaptively bent and deformed based on different heights of the surface of the circuit board. For example, the flexible metal wire is greatly bent and deformed on a surface of the circuit board that is close to the chip, and is slightly bent and deformed on a surface of the circuit board that is away from the chip. This capability of applying different deformation based on different heights absorbs stress to be transferred to the chip that is not prone to deformation, to achieve an adaptive fitting interface tolerance capability. Further, in the conventional technology, a press-fit retention force is usually applied to a connection terminal to implement a press-fit between a chip and a circuit board, where the retention force reaches thousands of kg. Because the flexible metal wire implements electric conduction through metal welding and connection, no additional retention force needs to be applied to achieve conduction effect. Therefore, no great mounting retention force is needed. This greatly reduces mounting difficulty and mounting costs. In addition, to ensure that the chip and the circuit board do not fail due to a great retention force, a fitting tolerance between a plurality of accessories of the chip and the circuit board needs to be accurately controlled. In the flexible metal wire provided in this application, a press-fit stress of thousands of kg in the conventional technology is not needed, and a fitting tolerance between a plurality of accessories can be reduced by the flexible metal wire. This greatly reduces loss of the chip caused by a height difference, and reduces costs and power consumption. A fitting interface tolerance that can be implemented may exceed 0.5 mm or even 1 mm. This greatly improves a press-fit tolerance capability.

Further, coefficients of thermal expansion (CTE) of materials of the circuit board and the chip vary greatly. During operation of a product, a temperature change causes position deviations of positions of solder pads on the substrate and the chip. Theoretical analysis shows that relative displacement of the solder pads may reach 400 µm, which is 10 times greater than current conventional board-level relative displacement. Therefore, a risk of a failure of connection terminals in contact is quite high. In the connection assembly provided in this application, the flexible metal wire has a flexible tolerance capability along both a horizontal direction and a vertical direction, to effectively resolve reliability problems caused by a mismatch between coefficients of thermal expansion, vibration, and the like during a temperature cycle test or operation at high temperature or low temperature.

Further, because a deformation process of the flexible metal wire may be considered as plastic deformation, compared with a metal curved sheet, a metal wire, or a C-shaped mechanical part with elastic deformation, device performance is not affected due to reverse tension caused by deformation, and uncontrollable problems such as stress fatigue and structural fracture caused by long-time press-fitting are avoided. This greatly improves reliability of a connection device provided in this application.

Further, costs of the flexible metal wire are quite low. Different quantities of flexible metal wires may be configured on solder pads based on an actual case, and sizes of the solder pads may be in a plurality of forms. Therefore, the solution provided in this application can adapt to an interconnection scenario with a quite low solder pad spacing and quite high device density. This greatly improves adaptability of the connection assembly provided in this application.

With reference to the sixth aspect, in another possible implementation, A empty slots of the M empty slots are for forming an empty slot array of K rows×J columns, where both K and J are integers greater than or equal to 2, M is greater than or equal to A, and A is equal to K multiplied by J.

It should be understood that the empty slots may be arranged in a plurality of forms. In an example, an arrangement form may be the array arrangement in the foregoing solution, or a non-array empty slot set. In addition, the array may be a standard rectangular array of K rows×J columns, or may be an array of another shape with a specific quantity of rows and a specific quantity of columns. A person skilled in the art may arrange positions of the empty slots according to a requirement. It should be understood that there should be a specific spacing between empty slots.

Specifically, a size of the empty slot may be in a plurality of forms. The support body may be obtained in a plurality of manners. In an example, an injection molding material may be injected into a pre-designed mold, and a formed support body with a cavity array is taken out, and is fastened to the chip through an adhesive. Alternatively, an empty slot region is exposed on the support body by using EV light through exposure and development, to obtain a support body with an empty slot array. It should be understood that the empty slot array of K rows×J columns is an empty slot array with K rows and J columns. The support body structure may control a gap between the chip and the circuit board according to an actual requirement, to avoid direct contact between the chip and the circuit board, and make the gap controllable. In addition, the support body structure may cooperate with subsequent screw and nut assembly, to correct parallelism between mounting surfaces of the chip and the circuit board, and correct deformation of the chip and the circuit board during mounting. This greatly improves adaptability and reliability of the connection assembly.

With reference to the sixth aspect, in another possible implementation, the connection assembly further includes a plurality of first solder pads disposed on the chip, and one end of the flexible metal wire is connected to the first solder pad.

With reference to the foregoing possible implementation, the connection assembly further includes a plurality of second solder pads disposed on the circuit board, and the other end of the flexible metal wire is connected to the second solder pad.

With reference to the sixth aspect, in another possible implementation, the connection assembly further includes a plurality of second solder pads disposed on the circuit board, and one end of the flexible metal wire is connected to the second solder pad. In an example, shapes and sizes of the first solder pad and the second solder pad may be in a plurality of forms. A quantity of rows and a quantity of columns of the solder pad array may be the same or different, and a quantity and a size of solder pads depend on a size of the chip and a size of the circuit board. In an example, the first solder pad and the second solder pad may be metal layers. A material of the metal layer may be in a plurality of forms, for example, nickel-palladium-gold (NiPdAu), nickel-gold (NiAu), or a conventional plating material such as copper, nickel, or gold.

The flexible metal wire and the first or second solder pad may be connected in plurality of manners. In an example, a metal wire bonding manner may be used, and a metal wire (for example, aluminum silicon, gold, or copper) is connected to a chip solder pad through ultrasonic welding. Alternatively, in an example, a solder welding manner is used, and the solder may be a tin alloy or other materials. It should be understood that two ends of the flexible metal wire may be connected in a same manner. In an example, both ends are welded to solder pads through solder. Alternatively, one end of the flexible metal wire is connected in one manner, and the other end is connected in another manner. In an example, one end of the flexible metal wire is directly connected to a chip solder pad through ultrasonic welding, and the other end is welded to a circuit board solder pad through solder. In the foregoing connection mode, connection costs can be greatly reduced, and costs of the connection assembly are controlled.

With reference to the sixth aspect, in another possible implementation, one first solder pad is disposed in one empty slot. In an example, some of the M empty slots may be vacant, but not all of the M empty slots are vacant.

It should be understood that, in an example, the M empty slots are arranged in an array, and one first solder pad is disposed in one empty slot. Therefore, it can be inferred that the plurality of first solder pads are also arranged in an array, and a position of each first solder pad is in a one-to-one correspondence with a corresponding empty slot in the empty slot array.

With reference to the sixth aspect, in another possible implementation, a position of each of the plurality of first solder pads is in a one-to-one correspondence with a position of each of the plurality of second solder pads.

The one-to-one correspondence means that a projection of each used empty slot along a vertical direction can coincide with a solder pad of the chip at the position. It should be understood that, in an example, the solder pad array provided in this application is a solder pad array in which solder pads have a specific spacing along a horizontal direction. Because the empty slot array is in a one-to-one correspondence with the solder pad array of the chip, the empty slot array should also be understood as an empty slot array in which empty slots have a specific spacing, and a quantity of empty slots and a quantity of solder pads along the horizontal direction are integers greater than or equal to 2.

Specifically, an objective of the "one-to-one correspondence" is to reduce a horizontal displacement deviation during face-to-face connection between chip solder pads and circuit board solder pads. During press-fitting, the chip solder pads are aligned with the circuit board solder pads. In an example, a manner of marking a plurality of coordinate points is used for alignment, to ensure a one-to-one correspondence between solder pads. The cavity array described above is in a one-to-one correspondence with the solder pad array of the chip. Therefore, it can be deduced that the cavity array is also in a one-to-one correspondence with the solder pad array of the circuit board. The foregoing correspondence can avoid a deviation of the flexible metal wire during deformation to a great extent. To sum up, it can be inferred that projections of the first solder pad, the second solder pad, and the empty slot along the vertical direction coincide, and the flexible metal wire is disposed in an overlapping region between the empty slot, the first solder pad, and the second solder pad.

Optionally, spacings between solder pads in the solder pad array may be the same or different, provided that positions of the solder pads are in a one-to-one correspondence with positions of the empty slots.

Because there is a spacing between units in an array, the solder pads of the chip are separated by a non-empty-slot region of the empty slots, to implement isolation along the horizontal direction. This avoids a connection between flexible metal wires on different solder pads, and improves reliability of the connection assembly. In addition, the support body has a specific thickness. After a press-fit is implemented between the circuit board and the chip, the gap between the chip and the circuit board can be controlled, and stability and reliability of the connection assembly are improved.

With reference to the sixth aspect, in another possible implementation, at least one flexible metal wire is disposed on at least one of the plurality of first solder pads, and the flexible metal wire passes through the empty slot. Optionally, four flexible metal wires, or any integer quantity of flexible metal wires ranging from 1 to 100 flexible metal wires, may be disposed on each solder pad of the chip. The flexible metal wires may or may not be arranged in an array depending on an actual case.

In an example, the four flexible metal wires are arranged in an array. To be specific, the four flexible metal wires are respectively disposed at four vertexes of the first solder pad. This arrangement manner is an optional solution for ensuring performance of the flexible metal wires while considering costs and welding time.

With reference to the sixth aspect, in another possible implementation, a length of the flexible metal wire is greater than a thickness of the support body, so that the flexible metal wire can be bent and deformed as required during press-fitting, to achieve beneficial effect of stress absorption. In addition, a quantity of flexible metal wires may be correspondingly adjusted according to a requirement.

Specifically, in an example, the solder pad of the chip is located in a corresponding empty slot, and the flexible metal wire extends along the vertical direction, and can pass through, in a non-deformed state, an opening of the empty slot that is away from the chip, to connect to the circuit board. The length of the flexible metal wire is greater than the thickness of the support body to achieve the following objective: During press-fitting, a distance equal to the thickness of the support body is retained between the circuit board and the chip, and the flexible metal wire may be adaptively bent and deformed based on different heights of the surface of the circuit board. For example, the flexible metal wire is greatly bent and deformed on a surface of the circuit board that is close to the chip, and is slightly bent and deformed on a surface of the circuit board that is away from the chip. This capability of applying different deformation based on different heights absorbs stress to be transferred to the chip that is not prone to deformation, to achieve an adaptive fitting interface tolerance capability. This avoids a press-fit stress of thousands of kg in the conventional technology, and greatly reduces loss of the chip caused by a height difference. In an example, the thickness of the support body is any value ranging from 0.5 mm to 10 mm.

With reference to the sixth aspect, in another possible implementation, an inner wall of the empty slot of the support body is an insulation material.

Optionally, a material of the support body may be in a plurality of forms, for example, a board material of a conventional printed circuit board, high-temperature-resistant plastic, polytetrafluoroethylene (PTFE), a polyimide (PI), epoxy resin, or silicone. An objective is to implement insulation isolation between flexible metal wires on different solder pads. This avoids a short circuit problem caused by an incorrect connection to a great extent. In addition, because the support body has a specific thickness, the gap between the circuit board and the chip can be effectively controlled.

Specifically, a distance equal to the thickness of the support body is retained between the circuit board and the chip, and the support body is configured to control the gap between the circuit board and the chip.

The flexible metal wire has a flexible tolerance capability along the horizontal direction and the vertical direction. Therefore, a reliability problem caused by a mismatch between coefficients of thermal expansion (CTE), vibration, and the like during operation at extreme temperature (high temperature or low temperature) after the chip and a board are connected can be resolved.

With reference to the sixth aspect, in another possible implementation, a shape of the empty slot is a truncated cone, and a surface area of the truncated cone that is close to the chip is greater than or equal to a surface area of the truncated cone that is away from the chip.

The "shape of the empty slot" is a closed polyhedron including an inner wall of the empty slot, an upper opening plane, and a lower opening plane, and the shape of the empty slot may be in a plurality of forms. In an example, the shape of the empty slot is a truncated cone, a diameter of an opening close to the chip solder pad (referred to as a lower opening below) ranges from 0.6 mm to 0.9 mm, and a diameter of an opening away from the chip solder pad (referred to as an upper opening below) ranges from 0.1 mm to 0.5 mm. It should be understood that the foregoing diameter sizes of the openings are not absolute. In an example, sizes of the upper opening and the lower opening may be the same. A shape of the polyhedron may also be in a plurality of forms. In an example, the shape of the empty slot may be a truncated pyramid or a cuboid.

In an example, the screw is configured to fasten the chip and the circuit board. Specifically, in an example, the screw penetrates the circuit board and the chip, and is fastened by a corresponding nut. An objective is to further correct deformation of the chip and the circuit board, and control a vertical gap between the chip and the circuit board by using the support body. It can be understood that, during fastening by the screw, the flexible metal wire is used to further adjust a fitting error along the horizontal direction and the vertical direction, and the screw can further improve reliability and connection strength of the connection assembly. It should be understood that there may be a plurality of fastening manners. In addition to fastening by using the screw and the nut, other fastening manners are also applicable to embodiments of this application.

In an example, the flexible metal wire may have a bending and deformation capability, a conducting capability, and a solder welding capability. For example, the flexible metal wire may be a type of flexible metal such as a copper wire, a gold wire, or an aluminum wire. In addition, a metal layer such as nickel, gold, or tin may be electroplated on a surface of the metal wire, so that the metal wire can be welded to solder. A length of the flexible metal wire is 0.3 mm to 10 mm. The flexible metal wire has a bending capability under the action of an external force, so that a height of the flexible metal wire along the vertical direction is adaptively reduced based on an actual distance between the circuit board and the chip. It should be understood that bending and deformation do not affect transmission performance of the flexible metal wire. In addition, this capability of applying different deformation based on different heights absorbs stress to be transferred to the chip that is not prone to deformation, to achieve an adaptive fitting interface tolerance capability. This avoids a press-fit stress of thousands of kg in the conventional technology, and greatly reduces loss of the chip caused by a height difference.

According to a seventh aspect, this application provides a manufacturing method for a connection assembly. The method includes:

A flexible metal wire is connected to a surface of a chip. Specifically, in an example, there may be a plurality of connection modes. In an example, a metal wire bonding manner may be used, and a metal wire (for example, aluminum silicon, gold, or copper) is connected to a chip solder pad through ultrasonic welding.

A support body is mounted on the surface of the chip, where the support body includes M empty slots, and the flexible metal wire is disposed in N empty slots. Specifically, in an example, a size of the empty slot may be in a plurality of forms. The support body may be obtained in a plurality of manners. In an example, an injection molding material may be injected into a pre-designed mold, and a formed support body with a cavity array is taken out, and is fastened to the chip through an adhesive. Alternatively, an empty slot region is exposed on the support body by using EV light through exposure and development, to obtain a support body with an empty slot array.

The chip and a circuit board are aligned in a press fit through solder pads, where M is an integer greater than or equal to 2, N is an integer greater than or equal to 1, and M is greater than or equal to N. The flexible metal wire is in a deformed state in the alignment and press-fit state.

Specifically, during alignment, positions of circuit board solder pads and chip solder pads should be accurately determined, and an allowed deviation of alignment precision does not exceed ±0.1 mm. Specifically, the positions may be accurately determined in plurality of manners. In an example, a plurality of mark points may be set on the chip and the circuit board for point-to-point positioning.

The "press-fit" means that the chip and the circuit board are stacked, sides, provided with solder pads, of the chip and the circuit board face each other, and the solder pads on the chip and the solder pads on the circuit board are in a press fit under an external force. When one side of the support body is in contact with the chip and another side is in contact with the circuit board, the flexible metal wire is adaptively deformed. This is the press-fit state.

In an example, a board body including the chip and the circuit board that are in a press fit and the connection assembly is then fastened by using a screw and a nut. In an example, the screw is configured to fasten the chip and the circuit board. Specifically, in an example, the screw penetrates the circuit board and the chip, and is fastened by a corresponding nut. An objective is to further correct deformation of the chip and the circuit board, and control a vertical gap between the chip and the circuit board by using the support body. It can be understood that, during fastening by the screw, the flexible metal wire is used to further adjust a fitting error along the horizontal direction and the vertical direction, and the screw can further improve reliability and connection strength of the connection assembly. It should be understood that there may be a plurality of fastening manners. In addition to fastening by using the screw and the nut, other fastening manners are also applicable to embodiments of this application.

Specifically, the chip may alternatively be a single chip, a large-sized chip, or the like (collectively referred to as a "chip" below), and the circuit board may be a printed circuit board (PCB) or a substrate such as a glass substrate (collectively referred to as a "circuit board" below). For ease of description, the chip and the circuit board are used as examples in this application.

The flexible metal wire should be a connection wire that has a bending capability under the action of an external force and that has a conducting capability. A manner of connecting the flexible metal wire to the chip and the circuit board includes but is not limited to the following two manners: In an example, the flexible metal wire may be first connected to the chip, and then the circuit board is connected to the other end of the flexible metal wire to implement interconnection. Alternatively, in another example, the flexible metal wire is first welded to the circuit board, and then the chip is connected to the other end of the flexible metal wire to implement interconnection.

Because the flexible metal wire may be bent and deformed based on an external force, when different devices with different heights are in a press fit on a surface of the circuit board, the flexible metal wire may be adaptively bent and deformed based on different heights of the surface of the circuit board. For example, the flexible metal wire is greatly bent and deformed on a surface of the circuit board that is close to the chip, and is slightly bent and deformed on a surface of the circuit board that is away from the chip. This capability of applying different deformation based on different heights absorbs stress to be transferred to the chip that is not prone to deformation, to achieve an adaptive fitting interface tolerance capability.

In the conventional technology, a press-fit retention force is usually applied to a connection terminal to implement a press-fit between a chip and a circuit board, where the retention force reaches thousands of kg. In addition, to ensure that the chip and the circuit board do not fail due to a great retention force, a fitting tolerance between a plurality of accessories of the chip and the circuit board needs to be accurately controlled. In the flexible metal wire provided in this application, a press-fit stress of thousands of kg in the conventional technology is not needed, and a fitting tolerance between a plurality of accessories can be reduced by the flexible metal wire. This greatly reduces loss of the chip caused by a height difference, and reduces costs and power consumption. A fitting interface tolerance that can be implemented may exceed 0.5 mm or even 1 mm. This greatly improves a press-fit tolerance capability.

In addition, coefficients of thermal expansion (CTE) of materials of the circuit board and the chip vary greatly. During operation of a product, a temperature change causes position deviations of positions of solder pads on the substrate and the chip. Theoretical analysis shows that relative displacement of the solder pads may reach 400 μm, which is 10 times greater than a current conventional board-level value. Therefore, a risk of a failure of connection terminals in contact is quite high. In the connection assembly provided in this application, the flexible metal wire has a flexible tolerance capability along both a horizontal direction and a vertical direction, to effectively resolve reliability problems caused by a mismatch between coefficients of thermal expansion, vibration, and the like during a temperature cycle test or operation at high temperature or low temperature.

With reference to the seventh aspect, in another possible implementation, A empty slots of the M empty slots are for forming an empty slot array of K rows×J columns, where both K and J are integers greater than or equal to 2, M is greater than or equal to A, and A is equal to K multiplied by J.

Specifically, a size of the empty slot may be in a plurality of forms. The support body may be obtained in a plurality of manners. In an example, an injection molding material may be injected into a pre-designed mold, and a formed support body with a cavity array is taken out, and is fastened to the chip through an adhesive. Alternatively, an empty slot region is exposed on the support body by using EV light through exposure and development, to obtain a support body with an empty slot array.

With reference to the seventh aspect, in another possible implementation, the connection assembly further includes a plurality of first solder pads disposed on the chip, and one end of the flexible metal wire is connected to the first solder pad.

With reference to the foregoing possible implementation, the connection assembly further includes a plurality of second solder pads disposed on the circuit board, and the other end of the flexible metal wire is connected to the second solder pad.

With reference to the seventh aspect, in another possible implementation, the connection assembly further includes a plurality of second solder pads disposed on the circuit board, and one end of the flexible metal wire is connected to the second solder pad.

In an example, shapes and sizes of the first solder pad and the second solder pad may be in a plurality of forms. A quantity of rows and a quantity of columns of the solder pad array may be the same or different, and a quantity and a size of solder pads depend on a size of the chip and a size of the circuit board.

There may be a plurality of connection modes. In an example, a metal wire bonding manner may be used, and a metal wire (for example, aluminum silicon, gold, or copper) is connected to a chip solder pad through ultrasonic welding.

With reference to the seventh aspect, in another possible implementation, one first solder pad is disposed in one empty slot. In an example, some of the M empty slots may be vacant, but not all of the M empty slots are vacant.

It should be understood that, in an example, the M empty slots are arranged in an array, and one first solder pad is disposed in one empty slot. Therefore, it can be inferred that the plurality of first solder pads are also arranged in an array, and a position of each first solder pad is in a one-to-one correspondence with a corresponding empty slot in the empty slot array.

With reference to the seventh aspect, in another possible implementation, a position of each of the plurality of first solder pads is in a one-to-one correspondence with a position of each of the plurality of second solder pads.

The one-to-one correspondence means that a projection of each empty slot in the empty slot array along a vertical direction can completely cover a solder pad in the solder pad array of the chip at the position. It should be understood that, the solder pad array provided in this application is a solder pad array in which solder pads have a specific spacing along a horizontal direction. Because the empty slot array is in a one-to-one correspondence with the solder pad array of the chip, the empty slot array should also be understood as an empty slot array in which empty slots have a specific spacing, and a quantity of empty slots and a quantity of solder pads along the horizontal direction are integers greater than or equal to 2.

Specifically, an objective of the "one-to-one correspondence" is to reduce a horizontal displacement deviation during face-to-face connection between chip solder pads and circuit board solder pads. During press-fitting, the chip solder pads are aligned with the circuit board solder pads. In an example, a manner of marking a plurality of coordinate points is used for alignment, to ensure a one-to-one correspondence between solder pads. The cavity array described above is in a one-to-one correspondence with the solder pad array of the chip. Therefore, it can be deduced that the cavity array is also in a one-to-one correspondence with the solder pad array of the circuit board.

Optionally, spacings between solder pads in the solder pad array may be the same or different, provided that positions of the solder pads are in a one-to-one correspondence with positions of the empty slots.

Because there is a spacing between units in an array, the solder pads of the chip are separated by a non-empty-slot region of the empty slot array, to implement isolation along the horizontal direction. This avoids a connection between flexible metal wires on different solder pads, and improves reliability of the connection assembly. In addition, the support body has a specific thickness. After a press-fit is implemented between the circuit board and the chip, the gap between the chip and the circuit board can be controlled, and stability and reliability of the connection assembly are improved.

With reference to the seventh aspect, in another possible implementation, at least one flexible metal wire is disposed on at least one of the plurality of first solder pads, and the flexible metal wire passes through the empty slot. Optionally, four flexible metal wires, or any integer quantity of flexible metal wires ranging from 1 to 100 flexible metal wires, may be disposed on each solder pad of the chip. The flexible metal wires may or may not be arranged in an array depending on an actual case.

In an example, the four flexible metal wires are arranged in an array. To be specific, the four flexible metal wires are respectively disposed at four vertexes of the first solder pad. This arrangement manner is an optional solution for ensuring performance of the flexible metal wires while considering costs and welding time.

With reference to the seventh aspect, in another possible implementation, a length of the flexible metal wire is greater than a thickness of the support body, so that the flexible metal wire can be bent and deformed as required during press-fitting, to achieve beneficial effect of stress absorption.

Specifically, in an example, the solder pad of the chip is located in a corresponding empty slot, and the flexible metal wire extends along the vertical direction, and can pass through, in a non-deformed state, an opening of the empty slot that is away from the chip, to connect to the circuit board. The length of the flexible metal wire is greater than the thickness of the support body to achieve the following objective: During press-fitting, a distance equal to the thickness of the support body is retained between the circuit board and the chip, and the flexible metal wire may be adaptively bent and deformed based on different heights of the surface of the circuit board. For example, the flexible metal wire is greatly bent and deformed on a surface of the circuit board that is close to the chip, and is slightly bent and deformed on a surface of the circuit board that is away from the chip. This capability of applying different deformation based on different heights absorbs stress to be transferred to the chip that is not prone to deformation, to achieve an adaptive fitting interface tolerance capability. This avoids a press-fit stress of thousands of kg in the conventional technology, and greatly reduces loss of the chip caused by a height difference. In an example, the thickness of the support body is any value ranging from 0.5 mm to 10 mm.

With reference to the seventh aspect, in another possible implementation, an inner wall of the empty slot of the support body is an insulation material.

Optionally, a material of the support body may be in a plurality of forms, for example, a board material of a conventional printed circuit board, high-temperature-resistant plastic, polytetrafluoroethylene (PTFE), a polyimide (PI), epoxy resin, or silicone. An objective is to implement insulation isolation between flexible metal wires on different solder pads. This avoids a short circuit problem caused by an incorrect connection to a great extent. In addition, because the support body has a specific thickness, the gap between the circuit board and the chip can be effectively controlled.

Specifically, a distance equal to the thickness of the support body is retained between the circuit board and the chip, and the support body is configured to control the gap between the circuit board and the chip.

The flexible metal wire has a flexible tolerance capability along the horizontal direction and the vertical direction. Therefore, a reliability problem caused by a mismatch between coefficients of thermal expansion (CTE), vibration, and the like during operation at extreme temperature (high temperature or low temperature) after the chip and a board are connected can be resolved.

With reference to the seventh aspect, in another possible implementation, a shape of the empty slot is a truncated cone, and a surface area of the truncated cone that is close to the chip is greater than or equal to a surface area of the truncated cone that is away from the chip.

The "shape of the empty slot" is a closed polyhedron including an inner wall of the empty slot, an upper opening plane, and a lower opening plane, and the shape of the empty slot may be in a plurality of forms. In an example, the shape of the empty slot is a truncated cone, a diameter of an opening close to the chip solder pad (referred to as a lower opening below) ranges from 0.6 mm to 0.9 mm, and a diameter of an opening away from the chip solder pad (referred to as an upper opening below) ranges from 0.1 mm to 0.5 mm. It should be understood that the foregoing diameter sizes of the openings are not absolute. In an example, sizes of the upper opening and the lower opening may be the same. A shape of the polyhedron may also be in a plurality of forms. In an example, the shape of the empty slot may be a truncated pyramid or a cuboid.

In an example, the screw is configured to fasten the chip and the circuit board. Specifically, in an example, the screw penetrates the circuit board and the chip, and is fastened by a corresponding nut. An objective is to further correct deformation of the chip and the circuit board, and control a vertical gap between the chip and the circuit board by using the support body. It can be understood that, during fastening by the screw, the flexible metal wire is used to further adjust a fitting error along the horizontal direction and the vertical direction, and the screw can further improve reliability and connection strength of the connection assembly. It should be understood that there may be a plurality of fastening manners. In addition to fastening by using the screw and the nut, other fastening manners are also applicable to embodiments of this application.

In an example, the flexible metal wire may have a bending and deformation capability, a conducting capability, and a solder welding capability. For example, the flexible metal wire may be a type of flexible metal such as a copper wire, a gold wire, or an aluminum wire. In addition, a metal layer such as nickel, gold, or tin may be electroplated on a surface of the metal wire, so that the metal wire can be welded to solder. A length of the flexible metal wire is 0.3 mm to 10 mm. The flexible metal wire has a bending capability under the action of an external force, so that a height of the flexible metal wire along the vertical direction is adaptively reduced based on an actual distance between the circuit board and the chip. It should be understood that bending and deformation do not affect transmission performance of the flexible metal wire. In addition, this capability of applying different deformation based on different heights absorbs stress to be transferred to the chip that is not prone to deformation, to achieve an adaptive fitting interface tolerance capability. This avoids a press-fit stress of thousands of kg in the conventional technology, and greatly reduces loss of the chip caused by a height difference.

According to an eighth aspect, this application provides a computing communication device, where the computing communication device includes the connection assembly in any embodiment of the first aspect and a processor. The connection assembly can implement a quite high fitting interface tolerance capability, and no ultra-large press-fit retention force needs to be provided. This reduces power consumption and costs, and can resolve a reliability problem caused by a mismatch between coefficients of thermal expansion in a working condition at extreme temperature. Therefore, correspondingly, the computing communication device including the connection assembly also has the foregoing effect.

According to a ninth aspect, this application provides a computing device, including a cooling system and the foregoing board-level architecture, where the cooling system is disposed on an upper surface of a semiconductor wafer to dissipate heat for a wafer structure.

BRIEF DESCRIPTION OF DRAWINGS

To describe technical solutions in embodiments of the present technology, the following briefly describes accompanying drawings for describing embodiments. Clearly, the accompanying drawings in the following descriptions show merely some embodiments of the present technology, and a person of ordinary skill in the art may still derive other drawings from these accompanying drawings without creative efforts.

FIG. 3b is an example schematic diagram of a structure of the connection assembly shown in FIG. 3a;

DESCRIPTION OF EMBODIMENTS

Figure 1:
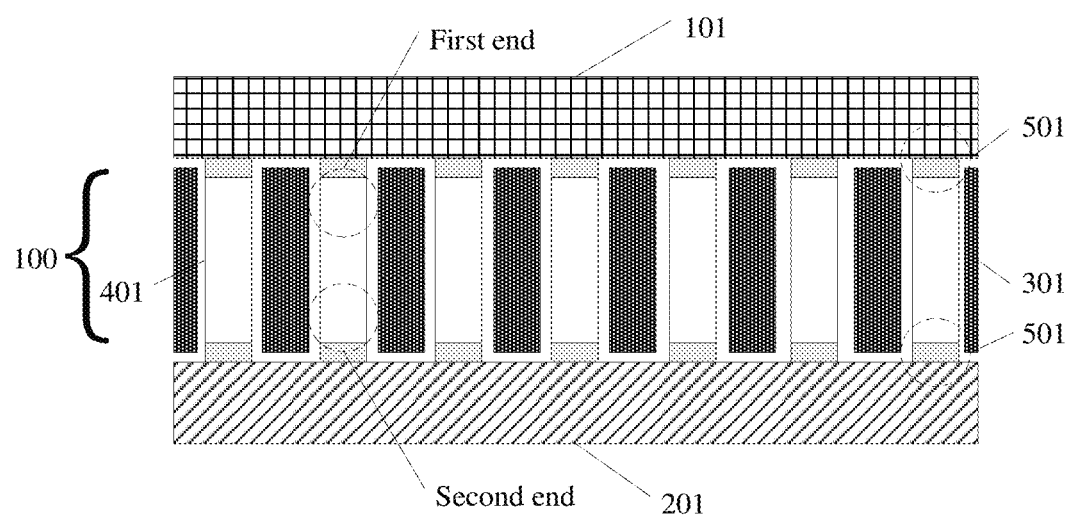
FIG. 1 is an example schematic diagram of a connection assembly according to an embodiment of this application.

The following clearly describes technical solutions in this application with reference to accompanying drawings in this application. It should be understood that a connection structure and a service scenario provided in embodiments of this application are mainly intended to explain some possible implementations of the technical solutions in this application, and should not be construed as a unique limitation on the technical solutions in this application. A person of ordinary skill in the art may know that, with evolution of a system and emergence of an updated service scenario, the technical solutions provided in this application are still applicable to a same or similar technical problem. The described embodiments are merely some but not all of embodiments of this application.

It should be understood that, in the following descriptions of specific embodiments of the technical solutions provided in embodiments of this application, some repeated parts may not be described again, but it should be considered that the specific embodiments are mutually referenced and may be combined with each other.

The following terms "first", "second", and the like are merely intended for ease of description, and shall not be understood as an indication or an implication of relative importance or an implicit indication of a quantity of indicated technical features. Therefore, a feature limited by "first", "second", or the like may explicitly or implicitly include one or more features. In the descriptions of this application, unless otherwise stated, "a plurality of" means two or more than two.

In embodiments of this application, unless otherwise specified and limited, the term "connection" may be a direct connection, or may be an indirect connection through an intermediate medium.

In embodiments of this application, the terms such as "example" or "for example" are used to give an example, an illustration, or a description. Any embodiment or design scheme described as an "example" or "for example" in embodiments of this application should not be construed as being more preferred or more advantageous than another embodiment or design scheme. To be precise, the terms such as "example" or "for example" are intended to present a related concept in a specific manner.

In embodiments of this application, "and/or" describes an association relationship between associated objects and indicates that at least three relationships may exist. For example, A and/or B may indicate the following cases: Only A exists, both A and B exist, and only B exists, where A and B may be singular or plural. The character "/" usually indicates an "or" relationship between the associated objects.

In embodiments of this application, for example, "upper", "lower", "left", "right", "front", and "rear" are used to explain that structures and motion directions of different components in this application are relative. These indications are appropriate when the components are at positions shown in the figure. However, if descriptions of the positions of the components change, these direction indications also change correspondingly.

This application relates to descriptions of aspects of three-dimensional space. It should be understood that, unless otherwise specified, a "horizontal direction" mentioned in this application is a direction of a plane on which a lower layer substrate is located. In an embodiment, the "horizontal direction" is alternatively a direction of a plane on which a semiconductor wafer or a circuit board is located. A "vertical direction" is a direction perpendicular to the plane on which the semiconductor wafer or the lower layer substrate is located. If a three-dimensional rectangular coordinate system is introduced, the horizontal direction may be represented by an x-axis and a y-axis, the vertical direction may be represented by a z-axis.

In embodiments of this application, a one-to-one correspondence indicates that two objects are in a one-to-one correspondence, but does not strictly require that projections of the two objects in a one-to-one correspondence along the horizontal direction or the vertical direction coincide.

In embodiments of this application, unless otherwise specified, a "first end" is an end of a connection terminal that is close to the semiconductor wafer, that is, a higher end along the vertical direction; and a "second end" is an end of the connection terminal that is close to the lower layer substrate, that is, a lower end along the vertical direction.

This application relates to descriptions of a solder ball. It should be understood that, unless otherwise specified, the solder ball mentioned in this application is solder that exceeds a specific size, and the specific size depends on both a size of the solder and a welding area of a solder pad. When the solder reaches a specific size on the solder pad, surface tension of the solder naturally enables the solder to form a spherical structure. It can be understood that a smaller welding area of the solder pad indicates that the solder is more likely to reach a specific size to obtain a solder ball form.

In the conventional technology, after sizes of a semiconductor wafer and a printed circuit board exceed a specific degree, warpage and deformation occur due to impact of temperature or press-fit strength. Because coefficients of thermal expansion of the semiconductor wafer and the printed circuit board are different, warpage and deformation caused by thermal expansion can hardly be effectively resolved by using a conventional method.

A "support body" and an "insulator" mentioned in all embodiments of this application may have a same structure, and may be completely equivalent in terms of materials, forms, and the like. A same object is merely described from two aspects of functions of the object.

Specifically, currently, a wafer level chip is usually connected to a printed circuit board (PCB) by using a "hard connection" (socket) solution such as land grid array (LGA) packaging. In this solution, a deviation that occurs during connection and assembly can be reduced only by a stress of thousands of kg. For example, in the socket solution, a minimum unit press-fit retention force of at least 10 g/pin needs to be ensured, and a pressure bearing capability of a semiconductor wafer is directly proportional to a quantity of socket pins of a socket. To be specific, a theoretical pressure bearing capability calculated based on 50,000 pins is 2000 kg. Press-fitting with such high mechanical stress causes many problems, such as a failure of a stress-sensitive device (for example, a capacitor) or a VRM device, a failure of a semiconductor wafer or a circuit board due to cracking, crushing of a large-sized heat sink or a thermally conductive material, and a failure of a socket connector. In addition, because a device span is large, resonance caused by press-fit vibration also leads to the foregoing device failure. In addition, in the field of assembly of a chip larger than 100 mm×100 mm, relative displacement between a semiconductor wafer and a printed circuit board of the chip reaches 400 μm, and warpage may reach 2000 μm. This is far greater than a conventional deviation value.

To resolve the foregoing technical problems, an embodiment of the present technology provides a connection assembly 100. FIG. 1 is a cross-sectional view of a connection assembly 100 pressed against by a lower layer substrate and an upper layer substrate that are in a press fit. The connection assembly 100 includes a connection terminal 401 and an insulator structure 301. In an optional embodiment, the lower layer substrate may be a printed circuit board (PCB), a glass substrate, or the like, and the upper layer substrate may also be a printed circuit board or a silicon-based semiconductor wafer. In an example, the semiconductor wafer includes a plurality of interconnected chips, and is manufactured by using a unified photoetching system. For ease of description, in the following embodiments, technical solutions in embodiments of this application are described in detail by using an example in which the upper layer substrate is a semiconductor wafer and the lower layer substrate is a printed circuit board.

As shown in FIG. 1, for example, along a horizontal direction, seven chip solder pads 501 are disposed on a lower surface of a semiconductor wafer 101. Correspondingly, seven circuit board solder pads 501 are disposed on a circuit board 201 at positions corresponding to the chip solder pads 501. (For ease of description, both the chip solder pads and the circuit board solder pads are denoted as 501. For example, different designs and materials may be selected for the chip solder pads and the circuit board solder pads. This is not limited in this application.)

It should be understood that, in an example, the semiconductor wafer 101 includes a solder pad array of M rows×N columns, where both M and N are integers greater than or equal to 2, and M and N may be equal or unequal. A quantity and a size of solder pads depend on sizes of the semiconductor wafer 101 and the circuit board 201. In an embodiment of this application, a shape of the semiconductor wafer 101 may be a circular shape, and a size may be any value ranging from 4 inches to 12 inches; or a shape of the semiconductor wafer 101 may be a quadrangular shape, and a size may be any value ranging from 10 mm×10 mm to 300 mm×300 mm. Further, a size of the circuit board 201 is greater than a size of the semiconductor wafer 101. Correspondingly, the circuit board 201 includes a circuit board solder pad array of M rows×N columns, and positions of the circuit board solder pads are in a one-to-one correspondence with positions of the chip solder pads.

An insulator structure 301 is further disposed on the circuit board 201. In an embodiment of this application, the insulator structure 301 is fastened to the circuit board 201 through an adhesive, or may be connected to the circuit board through loose coupling. The insulator structure 301 includes an empty slot array (not shown in the figure) of K rows×J columns. As shown in FIG. 1, a gap region between any two units of the insulator structure 301 is an empty slot, the empty slot penetrates the insulator structure 301 along a vertical direction, and a position of the empty slot is in a one-to-one correspondence with a position of the connection terminal 401. It can be simply inferred that, in an example, a position relationship between the connection terminal 401, the solder pad 501, and the empty slot is a one-to-one correspondence. To be specific, projections, mapped along the vertical direction, of the connection terminal 401, the solder pad 501, and the empty slot may approximately coincide. FIG. 1 is used as an example. Along the vertical direction, the seven chip solder pads shown in the figure correspond to the seven circuit board solder pads under the seven chip solder pads, and correspond to empty slots surrounding the seven chip solder pads and the seven circuit board solder pads.

The following describes in detail a specific structure of the connection terminal 401. The connection terminal 401 shown in FIG. 1 has a first end and a second end along the vertical direction. In an example, the first end faces the semiconductor wafer 101, and the second end faces the circuit board 201. In addition, the first end and the second end each are provided with a welding structure (not shown in the figure), and the welding structure is welded to a corresponding solder pad 501, so that the semiconductor wafer 101 is electrically connected to the circuit board 201 through the connection terminal 401, that is, the connection terminal 401 may serve as an I/O (input/output) pin. It should be understood that FIG. 1 is merely intended to schematically describe a connection relationship between the semiconductor wafer 101, the connection assembly 100, and the circuit board 201, but not to specifically limit a connection position, a specific structure, or a quantity of devices.

Figure 2:
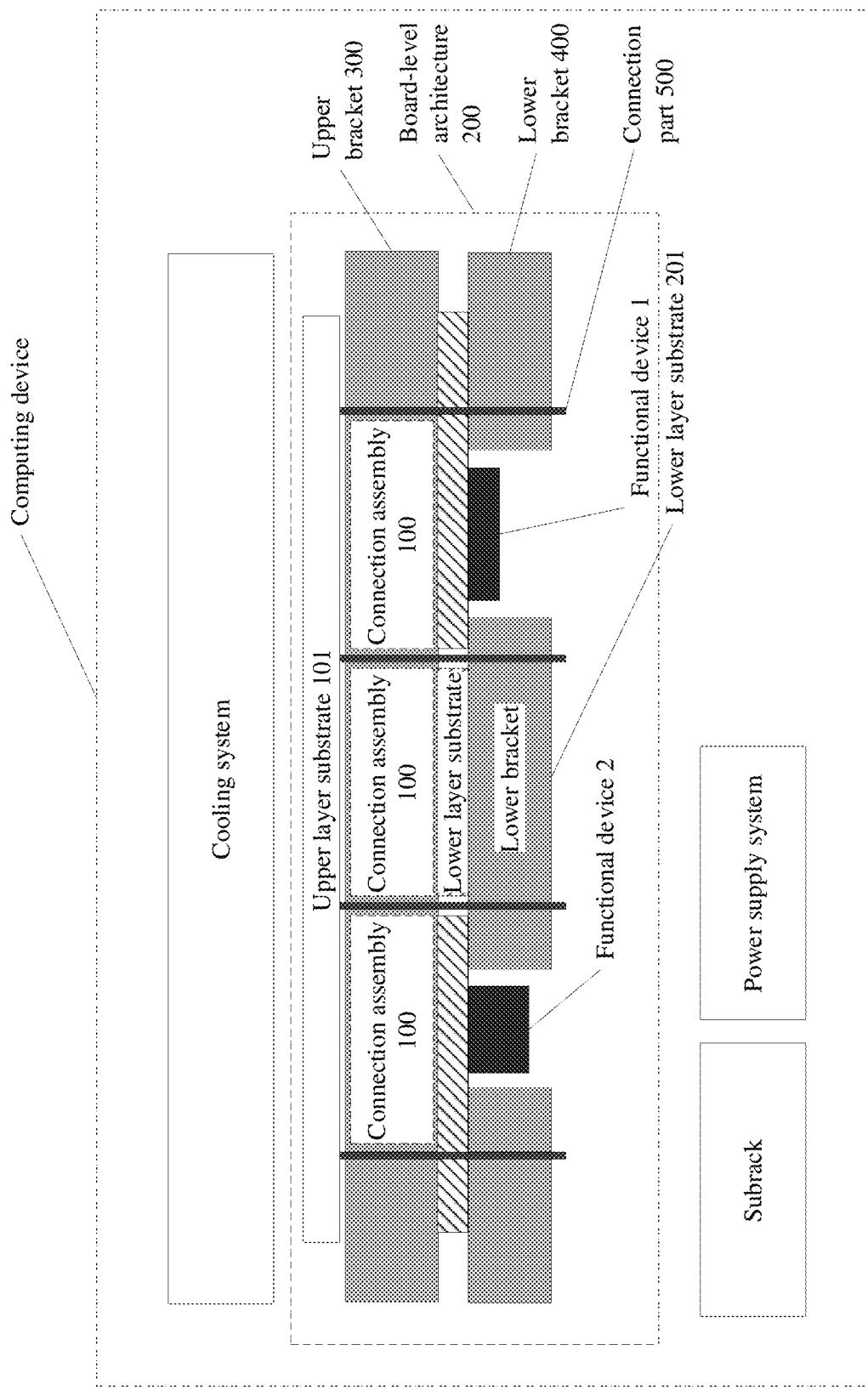
FIG. 2 is an example schematic diagram of a system-level board-level architecture and a computing device according to an embodiment of this application.

A position relationship of the connection assembly 100 in a system is shown in FIG. 2. FIG. 2 shows a computing device. A board-level architecture 200 (it should be understood that the board-level architecture in FIG. 2 is still shown in a cross-sectional view along a horizontal direction) includes the connection assembly 100 shown in FIG. 1, a semiconductor wafer (an upper layer substrate 101) and a circuit board (a lower layer substrate 201) that are interconnected through the connection assembly 100, and an upper bracket, a lower bracket, a connector, and the like that are necessary. It should be understood that, in actual application, there may be a plurality of connection assemblies 100. In an example, there may alternatively be a plurality of connection assemblies 100 arranged in an array form. The board-level architecture shown in the embodiment of FIG. 2 includes nine connection assemblies 100 arranged in a 3×3 matrix form (only three connection assemblies 100 that horizontally or vertically extend outward can be seen from the cross-sectional view, and certainly, a quantity in actual application is not limited thereto). The board-level architecture 200 further includes an upper bracket 300 and a lower bracket 400. The upper bracket has an empty slot region corresponding to a position of the connection assembly 100. The connection assembly 100 may be disposed in the empty slot region of the upper bracket in a one-to-one correspondence. In the embodiment of FIG. 2, a size value of the empty slot region may be any size of an area in which at least one connection assembly can be placed. Optionally, a shape of the empty slot region is correspondingly the same as a shape of one connection assembly 100. In an example, a gap region between connection assemblies 100, namely, a non-empty-slot region of the upper bracket, may be for drilling a through hole. An objective of the through hole is to enable a plurality of connection parts 500 to penetrate the upper bracket and reach the lower bracket, to fasten the upper bracket and the lower bracket in a press fit. In an embodiment, the connection part 500 may be any fastening structure such as a screw or a nut, and technical effect thereof is to prevent warpage and deformation of the circuit board 201 by using the bracket, so as to avoid problems such as board-level cracking, an electrical open circuit, and a device failure caused by deformation, effectively adjust a gap distance between the circuit board 201 and the semiconductor wafer 101, and improve stability and reliability of signal conduction.

In an example, the lower layer substrate and the lower bracket may also be fastened through a connector (not shown in FIG. 2). This connector and a connector between the upper bracket and the lower bracket may be a same fastening structure or different fastening structures. An objective thereof is to further improve an anti-deformation capability of the lower layer substrate (the circuit board 201), so as to avoid problems such as board-level cracking, an electrical open circuit, and a device failure caused by deformation.

In an example, the upper layer substrate (the semiconductor wafer 101) may be fastened to a heat sink through a connector (not shown in FIG. 2). This connector and the connector between the upper bracket and the lower bracket may be a same fastening structure or different fastening structures. The heat sink may serve as a component of a cooling system to reduce operation temperature of the semiconductor wafer 101. Because temperature is one of main causes of expansion and deformation, the heat sink is fastened to the upper layer substrate. This can further fasten a position of the semiconductor wafer, prevent a device failure caused by deformation or a position deviation, and improve operation reliability of the upper layer substrate. This can also facilitate heat dissipation for the semiconductor wafer, and improve system stability.

In an example, the connector and the connection part 500 may be separately mounted, and positions of the connector and the connection part 500 may be adaptively adjusted. This is not further limited in this application. Alternatively, a press-fit between a plurality of layers of structures may be completed at a time only by using the connection part 500 (not shown in FIG. 2). In this case, at least one of the plurality of connection parts 500 may penetrate a top surface of a heat sink on the upper layer substrate 101 and reach a bottom surface of the lower bracket, and is fastened by a nut. This connection structure can further ensure press-fit effect of a plurality of layers of boards, and prevent device failures caused by warpage and deformation. In addition, this connection structure is simple and easy to mount, and a press-fit between a plurality of layers of structures may be completed at a time only by using fasteners of uniform specifications. This reduces assembly time, and also reduces procurement costs.

In an example, each connection terminal 401 is located in an empty slot (not shown in FIG. 2) of an insulator structure 301 corresponding to the connection terminal 401. That is, an insulator structure 301 serves as a spacer between every two connection terminals 401. It can be learned that, after a press-fit is implemented between the semiconductor wafer 101 and the circuit board 201, due to existence of the insulator structure 301, there is no risk of contact or conduction between the connection terminals 401, regardless of deformation or position deviations of the connection terminals 401. Therefore, a short circuit between connectors is avoided, and reliability of devices is greatly improved. It should be understood that the connection terminal 401 in FIG. 1 is merely an example for describing a position of the connection terminal 401 in the architecture. In actual application, the connection terminal 401 may have a plurality of structural forms. The following provides detailed descriptions with reference to other schematic diagrams.

Figure 3A:
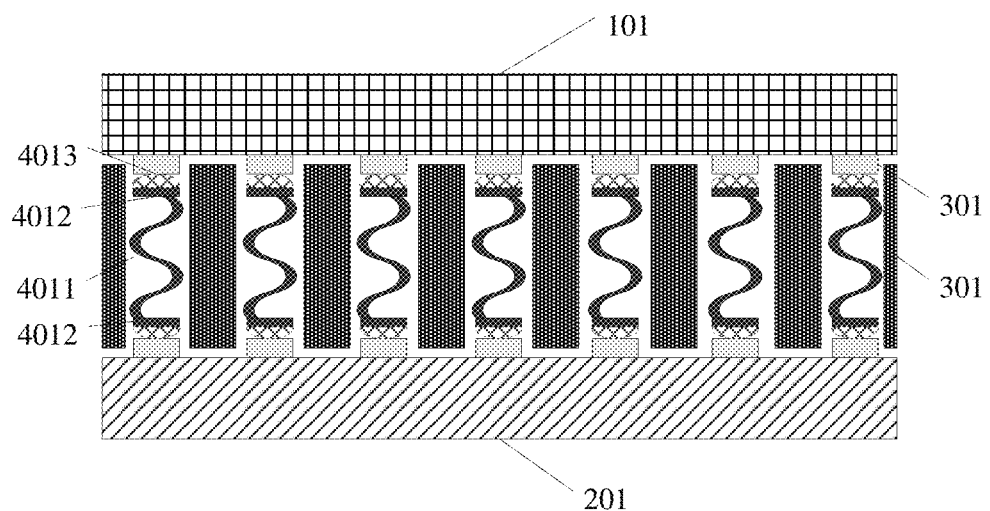
FIG. 3a is an example schematic diagram of a connection assembly according to an embodiment of this application.
Figure 3B:
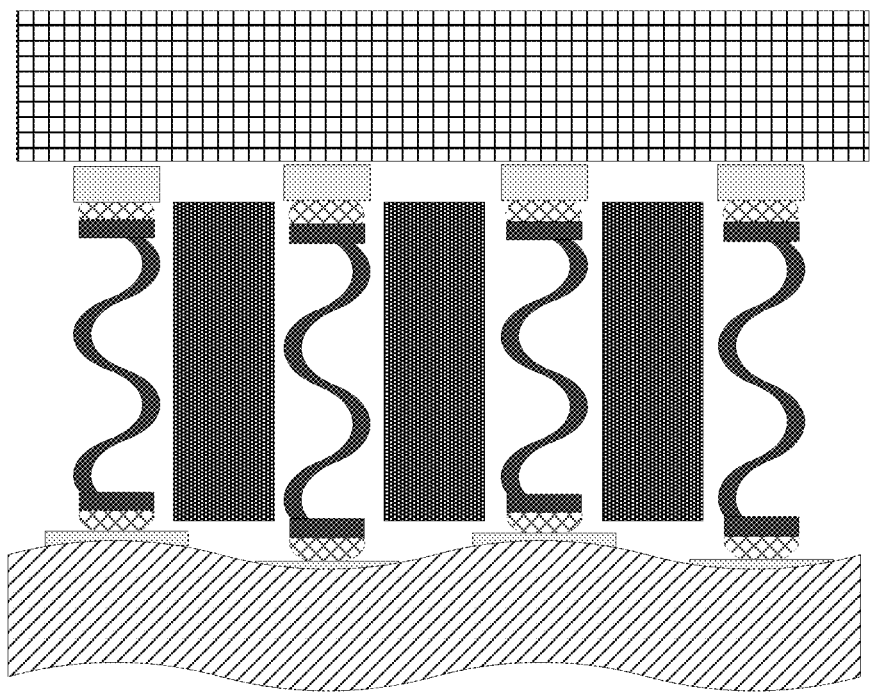

An embodiment of the present technology provides a connection assembly 100. FIG. 3 is a cross-sectional view of a connection assembly 100 pressed against by a lower layer substrate 201 and an upper layer substrate 101 that are in a press fit. The connection assembly 100 includes a connection terminal 401 and an insulator structure 301. In an optional embodiment, the lower layer substrate may be a printed circuit board (PCB), a glass substrate, or the like, and the upper layer substrate may also be a printed circuit board or a silicon-based semiconductor wafer. In an example, the semiconductor wafer includes a plurality of interconnected chips, and is manufactured by using a unified photoetching system. For ease of description, in the following embodiments, technical solutions in embodiments of this application are described in detail by using an example in which the upper layer substrate is a semiconductor wafer and the lower layer substrate is a printed circuit board.

As shown in FIG. 3, seven chip solder pads 501 are disposed on a lower surface of a semiconductor wafer 101. Correspondingly, seven circuit board solder pads 108 are disposed on a circuit board 201 at positions corresponding to the chip solder pads 107.

It should be understood that there are not necessary seven groups of solder pads 501. In an embodiment, the semiconductor wafer 101 may include a solder pad array of M rows×N columns, where M and N may be equal or unequal. A quantity and a size of solder pads depend on sizes of the semiconductor wafer 101 and the circuit board 201. In an embodiment of this application, a shape of the semiconductor wafer 101 may be a circular shape, and a size may be any value ranging from 4 inches to 12 inches; or a shape of the semiconductor wafer 101 may be a square shape, and a size may be any value ranging from 10 mm×10 mm to 300 mm×300 mm. Further, a size of the circuit board 201 is greater than a size of the semiconductor wafer 101. Correspondingly, the circuit board 201 includes a circuit board solder pad array of M rows×N columns, and positions of the circuit board solder pads 108 are in a one-to-one correspondence with positions of the chip solder pads 107.

An insulator structure 301 is further fastened to the circuit board 201. In an embodiment of this application, the insulator structure 301 is fastened to the circuit board 201 through an adhesive, or may be connected to the circuit board through loose coupling. The insulator structure 301 includes an empty slot array (not shown in the figure) of K rows×J columns. As shown in FIG. 1, a colorless region between two units of the insulator structure 301 is an empty slot, the empty slot penetrates the insulator structure 301 along a vertical direction, and a position of the empty slot is in a one-to-one correspondence with a position of the connection terminal 401. It can be simply inferred that, in an example, a position relationship between the connection terminal 401, the solder pad 501, and the empty slot is a one-to-one correspondence, and projections, mapped along the vertical direction, of the connection terminal 401, the solder pad 501, and the empty slot may or may not coincide. FIG. 1 is used as an example. Along the vertical direction, the seven chip solder pads 107 shown in the figure correspond to the seven circuit board solder pads 108 under the seven chip solder pads 107, and correspond to empty slots surrounding the seven chip solder pads 107 and the seven circuit board solder pads 108.

The following describes in detail a specific structure of the connection terminal 401 in the foregoing embodiment. In an example, the connection terminal 401 may be a deformable structure. For example, optionally, the connection terminal 401 may be a spring structure, a "bow"-shaped structure, or an "S"-shaped structure. Alternatively, the connection terminal 401 may be at least one flexible metal wire, and the flexible metal wire is deformed and bent due to stress during press-fitting. In the solution of this application, the connection terminal 401 may be any structure that can be deformed during press-fitting between two boards. To be specific, all the structures in the foregoing embodiment have a deformation capability along the vertical direction and a horizontal direction, so that the connection terminal 401 can absorb an inter-board deviation difference between two sides of the connection assembly 100 through deformation. The deviation difference may include a deviation along the vertical direction, and further include a deviation along the horizontal direction. Specifically, in terms of the deformable structure, as shown in FIG. 3, in this embodiment, the connection terminal 401 includes a body 4011 and a connection part 4012. The connection part 4012 and the body 4011 are a deformable structure (a "bow"-shaped structure is used as an example in the figure), and connection parts 4012 are located at two ends of the body 4011. In an example, a material of the connection part 4012 may be the same as that of the body 4011, for example, conductive metal copper or gold. The connection part 4012 and the body 4011 may be an integrated structure. The connection part 4012 may not have a deformation capability, has a specific size along the horizontal direction, and is configured to be combined with a solder ball 4013. A lower part of the solder ball 4013 is welded to the connection part 4012, and an upper part of the solder ball 4013 is welded to solder pads of the semiconductor wafer 101 and the circuit board 201 for electrical conduction. As shown in FIG. 4, the deformable structure can further absorb a deviation difference between the circuit board 201 and the semiconductor wafer 101. In this way, stress to be transferred to the wafer 101 is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device. It should be understood that the deviation difference may indicate a deviation distance difference between the upper layer substrate 101 and the lower layer substrate 201 along the horizontal direction, or may indicate a deviation distance difference between the upper layer substrate 101 and the lower layer substrate 201 along the vertical direction.

To sum up, the connection terminal 401 may be a deformable structure, and the deformable structure includes a standard spring structure and a loop structure (for example, the "bow"-shaped or "S"-shaped structure described above) with a bending capability. The two types of structures can absorb inter-board stress. In addition, compared with the standard spring structure, the loop structure with a bending capability has a shorter extension length, and therefore has a shorter conduction line. During electronic assembly, resistance is smaller, and a through-current capability of an electrical signal is stronger. The standard spring structure has a larger deformation range to some extent, and therefore can be used at some positions with large displacement deviations. It should be understood that the deformable structure provided in this embodiment of this application is not limited to the foregoing two types. In addition, in actual application, a plurality of structures of any types may be used in any combination in one product, and a person skilled in the art may perform selection based on an actual case.

In an example, the connection part 4012 is located at a first end of the body 4011, to be specific, an end close to the semiconductor wafer 101. In an example, a second end of the body 4011 may not be provided with the connection part 4012. The second end is not specifically limited in this application. It should be understood that the second end may alternatively be provided with a connection part that is the same as or different from that provided at the first end. Based on the descriptions of the foregoing embodiment, the connection part 4012 and the body 4011 constitute a deformable structure.

In an example, solder is disposed on an upper surface of the connection part 4012, and the solder is welded to the semiconductor wafer 101, and more specifically, welded to a solder pad fastened to the semiconductor wafer 101. In an example, a ball grid array (BGA) packaging technology is used for the semiconductor wafer 101 and the circuit board 201. To be specific, in this embodiment, outer surfaces of the connection parts 4012 at the two ends of the connection terminal 401 are both provided with solder balls, and the connection parts 4012 are welded to solder pads on the semiconductor wafer 101 and the circuit board 201 through the solder balls, so that the connection terminal is electrically connected to the semiconductor wafer 101 and the circuit board 201.

Specifically, solder in BGA packaging further includes solder paste or solder flux. In an example, the solder paste is printed on a solder pad of the semiconductor wafer 101, and then a solder ball with a specific size is added on the solder paste. The solder paste has a function of bonding the solder ball, and makes a contact area of the solder ball larger during heating, so that the solder ball is more quickly and comprehensively heated. This improves welding between the solder ball and a BGA solder pad after the solder ball is melted, and reduces a possibility of poor welding. In addition, in the method in which the solder paste and the solder ball are combined, the solder ball is not likely to move during melting, and is easy to control. In an example, the solder paste may alternatively be replaced with solder flux.

In an example, an upper surface of the connection part 4012 is provided with a solder ball, and the solder ball has an extension capability. When the circuit board 201 and the semiconductor wafer 101 are aligned in a press fit, the solder ball and the connection terminal 401 may be adaptively adjusted based on a relative inter-board distance at positions of the solder ball and the connection terminal 401. As shown in FIG. 4, if a horizontal height of the substrate at a local position is large, tensile stress on the connection terminal at the position is also large. In this case, the second end of the body 4015 may be away from a solder structure, and vice versa. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device.

The following describes in detail the insulator structure 301 in the foregoing embodiment. In an example, as shown in FIG. 3*a*, the insulator structure is mounted on an upper surface of the circuit board 201. In an example, the insulator structure may be mounted in a conventional bonding manner, for example, through an adhesive; or may not be in contact with the upper surface of the circuit board 201. The entire insulator structure is bonded to the connection terminal 401 through loose coupling. The insulator structure includes a plurality of empty slots provided at spacings. A position of the empty slot is in a one-to-one correspondence with a position of the connection terminal 401. In an example, a high-precision alignment operation may be performed based on coordinate points during mounting, and a range of an alignment error between the chip solder pad array and the insulator should be less than or equal to ±0.1 mm.

For example, the empty slot of the insulator structure may be for fastening a position of the body of the connection terminal. It should be understood that the empty slot of the insulator structure has a function of fastening and holding the connection terminal 401. The fastening and holding is determining a position of the connection terminal 401 and a connection status between the connection terminal 401 and the substrate, to avoid the following problems that the connection terminal 401 is prone to during press-fitting: lateral deviation, bonding between terminals, or two ends of the connection terminal failing to connect to corresponding positions on the upper layer substrate and the lower layer substrate, or the like. However, this should not be construed as that the insulator structure is used to securely fasten the connection terminal 401. In an example, the connection status is that the connection terminal 401 is upright along the vertical direction, and two ends are welded to the circuit board 201 and the semiconductor wafer 101. This can effectively avoid tilting, bending, or cracking of the connection terminal caused by a position deviation during press-fitting of the connection assembly, and therefore avoid problems such as a device failure and an open circuit or a short circuit of an electrical connection, and greatly improve reliability of the connection assembly.

Figure 3C:
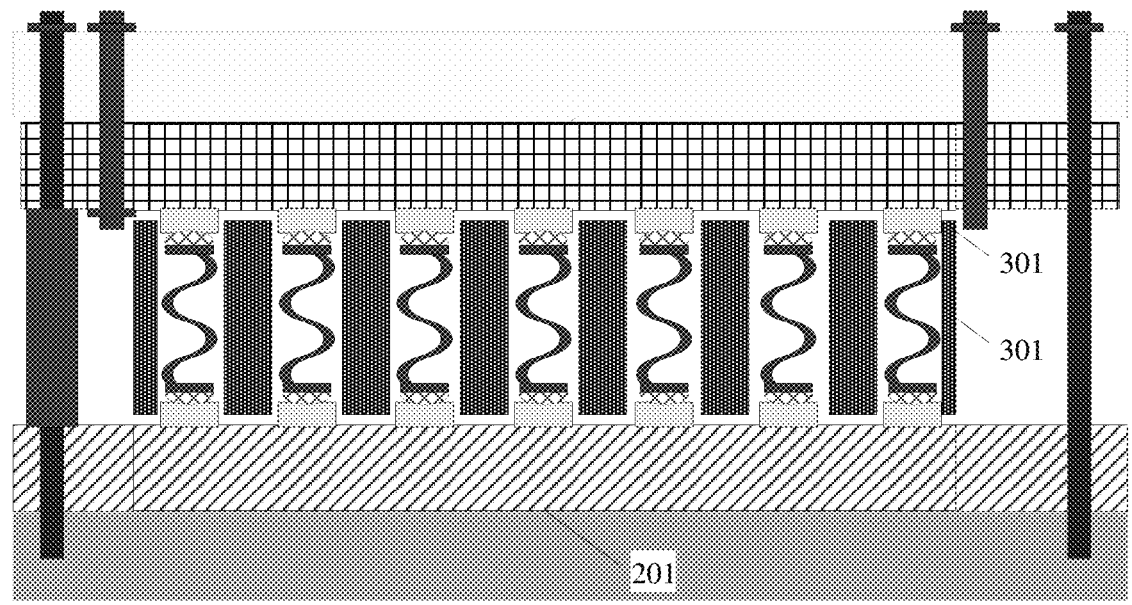
FIG. 3c is an example schematic diagram of a board-level architecture according to an embodiment of this application.
Figure 4:
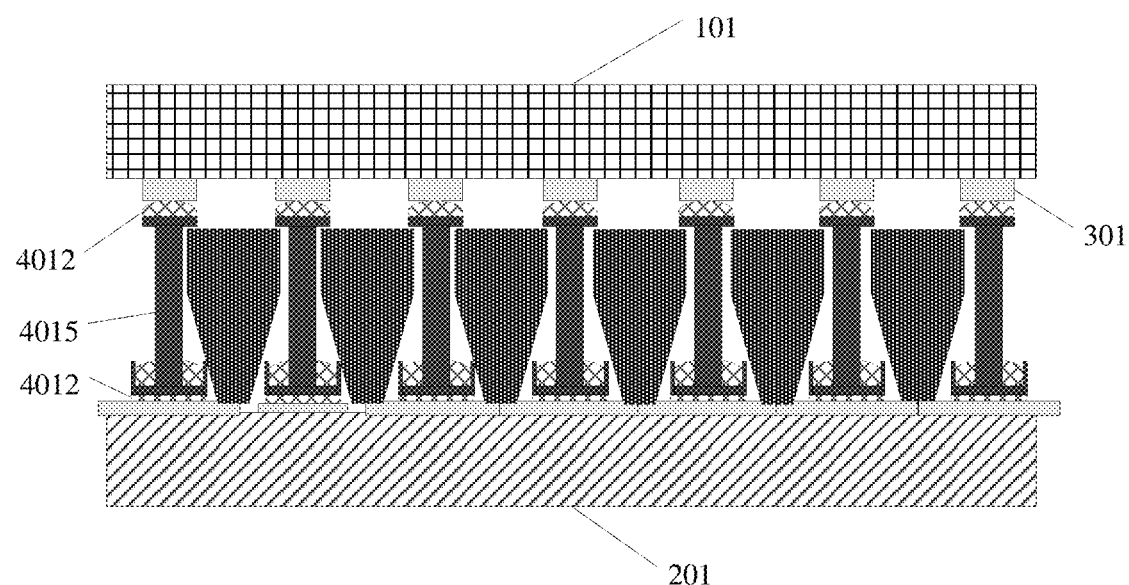
FIG. 4 is an example schematic diagram of another connection assembly according to an embodiment of this application.

In an embodiment of this application, as shown in FIG. 3*c*, a board-level architecture is provided. As shown in FIG. 3*c*, the board-level architecture 200 (the board-level architecture in FIG. 3*c* is still shown in a cross-sectional view along a horizontal direction) includes the connection assembly 100 shown in FIG. 3*a*, and a semiconductor wafer (an upper layer substrate 101) and a circuit board (a lower layer substrate 201) that are interconnected through the connection assembly 100. It should be understood that, in actual application, there may not be one connection assembly 100, and there may alternatively be a plurality of connection assemblies 100 arranged in an array form. The board-level architecture shown in FIG. 3*c* includes only one connection assembly 100 (only one connection assembly 100 that horizontally or vertically extends outward can be seen from the cross-sectional view). The board-level architecture 200 further includes an upper bracket and a lower bracket. The upper bracket has an empty slot region corresponding to a position of the connection assembly 100. The connection assembly 100 may be disposed in the empty slot region of the upper bracket in a one-to-one correspondence. For example, a size value of the empty slot region may be any size of an area in which at least one connection assembly can be placed. Optionally, a shape of the empty slot region is correspondingly the same as a shape of one connection assembly 100. In an example, a gap region between connection assemblies 100, namely, a non-empty-slot region of the upper bracket, may be for drilling a through hole. An objective of the through hole is to enable a plurality of connection parts 500 to penetrate the upper bracket and reach the lower bracket, to fasten the upper bracket and the lower bracket in a press fit. In an embodiment, the connection part 500 may be any fastening structure such as a screw or a nut, and technical effect thereof is to prevent warpage and deformation of the circuit board 201 by using the bracket, so as to avoid problems such as board-level cracking, an electrical open circuit, and a device failure caused by deformation, effectively adjust a gap distance between the circuit board 201 and the semiconductor wafer 101, and improve stability and reliability of signal conduction.

In an example, the lower layer substrate and the lower bracket may also be fastened through a connector. This connector and a connector between the upper bracket and the lower bracket may be a same fastening structure or different fastening structures. An objective thereof is to further improve an anti-deformation capability of the lower layer substrate (the circuit board 201), so as to avoid problems such as board-level cracking, an electrical open circuit, and a device failure caused by deformation.

In an example, the upper layer substrate (the semiconductor wafer 101) may be fastened to a heat sink through a connector. This connector and the connector between the upper bracket and the lower bracket may be a same fastening structure or different fastening structures. The heat sink may serve as a component of a cooling system to reduce operation temperature of the semiconductor wafer 101. Because temperature is one of main causes of expansion and deformation, the heat sink is fastened to the upper layer substrate. This can further fasten a position of the semiconductor wafer, prevent a device failure caused by deformation or a position deviation, and improve operation reliability of the upper layer substrate. This can also facilitate heat dissipation for the semiconductor wafer, and improve system stability.

In an example, the connector and the connection part 500 may be separately mounted, and positions of the connector and the connection part 500 may be adaptively adjusted. This is not further limited in this application. Alternatively, a press-fit between a plurality of layers of structures may be completed at a time only by using the connection part 500 (not shown in FIG. 3*c*). In this case, at least one of the plurality of connection parts 500 may penetrate a top surface of a heat sink on the upper layer substrate 101 and reach a bottom surface of the lower bracket, and is fastened by a nut. This connection structure can further ensure press-fit effect of a plurality of layers of boards, and prevent device failures caused by warpage and deformation. In addition, this connection structure is simple and easy to mount, and a press-fit between a plurality of layers of structures may be completed at a time only by using fasteners of uniform specifications. This reduces assembly time, and also reduces production costs.

This application further provides a manufacturing method for the connection assembly and the board-level architecture in the foregoing embodiments. Specifically, in an embodiment, in a normal temperature environment, a functional device is assembled on a surface of a lower layer substrate (a printed circuit board 201), and a solder pad is mounted on another surface. A quantity and an arrangement position of solder pads are determined based on the connection assembly. The connection assembly is bonded to the solder pad through welding. The solder ball is disposed at a first end of the connection assembly. In an embodiment, ambient temperature for welding of the solder ball may be any temperature for low-temperature welding, for example, may be approximately 138 degrees or 118 degrees. Specific temperature is not specifically limited in this application. A lower bracket is mounted on the surface, on which the functional device is assembled, of the lower layer substrate. The lower bracket is configured to correct possible deformation of the printed circuit board.

In addition, a solder pad is disposed on a surface, facing the lower layer substrate, of an upper layer substrate (a semiconductor wafer 101), and a quantity and an arrangement position of solder pads are determined based on the connection assembly. In an embodiment, solder paste is printed on the solder pad, and a heat sink or an upper bracket is mounted on another surface of the upper layer substrate. The upper bracket is configured to correct deformation of the semiconductor wafer 101, and the heat sink is configured to dissipate heat for the semiconductor wafer 101.

The upper layer substrate and the lower layer substrate are mounted and welded in alignment. A position of the solder pad on the upper layer substrate is in a one-to-one correspondence with the first end of the connection assembly. Ambient temperature for welding of the solder ball may be any temperature for low-temperature welding, for example, may be approximately 138 degrees or 118 degrees. Specific temperature is not specifically limited in this application.

An embodiment of the present technology provides a board-level architecture in which the foregoing upper bracket is mounted. The upper bracket includes a spacer 302 and an upper bracket body 300. There are a plurality of spacers 302. For example, the spacer 302 includes an upper layer substrate spacer, namely, a first spacer 3021. One end of the first spacer 3021 is fastened to an upper surface of an insulator structure, and another end is fastened to a semiconductor wafer. Optionally, the spacer 302 further includes a lower layer substrate spacer, namely, a second spacer 3022. One end of the lower layer substrate spacer is fastened to a lower surface of the insulator structure, and another end is fastened to a lower layer substrate. In an example, both the first spacer 3021 and the second spacer 3022 may exist in the board-level architecture, or only the first spacer 3021 may exist. In an example, one end of any first spacer 3021 or second spacer 3022 is connected to a contact surface through welding.

In an example, the first spacer 3021 is located between the semiconductor wafer and the upper surface of the insulator structure, and a lower surface of the first spacer 3021 is welded to the upper surface of the insulator structure. A function of the welding is to better determine a position of the spacer along a horizontal direction, to avoid lap welding with a solder ball.

It should be understood that there may be a plurality of first spacers 3021, the first spacers 3021 may form a cylindrical structure, and a cross section at any position is in a circular or polygonal shape. For example, a cross section of the first spacer 3021 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the first spacers 3021 are distributed at an endpoint and a center of the connection assembly. It should be understood that specific position distribution of the first spacers 3021 is not limited. Optionally, the first spacers 3021 are disposed at four endpoints and a center point of each connection assembly. Optionally, a spacer located at the central point is a circular first spacer 3021, and spacers located at the four endpoints are triangular first spacers 3021.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The first spacer 3021 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

It should be understood that there may be a plurality of second spacers 3022, the second spacers 3022 may form a cylindrical structure, and a cross section at any position is in a circular or polygonal shape. For example, a cross section of the second spacer 3022 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the second spacers 3022 are distributed at an endpoint and a center of the connection assembly. It should be understood that specific position distribution of the second spacers 3022 is not limited. Optionally, the second spacers 3022 are disposed at four endpoints and a center point of each connection assembly. Optionally, a spacer located at the central point is a circular second spacer 3022, and spacers located at the four endpoints are triangular second spacers 3022.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The first spacer 3021 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

In an example, materials of the first spacer 3021 and the second spacer 3022 may be any plated metal, or may be metal that does not need to be plated, for example, a copper-nickel-zinc alloy.

It should be understood that the foregoing embodiments of the first spacer 3021 and the second spacer 3022 may be applied to any embodiment with an insulator structure in this application. The embodiments may be obtained with reference to corresponding embodiments and the foregoing descriptions.

In some embodiments of this application, another connection assembly 100 is further provided. FIG. 4 is a cross-sectional view of a connection assembly 100 pressed against by a lower layer substrate 201 and an upper layer substrate 101 that are in a press fit. The connection assembly 100 includes a connection terminal 401 and an insulator structure 301. In an optional embodiment, the lower layer substrate may be a printed circuit board (PCB), a glass substrate, or the like, and the upper layer substrate may also be a printed circuit board or a silicon-based semiconductor wafer. In an example, the semiconductor wafer includes a plurality of interconnected chips, and is manufactured by using a unified photoetching system. For ease of description, in the following embodiments, technical solutions in embodiments of this application are described in detail by using an example in which the upper layer substrate is a semiconductor wafer and the lower layer substrate is a printed circuit board.

As shown in FIG. 4, seven chip solder pads 501 are disposed on a lower surface of a semiconductor wafer 101. Correspondingly, seven circuit board solder pads 108 are disposed on a circuit board 201 at positions corresponding to the chip solder pads 107.

It should be understood that there are not necessary seven groups of solder pads 501. In an embodiment, the semiconductor wafer 101 may include a solder pad array of M rows×N columns, where M and N may be equal or unequal. A quantity and a size of solder pads depend on sizes of the semiconductor wafer 101 and the circuit board 201. In an embodiment of this application, a shape of the semiconductor wafer 101 may be a circular shape, and a size may be any value ranging from 4 inches to 12 inches; or a shape of the semiconductor wafer 101 may be a square shape, and a size may be any value ranging from 10 mm×10 mm to 300 mm×300 mm. Further, a size of the circuit board 201 is greater than a size of the semiconductor wafer 101. Correspondingly, the circuit board 201 includes a circuit board solder pad array of M rows×N columns, and positions of the circuit board solder pads are in a one-to-one correspondence with positions of the chip solder pads.

An insulator structure 301 is further fastened to the circuit board 201. In an embodiment of this application, the insulator structure 301 is fastened to the circuit board 201 through an adhesive, or may be loosely coupled to the circuit board without fastening. The insulator structure 301 includes an empty slot array (not shown in the figure) of K rows×J columns. As shown in FIG. 1, a colorless region between two units of the insulator structure 301 is an empty slot, the empty slot penetrates the insulator structure 301 along a vertical direction, and a position of the empty slot is in a one-to-one correspondence with a position of the connection terminal 401. It can be simply inferred that, in an example, a position relationship between the connection terminal 401, the solder pad 501, and the empty slot is a one-to-one correspondence, and projections, mapped along the vertical direction, of the connection terminal 401, the solder pad 501, and the empty slot may or may not coincide. FIG. 1 is used as an example. Along the vertical direction, the seven chip solder pads 107 shown in the figure correspond to the seven circuit board solder pads 108 under the seven chip solder pads 107, and correspond to empty slots surrounding the seven chip solder pads 107 and the seven circuit board solder pads 108.

The following describes in detail the connection terminal 401 in the foregoing embodiment. In an example, the connection terminal 401 may be a "T"-shaped needle-like structure shown in FIG. 4. The "T"-shaped needle-like structure includes a body 4015 and a connection part 4012. The body 4015 is a cylindrical structure. In an example, a value range of a height of the body 4015 along the vertical direction may be any value ranging from 0.5 mm to 5 mm. Optionally, the height may be 2 mm. A shape of the body 4015 may be in a plurality of forms. In an example, the body 4015 may be in a cylindrical or prism shape, and a cross section, of the body 4015, that is perpendicular to the vertical direction may be in a circular or polygonal shape. This is not limited in this application.

An end of the body 4015 is provided with the connection part 4012. As shown in FIG. 4, the connection part 4012 is a cylindrical structure. In an example, a value range of a height of the connection part 4012 along the vertical direction may be any value ranging from 0.01 mm to 0.3 mm. Optionally, the height may be 0.055 mm. A shape of the connection part 4012 may be in a plurality of forms. For example, the connection part 4012 may be in a cylindrical or prism shape, and a cross section, of the connection part 4012, that is perpendicular to the vertical direction may be in a circular or polygonal shape. This is not limited in this application. In an example, a cross-sectional area of the connection part 4012 is greater than a cross-sectional area of the body 4015. A circular cross section is used as an example. A cross-sectional diameter of the connection part 4012 may be 0.41 mm, and a cross-sectional diameter of the body 4015 may be 0.2 mm. The cross-sectional area in the foregoing embodiment is a cross section perpendicular to the vertical direction. It should be understood that the body 4015 and the connection part 4012 included in the connection terminal 401 may be an integrated structure, or may be organized parts, and may be made of a conductive metal material such as copper, gold, or aluminum.

In an example of this application, the connection part 4012 is located at a first end of the body 4015, to be specific, an end close to the semiconductor wafer 101. For example, a second end of the body 4015 may not be provided with the connection part 4012. The second end is not specifically limited in this application. It should be understood that the second end may alternatively be provided with a connection part that is the same as or different from that provided at the first end. Based on the descriptions of the foregoing embodiment, the connection part 4012 and the body 4015 constitute a "T"-shaped needle-like structure.

In an example of this application, solder is disposed on an upper surface of the connection part 4012, and the solder is welded to the semiconductor wafer 101, and more specifically, welded to a solder pad fastened to the semiconductor wafer 101. In an example, a ball grid array (BGA) packaging technology is used for the semiconductor wafer 101 and the circuit board 201. An upper surface of the connection part 4012 is provided with a solder ball, and the connection part 4012 is welded to a solder pad on the semiconductor wafer 101 through the solder ball, so that the first end of the connection terminal 401 is electrically connected to the semiconductor wafer 101.

Specifically, solder in BGA packaging further includes solder paste or solder flux. In an example, the solder paste is printed on a solder pad of the semiconductor wafer 101, and then a solder ball with a specific size is added on the solder paste. The solder paste has a function of bonding the solder ball, and makes a contact area of the solder ball larger during heating, so that the solder ball is more quickly and comprehensively heated. This improves welding between the solder ball and a BGA solder pad after the solder ball is melted, and reduces a possibility of poor welding. In addition, in the method in which the solder paste and the solder ball are combined, the solder ball is not likely to move during melting, and is easy to control. In an example, the solder paste may alternatively be replaced with solder flux.

In an example of this application, the connection terminal 401 has a bending capability. When a first end and a second end of the connection terminal 401 are subject to press-fit stress, the body 4015 of the connection terminal 401 can implement column buckling. In the column buckling form, a height of the connection terminal 401 is reduced, so that some stress transferred to the semiconductor wafer is absorbed. In an entire process, a press-fit stress or a retention force of thousands of kg applied in a conventional manner is not needed. This avoids device failures and board-level cracking caused by ultra-large stress, and also reduces power consumption and costs of a device.

Figure 5A:
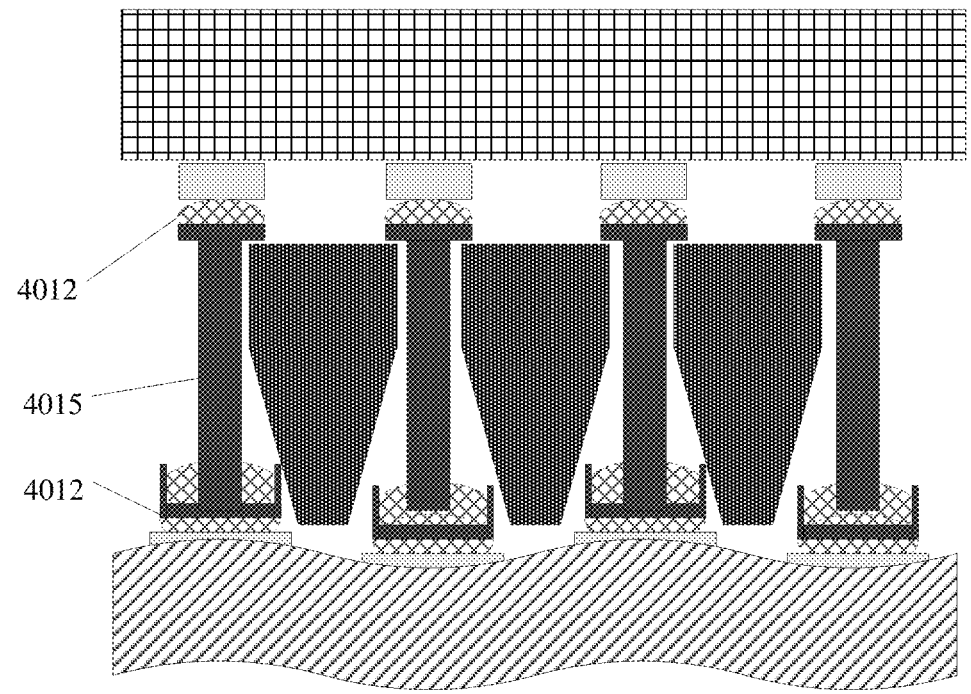
FIG. 5a is an example schematic diagram of a structure of the connection assembly shown in FIG. 4.

In an embodiment of this application, as shown in FIG. 4, the second end of the body 4015 is further provided with a solder structure. In an example, the solder structure includes solder and a solder accommodation structure, and the solder is injected into the solder accommodation structure. For example, the solder accommodation structure is a metal box with a side surface and a bottom surface, and the metal box may accommodate filler solder; or the solder accommodation structure is a metal enclosure frame (not shown in the figure) with a side surface, and similar to the metal box, the metal enclosure frame can also enclose solder. In this embodiment, the metal enclosure frame and an upper surface of a solder pad on the lower layer substrate jointly constitute the solder accommodation structure. A quantity of the filler solder may be adjusted based on actual application. The second end of the body 4015 is located in the metal box or the metal enclosure frame, and a part of the body is covered by the filler solder. In an example, the second end of the body 4015 may not be in full contact with a bottom surface of the metal box or the metal enclosure frame, but is covered by the solder. Because both the solder structure and the solder ball have a stress absorption capability, when the circuit board 201 and the semiconductor wafer 101 are aligned in a press fit, the connection assembly may be adaptively adjusted based on a relative inter-board distance at a position of the connection assembly. As shown in FIG. 5a, if a horizontal height of the substrate at a local position is large, tensile stress on the connection terminal at the position is also large. In this case, the second end of the body 4015 may be away from the solder structure, and vice versa. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device. It should be understood that, during press-fitting, positions of solder pads on the circuit board 201 and solder pads on the semiconductor wafer 101 should be accurately determined, and a tolerance of alignment precision should not exceed ±0.1 mm. Specifically, the positions may be accurately determined in plurality of manners. In an example, a plurality of mark points may be set on the semiconductor wafer 101 and the circuit board 201 for point-to-point positioning.

Figure 5B:
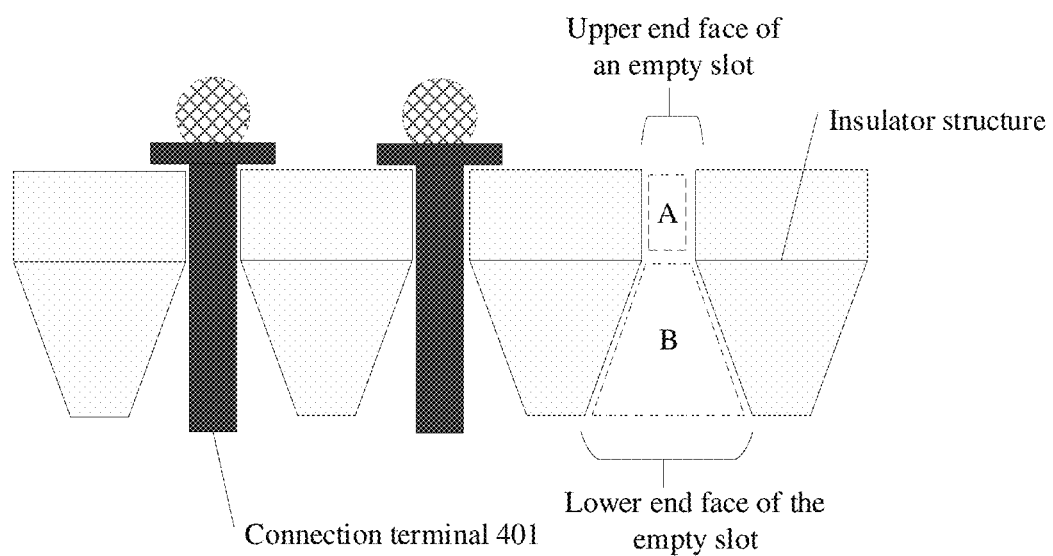
FIG. 5b is an example schematic diagram of a structure of an insulator structure according to an embodiment of this application.

The following describes in detail the insulator structure 301 in the foregoing embodiment. In an example, still as shown in FIG. 4, the insulator structure 301 is mounted on an upper surface of the circuit board 201. In an example, the insulator structure may be mounted in a conventional bonding manner, for example, through an adhesive; or may not be in contact with the upper surface of the circuit board 201. The entire insulator structure is bonded to the connection terminal 401 through loose coupling. The insulator structure includes a plurality of empty slots provided at spacings. Still as shown in FIG. 4, a position of the empty slot is in a one-to-one correspondence with a position of the connection terminal 401. In an example, a high-precision alignment operation may be performed based on coordinate points during mounting, and a range of an alignment error between the chip solder pad array and the insulator structure should be less than or equal to ±0.1 mm. In an example, as shown in FIG. 5b, the empty slot of the insulator structure includes a fastening part region A and a cavity part region B that are arranged along the vertical direction, and the fastening part region A is located above the cavity part region B. It should be understood that the "region" provided in this embodiment is a virtual range. In an example, an insulator structure corresponding to the fastening part region A and the cavity part region B may be an integrated structure or a plurality of discrete structures, and there may be no actual boundary division between the two regions. This is not limited in this application. A division principle is determined based on definitions of the fastening part region and the cavity part region in this application. In an example, the insulator structure may have no fastening part region at all, or may have no cavity part region at all.

In an example, still as shown in FIG. 5b, the fastening part region A is for fastening a position of the body of the connection terminal. It should be understood that the fastening part region has a function of fastening and holding the connection terminal 401, and is for fastening a position of the connection terminal 401 and a connection status between the connection terminal 401 and the substrate. In an example, the connection status is that the connection terminal 401 is upright along the vertical direction, and two ends are welded to the circuit board 201 and the semiconductor wafer 101. This can effectively avoid tilting, bending, or cracking of the connection terminal caused by a position deviation during press-fitting of the connection assembly, and therefore avoid problems such as a device failure and an open circuit or a short circuit of an electrical connection, and greatly improve reliability of the connection assembly. In an example, the cavity part region is for providing abundant filling space for solder. In a board press-fit process, stress applied by the connection terminals to the solder increases. In this case, the solder naturally extends to a surrounding gap. This increases a risk of lap welding between the connection terminals, and therefore causes a short circuit of a device. The cavity part region can greatly alleviate the foregoing problem. In a press-fit stage, the cavity part region provides great extension space for the solder, and absorbs outward tension of the solder. This greatly alleviates a short circuit problem of the device, and improves reliability of the connection assembly. Based on the foregoing descriptions, it can be inferred that a cross-sectional diameter of the fastening part region A should be less than a cross-sectional diameter of the cavity part region B. Certainly, that the cross-sectional diameters of the fastening part region and the fastening part region are equal or that the cross-sectional diameter of the fastening part region should be greater than the cross-sectional diameter of the cavity part region also falls within the protection scope of this application.

Figure 5C:
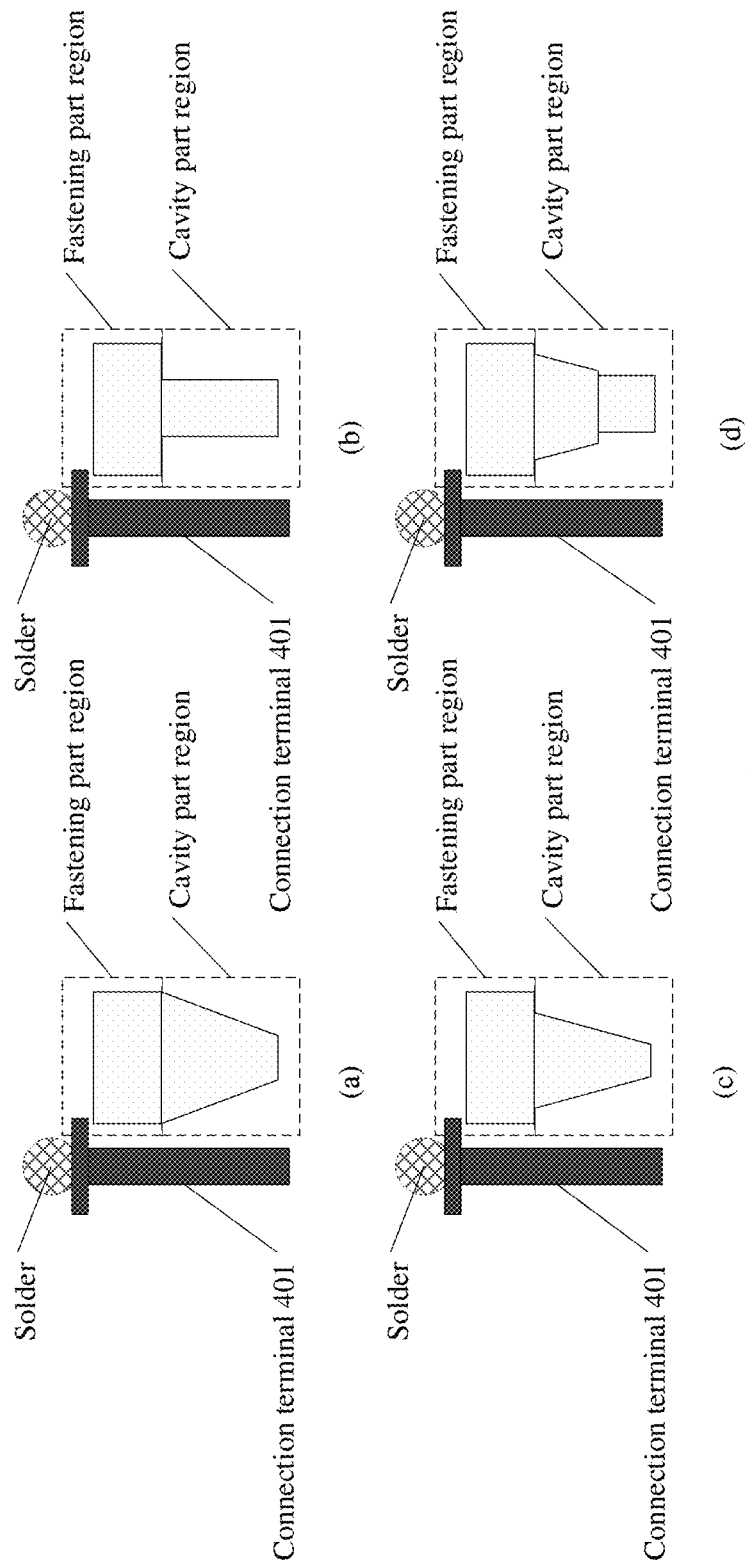
FIG. 5c is an example schematic diagram of structures of a plurality of other insulator structures according to an embodiment of this application.

In an example, a structure enclosed by an empty slot corresponding to the fastening part region is a cylindrical structure, cross-sectional areas of the cylindrical structure remain the same, and a shape of a cross section of the cylindrical structure may be in a plurality of forms. In an example, the shape of the cross section of the cylindrical structure may be a circular shape, an elliptic shape, or a polygonal shape. In an example, a structure enclosed by an empty slot corresponding to the cavity part region may be a structure with "a smaller upper part and a larger lower part". As shown in FIG. 5c, the structure with "a smaller upper part and a larger lower part" is specifically that an area of a cavity region corresponding to the fastening part region is less than an area of a cavity region corresponding to the cavity part region. The cavity region corresponding to the fastening part region is for fastening and holding the connection terminal 401, and a cross-sectional area of the cavity region matches a cross-sectional area of the connection terminal 401. To be specific, as shown in FIG. 5c, a cross-sectional area of the fastening part region A should be greater than a cross-sectional area of the body of the connection terminal 401, so that the connection terminal 401 is fastened and held. A cross-sectional area of the cavity part region B may change with a depth of an empty slot. This is not specifically limited in this application.

Optionally, a size enclosed by the empty slot may be in a shape of a truncated cone. To be specific, an area of an opening close to a surface of the semiconductor wafer 101 (that is, an upper end face of the empty slot in FIG. 5b) is greater than an area of an opening away from the surface of the semiconductor wafer 101 (that is, a lower end face of the empty slot in FIG. 5b). A specific size is as follows: A diameter of the lower opening ranges from 0.6 mm to 0.9 mm, and a diameter of the upper opening ranges from 0.1 mm to 0.5 mm. This diameter is not limited in this application. It can be understood that, because the upper end face of the empty slot is smaller than the lower end face, in a press-fit stage, the cavity part region provides great extension space for solder, and absorbs outward tension of the solder. This greatly alleviates a short circuit problem of a device, and improves reliability of the connection assembly.

In an example, a shape of a single insulator structure may be in a plurality of forms. FIG. 5c shows four possible implementations. It should be understood that a shape of the insulator structure provided in this application is not limited thereto, and all insulator structures that meet the foregoing definitions fall within the protection scope of this application.

Figure 6:
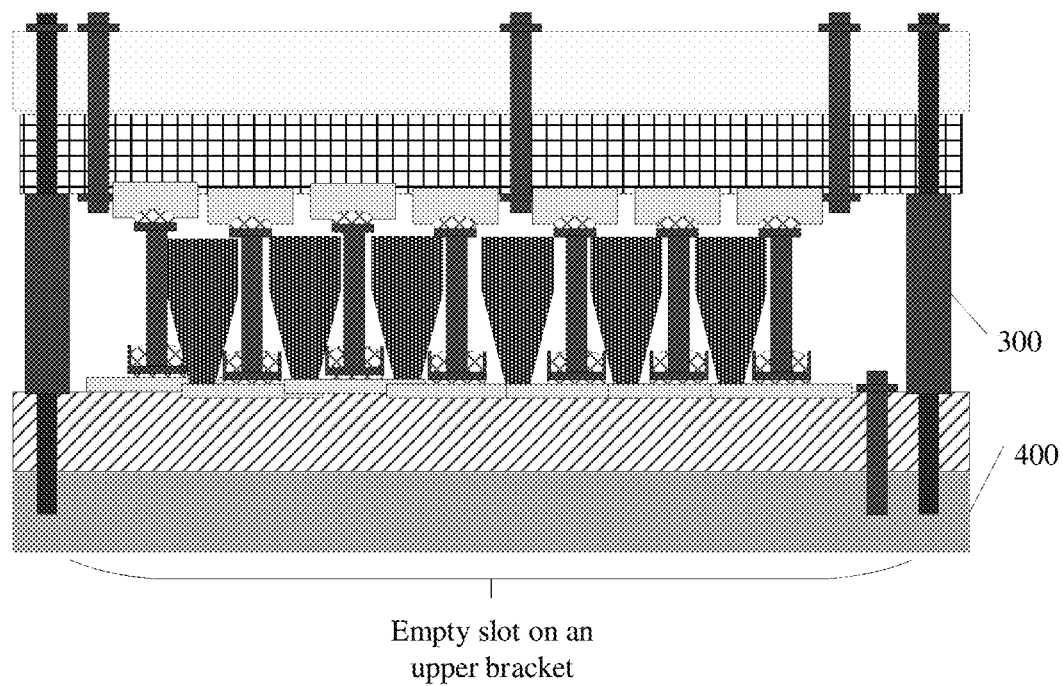
FIG. 6 is an example schematic diagram of another board-level architecture according to an embodiment of this application.

An embodiment of the present technology provides a board-level architecture. As shown in FIG. 6, the board-level architecture 200 (the board-level architecture in FIG. 6 is still shown in a cross-sectional view along a horizontal direction) includes the connection assembly 100 shown in FIG. 4, and a semiconductor wafer (an upper layer substrate 101) and a circuit board (a lower layer substrate 201) that are interconnected through the connection assembly 100. It should be understood that, in actual application, there may not be one connection assembly 100. In actual application, there may alternatively be a plurality of connection assemblies 100 arranged in an array form. The board-level architecture shown in the embodiment of FIG. 6 includes only one connection assembly 100 (only one connection assembly 100 that horizontally or vertically extends outward can be seen from the cross-sectional view). The board-level architecture 200 further includes an upper bracket 300 and a lower bracket. The upper bracket 300 has an empty slot region corresponding to a position of the connection assembly 100. The connection assembly 100 may be disposed in the empty slot region of the upper bracket 300 in a one-to-one correspondence. More specifically, a size value of the empty slot region may be any size of an area in which at least one connection assembly can be placed. Optionally, a shape of the empty slot region is correspondingly the same as a shape of one connection assembly 100. In an example, a gap region between connection assemblies 100, namely, a non-empty-slot region of the upper bracket 300, may be for drilling a through hole. An objective of the through hole is to enable a plurality of connection parts 500 to penetrate the upper bracket 300 and reach the lower bracket, to fasten the upper bracket 300 and the lower bracket in a press fit. In an embodiment, the connection part 500 may be any fastening structure such as a screw or a nut, and technical effect thereof is to prevent warpage and deformation of the circuit board 201 by using the bracket, so as to avoid problems such as board-level cracking, an electrical open circuit, and a device failure caused by deformation, effectively adjust a gap distance between the circuit board 201 and the semiconductor wafer 101, and improve stability and reliability of signal conduction.

In an example, the lower layer substrate and the lower bracket may also be fastened through a connector. This connector and a connector between the upper bracket 300 and the lower bracket may be a same fastening structure or different fastening structures. An objective thereof is to further improve an anti-deformation capability of the lower layer substrate (the circuit board 201), so as to avoid problems such as board-level cracking, an electrical open circuit, and a device failure caused by deformation.

In an example, the upper layer substrate (the semiconductor wafer 101) may be fastened to a heat sink through a connector. This connector and the connector between the upper bracket 300 and the lower bracket may be a same fastening structure or different fastening structures. The heat sink may serve as a component of a cooling system to reduce operation temperature of the semiconductor wafer 101. Because temperature is one of main causes of expansion and deformation, the heat sink is fastened to the upper layer substrate. This can further fasten a position of the semiconductor wafer, prevent a device failure caused by deformation or a position deviation, and improve operation reliability of the upper layer substrate. This can also facilitate heat dissipation for the semiconductor wafer, and improve system stability.

In an example, the connector and the connection part 500 may be separately mounted, and positions of the connector and the connection part 500 may be adaptively adjusted. This is not further limited in this application. Alternatively, a press-fit between a plurality of layers of structures may be completed at a time only by using the connection part 500 (not shown in FIG. 6). In this case, at least one of the plurality of connection parts 500 may penetrate a top surface of a heat sink on the upper layer substrate 101 and reach a bottom surface of the lower bracket, and is fastened by a nut.

This connection structure can further ensure press-fit effect of a plurality of layers of boards, and prevent device failures caused by warpage and deformation. In addition, this connection structure is simple and easy to mount, and a press-fit between a plurality of layers of structures may be completed at a time only by using fasteners of uniform specifications. This reduces assembly time, and also reduces procurement costs.

This application further provides a manufacturing method for the connection assembly and the board-level architecture in the foregoing embodiments. Specifically, in an embodiment, in a normal temperature environment, a functional device is assembled on a surface of a lower layer substrate (a printed circuit board 201), and a solder pad is mounted on another surface. In an embodiment, solder paste is printed on the solder pad, a solder accommodation structure, for example, a metal box or a metal enclosure frame, is disposed on the solder paste, and solder paste is applied to the solder accommodation structure. A quantity and an arrangement position of solder pads are determined based on the connection assembly. The connection assembly is bonded to the solder pad through welding. Specifically, a plurality of insulator structures are mounted on the surface, on which the solder pad is mounted, of the lower layer substrate. A copper pin is surface-mounted in a cavity of the insulator structure. An insulator mechanism is used to support the copper pin, and ensure coplanarity of an upper surface of the copper pin. The solder ball is disposed at a first end of the connection assembly. In an embodiment, ambient temperature for welding of the solder ball may be any temperature for low-temperature welding, for example, may be approximately 138 degrees or 118 degrees. Specific temperature is not specifically limited in this application. A lower bracket is mounted on the surface, on which the functional device is assembled, of the lower layer substrate. The lower bracket is configured to correct possible deformation of the printed circuit board.

In addition, a solder pad is disposed on a surface, facing the lower layer substrate, of an upper layer substrate (a semiconductor wafer 101), and a quantity and an arrangement position of solder pads are determined based on the connection assembly. In an embodiment, solder paste is printed on the solder pad, and a heat sink or an upper bracket is mounted on another surface of the upper layer substrate. The upper bracket is configured to correct deformation of the semiconductor wafer 101, and the heat sink is configured to dissipate heat for the semiconductor wafer 101.

The upper layer substrate and the lower layer substrate are mounted and welded in alignment. A position of the solder pad on the upper layer substrate is in a one-to-one correspondence with the first end of the connection assembly. Ambient temperature for welding of the solder ball may be any temperature for low-temperature welding, for example, may be approximately 138 degrees or 118 degrees. Specific temperature is not specifically limited in this application.

An embodiment of the present technology provides a board-level architecture in which the foregoing upper bracket is mounted. The upper bracket includes a spacer 302 and an upper bracket body 300. There are a plurality of spacers 302. For example, the spacer 302 includes an upper layer substrate spacer, namely, a first spacer 3021. One end of the first spacer 3021 is fastened to an upper surface of an insulator structure, and another end is fastened to a semiconductor wafer. Optionally, the spacer 302 further includes a lower layer substrate spacer, namely, a second spacer 3022. One end of the lower layer substrate spacer is fastened to a lower surface of the insulator structure, and another end is fastened to a lower layer substrate. In an example, both the first spacer 3021 and the second spacer 3022 may exist in the board-level architecture, or only the first spacer 3021 may exist. In an example, one end of any first spacer 3021 or second spacer 3022 is connected to a contact surface through welding.

In an example, the first spacer 3021 is located between the semiconductor wafer and the upper surface of the insulator structure, and a lower surface of the first spacer 3021 is welded to the upper surface of the insulator structure. A function of the welding is to better determine a position of the spacer along a horizontal direction, to avoid lap welding with a solder ball.

It should be understood that there may be a plurality of first spacers 3021, the first spacers 3021 may form a cylindrical structure, and a cross section at any position is in a circular or polygonal shape. For example, a cross section of the first spacer 3021 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the first spacers 3021 are distributed at an endpoint and a center of the connection assembly. It should be understood that specific position distribution of the first spacers 3021 is not limited. Optionally, the first spacers 3021 are disposed at four endpoints and a center point of each connection assembly. Optionally, a spacer located at the central point is a circular first spacer 3021, and spacers located at the four endpoints are triangular first spacers 3021.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The first spacer 3021 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

It should be understood that there may be a plurality of second spacers 3022, the second spacers 3022 may form a cylindrical structure, and a cross section at any position is in a circular or polygonal shape. For example, a cross section of the second spacer 3022 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the second spacers 3022 are distributed at an endpoint and a center of the connection assembly. It should be understood that specific position distribution of the second spacers 3022 is not limited. Optionally, the second spacers 3022 are disposed at four endpoints and a center point of each connection assembly.

Optionally, a spacer located at the central point is a circular second spacer 3022, and spacers located at the four endpoints are triangular second spacers 3022.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The second spacer 3022 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

In an example, materials of the first spacer 3021 and the second spacer 3022 may be any plated metal, or may be metal that does not need to be plated, for example, a copper-nickel-zinc alloy.

Figure 7:
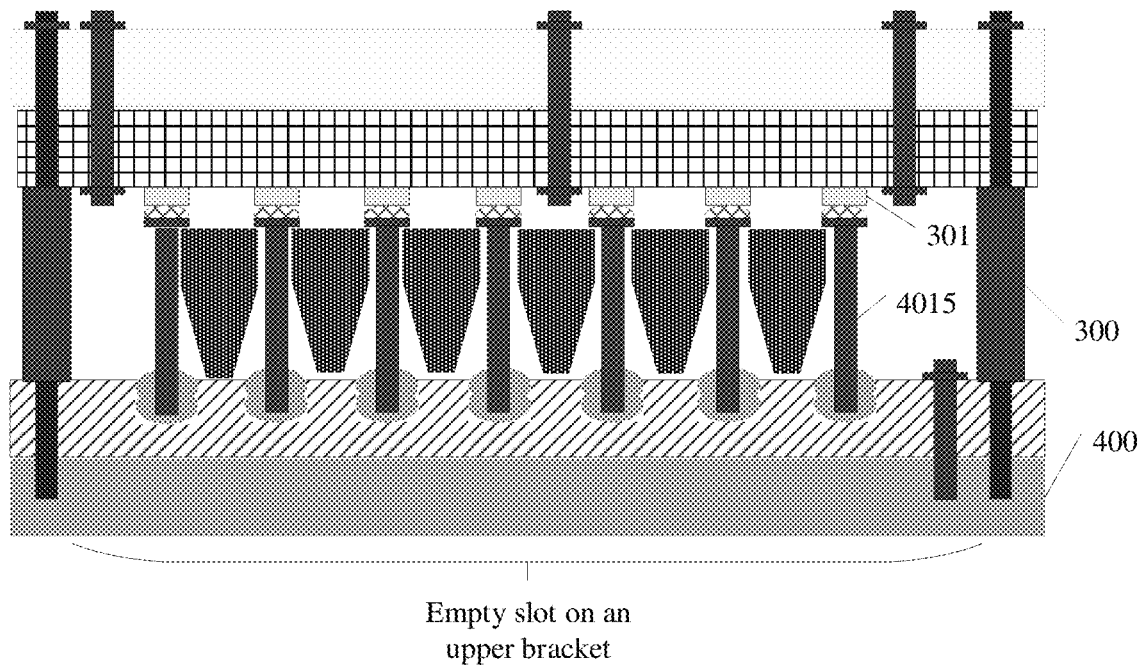
FIG. 7 is an example schematic diagram of another board-level architecture according to an embodiment of this application.

An embodiment of the present technology provides a board-level architecture. As shown in FIG. 7, the board-level architecture 200 (the board-level architecture in FIG. 7 is still shown in a cross-sectional view along a horizontal direction) includes the connection assembly 100 shown in FIG. 4, and a semiconductor wafer (an upper layer substrate 101) and a circuit board (a lower layer substrate 201) that are interconnected through the connection assembly 100. A connection terminal 401 included in the connection assembly may be the connection terminal 401 shown in FIG. 4, and has all features of the connection terminal 401 shown in FIG. 4.

It should be understood that, in actual application, there may not be one connection assembly 100, and there may alternatively be a plurality of connection assemblies 100 arranged in an array form. The board-level architecture shown in the embodiment of FIG. 7 includes only one connection assembly 100 (only one connection assembly 100 that horizontally or vertically extends outward can be seen from the cross-sectional view). The board-level architecture 200 further includes an upper bracket 300 and a lower bracket 400. The upper bracket 300 has an empty slot region corresponding to a position of the connection assembly 100. The connection assembly 100 may be disposed in the empty slot region of the upper bracket 300 in a one-to-one correspondence. In the embodiment of FIG. 7, a size value of the empty slot region may be any size of an area in which at least one connection assembly can be placed. Optionally, a shape of the empty slot region is correspondingly the same as a shape of one connection assembly 100. In an example, a gap region between connection assemblies 100, namely, a non-empty-slot region of the upper bracket 300, may be for drilling a through hole. An objective of the through hole is to enable a plurality of connection parts 500 to penetrate the upper bracket 300 and reach the lower bracket 400, to fasten the upper bracket 300 and the lower bracket 400 in a press fit. In an embodiment, the connection part 500 may be any fastening structure such as a screw or a nut, and technical effect thereof is to prevent warpage and deformation of the circuit board 201 through fastening of the upper bracket 300 and the lower bracket 400, so as to avoid problems such as board-level cracking, an electrical open circuit, and a device failure caused by deformation, effectively adjust a gap distance between the circuit board 201 and the semiconductor wafer 101, and improve stability and reliability of signal conduction. In addition, the fastening structure can adjust a gap between substrates, to adaptively adjust a device layout on the circuit board 201, and prevent failures due to different heights of devices.

In an example, the lower layer substrate and the lower bracket 400 may also be fastened through a connector. This connector and a connector between the upper bracket and the lower bracket 400 may be a same fastening structure or different fastening structures. An objective thereof is to further improve an anti-deformation capability of the lower layer substrate (the circuit board 201), so as to avoid problems such as board-level cracking, an electrical open circuit, and a device failure caused by deformation.

In an example, the upper layer substrate (the semiconductor wafer 101) may be fastened to a heat sink through a connector. This connector and the connector between the upper bracket and the lower bracket 400 may be a same fastening structure or different fastening structures. The heat sink may serve as a component of a cooling system to reduce operation temperature of the semiconductor wafer 101. Because temperature is one of main causes of expansion and deformation, the heat sink is fastened to the upper layer substrate. This can further fasten a position of the semiconductor wafer, prevent a device failure caused by deformation or a position deviation, and improve operation reliability of the upper layer substrate. This can also facilitate heat dissipation for the semiconductor wafer, and improve system stability.

In an example, the connector and the connection part 500 may be separately mounted, and positions of the connector and the connection part 500 may be adaptively adjusted. This is not further limited in this application. Alternatively, a press-fit between a plurality of layers of structures may be completed at a time only by using the connection part 500 (not shown in FIG. 7). In this case, at least one of the plurality of connection parts 500 may penetrate a top surface of a heat sink on the upper layer substrate 101 and reach a bottom surface of the lower bracket 400, and is fastened by a nut. This connection structure can further ensure press-fit effect of a plurality of layers of boards, and prevent device failures caused by warpage and deformation. In addition, this connection structure is simple and easy to mount, and a press-fit between a plurality of layers of structures may be completed at a time only by using fasteners of uniform specifications. This reduces assembly time, and also reduces procurement costs.

In an example of this application, the connection terminal 401 has a bending capability. When a first end and a second end of the connection terminal 401 are subject to press-fit stress, the body 4015 of the connection terminal 401 can implement column buckling. In the column buckling form, a height of the connection terminal 401 is reduced, so that some stress transferred to the semiconductor wafer is absorbed. In an entire process, a press-fit stress or a retention force of thousands of kg applied in a conventional manner is not needed. This avoids device failures and board-level cracking caused by ultra-large stress, and also reduces power consumption and costs of a device.

The following describes in detail the solder accommodation structure in the foregoing embodiment. In an example, as shown in FIG. 7, the second end of the body 4015 is provided with a solder structure. In an example, the solder structure includes solder and a solder accommodation structure, and the solder is injected into the solder accommodation structure. A difference from the foregoing embodiment lies in that blind slots are provided at spacings on the circuit board 201 in the board-level architecture in this embodiment, and positions of the blind slots are in a one-to-one correspondence with positions of the connection terminals. As shown in FIG. 7, the blind slots are located on an upper surface of the circuit board 201. A shape of the blind slot may be in a plurality of forms. It should be understood that, in an example, a cross-sectional area of the blind slot should be greater than a cross-sectional area of the second end of the body 4015. As shown in FIG. 7, the blind slot is filled with solder. To be specific, in this embodiment, the blind slot forms the solder accommodation structure. A quantity of the filler solder may be adjusted based on actual application. The second end of the body 4015 is located in the blind slot, and a part of the body is covered by the filler solder. In an example, the second end of the body 4015 may not be in full contact with a bottom surface of the blind slot, but is covered by the solder. Because both the solder structure and the solder ball have a stress absorption capability, when the circuit board 201 and the semiconductor wafer 101 are aligned in a press fit, the connection assembly may be adaptively adjusted based on a relative inter-board distance at a position of the connection assembly. If a horizontal height of the substrate at a local position is large, tensile stress on the connection terminal at the position is also large. In this case, the second end of the body 4015 may be away from the solder structure, and vice versa. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device. It should be understood that, during press-fitting, positions of solder pads on the circuit board 201 and solder pads on the semiconductor wafer 101 should be accurately determined, and a tolerance of alignment precision should not exceed ±0.1 mm. Specifically, the positions may be accurately determined in plurality of manners. In an example, a plurality of mark points may be set on the semiconductor wafer 101 and the circuit board 201 for point-to-point positioning.

The following describes in detail the insulator structure part in the foregoing embodiment. In an example, as shown in FIG. 7, the insulator structure is mounted on an upper surface of the circuit board 201. In an example, the insulator structure may be mounted in a conventional bonding manner, for example, through an adhesive; or may not be in contact with the upper surface of the circuit board 201. The entire insulator structure is bonded to the connection terminal 401 through loose coupling. The insulator structure includes a plurality of empty slots provided at spacings. As shown in FIG. 7, a position of the empty slot is in a one-to-one correspondence with a position of the connection terminal 401. In an example, a high-precision alignment operation may be performed based on coordinate points during mounting, and a range of an alignment error between the chip solder pad array and the insulator should be less than or equal to ±0.1 mm. In an example, as shown in FIG. 5c, the insulator structure includes a fastening part region and a cavity part region that are stacked along the vertical direction, and the fastening part region is located above the cavity part region. It should be understood that the "region" provided in this embodiment is a virtual range. In an example, the insulator structure may be an integrated structure or a plurality of discrete structures, and there may be no actual boundary division between the two regions. This is not limited in this application. A division principle is determined based on definitions of the fastening part region and the cavity part region in this application. In an example, the insulator structure may have no fastening part region at all, or may have no cavity part region at all.

In an example, as shown in FIG. 5b, the fastening part region is for fastening a position of the body of the connection terminal. It should be understood that the fastening part region has a function of fastening and holding the connection terminal 401, and is for fastening a position of the connection terminal 401 and a connection status between the connection terminal 401 and the substrate. In an example, the connection status is that the connection terminal 401 is upright along the vertical direction, and two ends are welded to the circuit board 201 and the semiconductor wafer 101. This can effectively avoid tilting, bending, or cracking of the connection terminal caused by a position deviation during press-fitting of the connection assembly, and therefore avoid problems such as a device failure and an open circuit or a short circuit of an electrical connection, and greatly improve reliability of the connection assembly. In an example, the cavity part region is for providing abundant filling space for solder. In a board press-fit process, stress applied by the connection terminals to the solder increases. In this case, the solder naturally extends to a surrounding gap. This increases a risk of lap welding between the connection terminals, and therefore causes a short circuit of a device. The cavity part region can greatly alleviate the foregoing problem. In a press-fit stage, the cavity part region provides great extension space for the solder, and absorbs outward tension of the solder. This greatly alleviates a short circuit problem of the device, and improves reliability of the connection assembly. Based on the foregoing descriptions, it can be inferred that a cross-sectional diameter of the fastening part region should be greater than a cross-sectional diameter of the cavity part region Certainly, that the cross-sectional diameters of the fastening part region and the fastening part region are equal or that the cross-sectional diameter of the fastening part region should be less than the cross-sectional diameter of the cavity part region also falls within the protection scope of this application.

In an example, a structure enclosed by an empty slot corresponding to the fastening part region is a cylindrical structure, cross-sectional areas of the cylindrical structure remain the same, and a shape of a cross section of the cylindrical structure may be in a plurality of forms. In an example, the shape of the cross section of the cylindrical structure may be a circular shape, an elliptic shape, or a polygonal shape. In an example, a structure enclosed by an empty slot corresponding to the cavity part region may be a structure with "a smaller upper part and a larger lower part". As shown in FIG. 5b, the structure with "a smaller upper part and a larger lower part" is specifically that an area of a cavity region corresponding to the fastening part region is less than an area of a cavity region corresponding to the cavity part region. The cavity region corresponding to the fastening part region is for fastening and holding the connection terminal 401, and a cross-sectional area of the cavity region matches a cross-sectional area of the connection terminal 401. To be specific, as shown in FIG. 5b, a cross-sectional area of the region A should be greater than a cross-sectional area of the body of the connection terminal 401, so that the connection terminal 401 is fastened and held. A cross-sectional area of the region B may change with a depth of an empty slot. This is not specifically limited in this application.

Optionally, the empty slot may be in a shape of a truncated cone. To be specific, an area of an opening close to a surface of the semiconductor wafer 101 (that is, an upper end face of the empty slot in FIG. 5*b*) is greater than an area of an opening away from the surface of the semiconductor wafer 101 (that is, a lower end face of the empty slot in FIG. 5*b*). A specific size is as follows: A diameter of the lower opening ranges from 0.6 mm to 0.9 mm a diameter of the upper opening ranges from 0.1 mm to 0.5 mm. It can be understood that, because the upper end face of the empty slot is smaller than the lower end face, in a press-fit stage, the cavity part region provides great extension space for solder, and absorbs outward tension of the solder. This greatly alleviates a short circuit problem of a device, and improves reliability of the connection assembly.

In an example, a shape of a single insulator structure may be in a plurality of forms. FIG. 5*c* shows four possible implementations. It should be understood that a shape of the insulator structure provided in this application is not limited thereto.

This application further provides a manufacturing method for the connection assembly and the board-level architecture in the foregoing embodiments. Specifically, in an embodiment, in a normal temperature environment, a functional device is assembled on a surface of a lower layer substrate (a printed circuit board 201), a plurality of blind slots are provided on another surface to form a solder accommodation structure to absorb a height difference on a surface of a printed circuit board and a length error of a copper pin, and a solder pad is mounted on the another surface. A quantity and an arrangement position of solder pads are determined based on the connection assembly. The connection assembly is bonded to the solder pad through welding. Specifically, a plurality of insulator structures are mounted on the surface, on which the solder pad is mounted, of the lower layer substrate. The copper pin is surface-mounted in a cavity of the insulator structure. An insulator mechanism is used to support the copper pin, and ensure coplanarity of an upper surface of the copper pin. The solder ball is disposed at a first end of the connection assembly. In an embodiment, ambient temperature for welding of the solder ball may be any temperature for low-temperature welding, for example, may be approximately 138 degrees or 118 degrees. Specific temperature is not specifically limited in this application. A lower bracket is mounted on the surface, on which the functional device is assembled, of the lower layer substrate. The lower bracket is configured to correct possible deformation of the printed circuit board.

In addition, a solder pad is disposed on a surface, facing the lower layer substrate, of an upper layer substrate (a semiconductor wafer 101), and a quantity and an arrangement position of solder pads are determined based on the connection assembly. In an embodiment, solder paste is printed on the solder pad, and a heat sink or an upper bracket is mounted on another surface of the upper layer substrate. The upper bracket is configured to correct deformation of the semiconductor wafer 101, and the heat sink is configured to dissipate heat for the semiconductor wafer 101.

The upper layer substrate and the lower layer substrate are mounted and welded in alignment. A position of the solder pad on the upper layer substrate is in a one-to-one correspondence with the first end of the connection assembly. Ambient temperature for welding of the solder ball may be any temperature for low-temperature welding, for example, may be approximately 138 degrees or 118 degrees. Specific temperature is not specifically limited in this application.

An embodiment of the present technology provides a board-level architecture in which the foregoing upper bracket is mounted. The upper bracket includes a spacer 302 and an upper bracket body 300. There are a plurality of spacers 302. For example, the spacer 302 includes an upper layer substrate spacer, namely, a first spacer 3021. One end of the first spacer 3021 is fastened to an upper surface of an insulator structure, and another end is fastened to a semiconductor wafer. Optionally, the spacer 302 further includes a lower layer substrate spacer, namely, a second spacer 3022. One end of the lower layer substrate spacer is fastened to a lower surface of the insulator structure, and another end is fastened to a lower layer substrate. In an example, both the first spacer 3021 and the second spacer 3022 may exist in the board-level architecture, or only the first spacer 3021 may exist. In an example, one end of any first spacer 3021 or second spacer 3022 is connected to a contact surface through welding.

In an example, the first spacer 3021 is located between the semiconductor wafer and the upper surface of the insulator structure, and a lower surface of the first spacer 3021 is welded to the upper surface of the insulator structure. A function of the welding is to better determine a position of the spacer along a horizontal direction, to avoid lap welding with a solder ball.

It should be understood that there may be a plurality of first spacers 3021, the first spacers 3021 may form a cylindrical structure, and a cross section at any position is in a circular or polygonal shape. For example, a cross section of the first spacer 3021 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the first spacers 3021 are distributed at an endpoint and a center of the connection assembly. It should be understood that specific position distribution of the first spacers 3021 is not limited. Optionally, the first spacers 3021 are disposed at four endpoints and a center point of each connection assembly. Optionally, a spacer located at the central point is a circular first spacer 3021, and spacers located at the four endpoints are triangular first spacers 3021.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The first spacer 3021 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

It should be understood that there may be a plurality of second spacers 3022, the second spacers 3022 may form a cylindrical structure, and a cross section at any position is in a circular or polygonal shape. For example, a cross section of the second spacer 3022 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the second spacers 3022 are distributed at an endpoint and a center of the connection assembly. It should be understood that specific position distribution of the second spacers 3022 is not limited. Optionally, the second spacers 3022 are disposed at four endpoints and a center point of each connection assembly. Optionally, a spacer located at the central point is a circular second spacer 3022, and spacers located at the four endpoints are triangular second spacers 3022.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The second spacer 3022 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

In an example, materials of the first spacer 3021 and the second spacer 3022 may be any plated metal, or may be metal that does not need to be plated, for example, a copper-nickel-zinc alloy.

Figure 8:
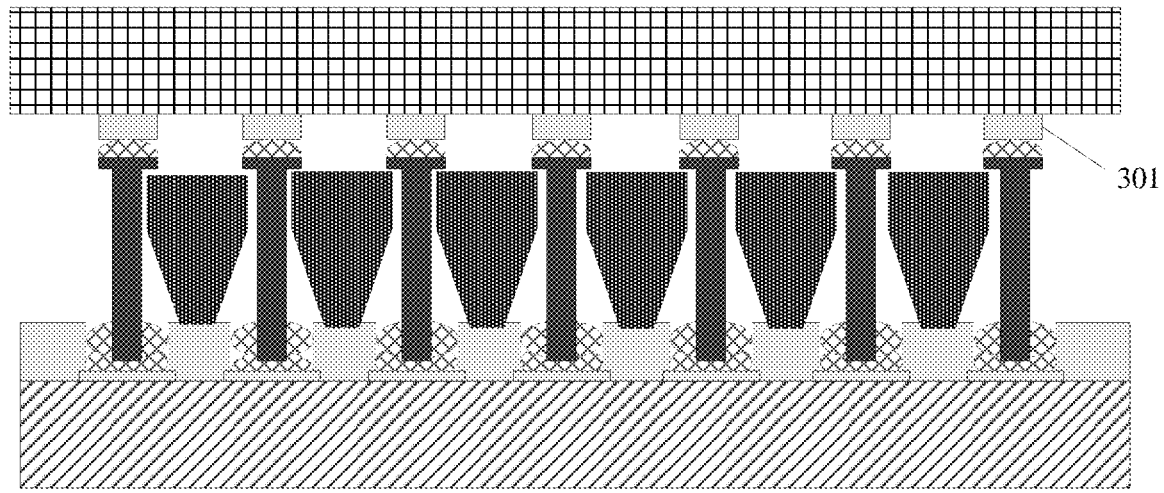
FIG. 8 is an example schematic diagram of another connection assembly according to an embodiment of this application.

An embodiment of the present technology provides a connection assembly 100. FIG. 8 is a cross-sectional view of a connection assembly 100 pressed against by a lower layer substrate and an upper layer substrate that are in a press fit. The connection assembly 100 includes a connection terminal 401 and an insulator structure 301. In an optional embodiment, the lower layer substrate may be a printed circuit board (PCB), a glass substrate, or the like, and the upper layer substrate may also be a printed circuit board or a silicon-based semiconductor wafer. In an example, the semiconductor wafer includes a plurality of interconnected chips, and is manufactured by using a unified photoetching system. For ease of description, in the following embodiments, technical solutions in embodiments of this application are described in detail by using an example in which the upper layer substrate is a semiconductor wafer and the lower layer substrate is a printed circuit board.

As shown in FIG. 4, seven chip solder pads 501 are disposed on a lower surface of a semiconductor wafer 101. Correspondingly, seven circuit board solder pads 108 are disposed on a circuit board 201 at positions corresponding to the chip solder pads 107.

It should be understood that there are not necessary seven groups of solder pads 501. In an embodiment, the semiconductor wafer 101 may include a solder pad array of M rows×N columns, where M and N may be equal or unequal. A quantity and a size of solder pads depend on sizes of the semiconductor wafer 101 and the circuit board 201. In an embodiment of this application, a shape of the semiconductor wafer 101 may be a circular shape, and a size may be any value ranging from 4 inches to 12 inches; or a shape of the semiconductor wafer 101 may be a square shape, and a size may be any value ranging from 10 mm×10 mm to 300 mm×300 mm. Further, a size of the circuit board 201 is greater than a size of the semiconductor wafer 101. Correspondingly, the circuit board 201 includes a circuit board solder pad array of M rows×N columns, and positions of the circuit board solder pads 108 are in a one-to-one correspondence with positions of the chip solder pads 107.

An insulator structure 301 is further fastened to the circuit board 201. In an embodiment of this application, the insulator structure 301 is fastened to the circuit board 201 through an adhesive, or may be loosely coupled to the circuit board without fastening. The insulator structure 301 includes an empty slot array (not shown in the figure) of K rows×J columns. As shown in FIG. 1, a colorless region between two units of the insulator structure 301 is an empty slot, the empty slot penetrates the insulator structure 301 along a vertical direction, and a position of the empty slot is in a one-to-one correspondence with a position of the connection terminal 401. It can be simply inferred that, in an example, a position relationship between the connection terminal 401, the solder pad 501, and the empty slot is a one-to-one correspondence, and projections, mapped along the vertical direction, of the connection terminal 401, the solder pad 501, and the empty slot may or may not coincide. FIG. 1 is used as an example. Along the vertical direction, the seven chip solder pads 107 shown in the figure correspond to the seven circuit board solder pads 108 under the seven chip solder pads 107, and correspond to empty slots surrounding the seven chip solder pads 107 and the seven circuit board solder pads 108.

The following describes in detail the connection terminal 401 in the foregoing embodiment. In an example, the connection terminal 401 may be a "T"-shaped needle-like structure shown in FIG. 4 to FIG. 8. The "T"-shaped needle-like structure includes a body 4015 and a connection part 4012. The body 4015 is a cylindrical structure. In an example, a height of the body 4015 along the vertical direction is approximately 2 mm (with an error of 0.02 mm). A shape of the body 4015 may be in a plurality of shapes. In an example, the body 4015 may be in a cylindrical or prism shape, and a cross section, of the body 4015, that is perpendicular to the vertical direction may be in a circular or polygonal shape. This is not limited in this application.

An end of the body 4015 is provided with the connection part 4012. As shown in FIG. 8, the connection part 4012 is a cylindrical structure. In an example, a height of the connection part 4012 along the vertical direction is 0.055 mm. A shape of the connection part 4012 may be in a plurality of forms. In an example, the connection part 4012 may be in a cylindrical or prism shape, and a cross section, of the connection part 4012, that is perpendicular to the vertical direction may be in a circular or polygonal shape. This is not limited in this application. In an example, a cross-sectional area of the connection part 4012 is greater than a cross-sectional area of the body 4015. A circular cross section is used as an example. A cross-sectional diameter of the connection part 4012 may be 0.41 mm, and a cross-sectional diameter of the body 4015 may be 0.2 mm. The cross-sectional area in the foregoing embodiment is a cross section perpendicular to the vertical direction. It should be understood that the body 4015 and the connection part 4012 included in the connection terminal 401 may be an integrated structure, or may be organized parts, and may be made of a conductive metal material such as copper, gold, or aluminum.

In an example, the connection part 4012 is located at a first end of the body 4015. To be specific, the connection part 4012 is located at an end close to the semiconductor wafer 101. In an example, a second end of the body 4015 may not be provided with the connection part 4012. The second end is not specifically limited in this application. It should be understood that the second end may alternatively be provided with a connection part that is the same as or different from that provided at the first end. Based on the descriptions of the foregoing embodiment, the connection part 4012 and the body 4015 constitute a "T"-shaped needle-like structure.

In an example, solder is disposed on an upper surface of the connection part 4012, and the solder is welded to the semiconductor wafer 101, and more specifically, welded to a solder pad fastened to the semiconductor wafer 101. In an example, a ball grid array (BGA) packaging technology is used for the semiconductor wafer 101 and the circuit board 201. An upper surface of the connection part 4012 is provided with a solder ball, and the connection part 4012 is welded to a solder pad on the semiconductor wafer 101 through the solder ball, so that the first end of the connection terminal 401 is electrically connected to the semiconductor wafer 101.

Specifically, solder in BGA packaging further includes solder paste or solder flux. In an example, the solder paste is printed on a solder pad of the semiconductor wafer 101, and then a solder ball with a specific size is added on the solder paste. The solder paste has a function of bonding the solder ball, and makes a contact area of the solder ball larger during heating, so that the solder ball is more quickly and comprehensively heated. This improves welding between the solder ball and a BGA solder pad after the solder ball is melted, and reduces a possibility of poor welding. In addition, in the method in which the solder paste and the solder ball are combined, the solder ball is not likely to move during melting, and is easy to control. In an example, the solder paste may alternatively be replaced with solder flux.

In an example of this application, the connection terminal 401 has a bending capability. When a first end and a second end of the connection terminal 401 are subject to press-fit stress, the body 4015 of the connection terminal 401 can implement column buckling. In the column buckling form, a height of the connection terminal 401 is reduced, so that some stress transferred to the semiconductor wafer is absorbed. In an entire process, a press-fit stress or a retention force of thousands of kg applied in a conventional manner is not needed. This avoids device failures and board-level cracking caused by ultra-large stress, and also reduces power consumption and costs of a device.

The following describes in detail the solder accommodation structure in the foregoing embodiment. In an example, as shown in FIG. 4, the second end of the body 4015 is provided with a solder structure. In an example, the solder structure includes solder and a solder accommodation structure, and the solder is injected into the solder accommodation structure. The solder may be the solder mentioned in any one of the foregoing embodiments, and a quantity of the filler solder may be adjusted based on actual application. A difference from the foregoing embodiment lies in that the solder accommodation structure is a solder mask layer 601 stacked on an upper surface of the circuit board 201, the solder mask layer includes a plurality of through grooves provided at spacings, and positions of the through grooves are in a one-to-one correspondence with positions of the connection terminals 401. In an example, the through grooves penetrate the solder mask layer. In an example, the second end of the body 4015 is located in the through groove of the solder mask layer, and a part of the body is covered by the filler solder. In an example, the second end of the body 4015 may penetrate the solder mask layer 601, and is welded to the solder pad on the circuit board 201, and a part of the second end of the body 4015 is covered by the solder. In an example, a material of the solder mask layer may be in a plurality of forms, for example, an insulation polymer material such as epoxy resin, acrylic acid, resin (FR4), or polyimide (PI). A thickness of the solder mask layer along the vertical direction may be any value ranging from 0.1 mm to 0.5 mm. In this embodiment, the solder accommodation structure is formed by a side surface of the through groove of the solder mask layer and the upper surface of the circuit board 201 (which may be a surface of the solder pad on the circuit board 201 in an example). Because both the solder structure and the solder ball have a stress absorption capability, when the circuit board 201 and the semiconductor wafer 101 are aligned in a press fit, the connection assembly may be adaptively adjusted based on a relative inter-board distance at a position of the connection assembly. In this embodiment, a height of soldering tin can be increased by the solder mask layer, so that a height difference between the connection terminals 401 and a height difference on a surface of the circuit board 201 can be further absorbed. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device. It should be understood that, during press-fitting, positions of solder pads on the circuit board 201 and solder pads on the semiconductor wafer 101 should be accurately determined, and a tolerance of alignment precision should not exceed ±0.1 mm. Specifically, the positions may be accurately determined in plurality of manners. In an example, a plurality of mark points may be set on the semiconductor wafer 101 and the circuit board 201 for point-to-point positioning.

The following describes in detail the insulator structure in the foregoing embodiment. In an example, as shown in FIG. 4, the insulator structure is mounted on an upper surface of the circuit board 201. In an example, the insulator structure may be mounted in a conventional bonding manner, for example, through an adhesive; or may not be in contact with the upper surface of the circuit board 201. The entire insulator structure is bonded to the connection terminal 401 through loose coupling. The insulator structure includes a plurality of empty slots provided at spacings. As shown in FIG. 5b, a position of the empty slot is in a one-to-one correspondence with a position of the connection terminal 401. In an example, a high-precision alignment operation may be performed based on coordinate points during mounting, and a range of an alignment error between the chip solder pad array and the support body should be less than or equal to ±0.1 mm. In an example, as shown in FIG. 5c, the insulator structure includes a fastening part region and a cavity part region that are stacked along the vertical direction, and the fastening part region is located above the cavity part region. It should be understood that the "region" provided in this embodiment is a virtual range. In an example, the insulator structure may be an integrated structure or a plurality of discrete structures, and there may be no actual boundary division between the two regions. This is not limited in this application. A division principle is determined based on definitions of the fastening part region and the cavity part region in this application. In an example, the insulator structure may have no fastening part region at all, or may have no cavity part region at all.

In an example, as shown in FIG. 5b, the fastening part region is for fastening a position of the body of the connection terminal. It should be understood that the fastening part region has a function of fastening and holding the connection terminal 401, and is for fastening a position of the connection terminal 401 and a connection status between the connection terminal 401 and the substrate. The connection status may be that the connection terminal 401 is upright along the vertical direction, and two ends are welded to the circuit board 201 and the semiconductor wafer 101. This can effectively avoid tilting, bending, or cracking of the connection terminal caused by a position deviation during press-fitting of the connection assembly, and therefore avoid problems such as a device failure and an open circuit or a short circuit of an electrical connection, and greatly improve reliability of the connection assembly. In an example, the cavity part region is for providing abundant filling space for solder. In a board press-fit process, stress applied by the connection terminals to the solder increases. In this case, the solder naturally extends to a surrounding gap. This increases a risk of lap welding between the connection terminals, and therefore causes a short circuit of a device. The cavity part region can greatly alleviate the foregoing problem. In a press-fit stage, the cavity part region provides great extension space for the solder, and absorbs outward tension of the solder. This greatly alleviates a short circuit problem of the device, and improves reliability of the connection assembly. Based on the foregoing descriptions, it can be inferred that a cross-sectional diameter of the fastening part region should be greater than a cross-sectional diameter of the cavity part region Certainly, that the cross-sectional diameters of the fastening part region and the fastening part region are equal or that the cross-sectional diameter of the fastening part region should be less than the cross-sectional diameter of the cavity part region also falls within the protection scope of this application.

In an example, a structure enclosed by an empty slot corresponding to the fastening part region is a cylindrical structure, cross-sectional areas of the cylindrical structure remain the same, and a shape of a cross section of the cylindrical structure may be in a plurality of forms. In an example, the shape of the cross section of the cylindrical structure may be a circular shape, an elliptic shape, or a polygonal shape. In an example, a structure enclosed by an empty slot corresponding to the cavity part region may be a structure with "a smaller upper part and a larger lower part". As shown in FIG. 5b, the structure with "a smaller upper part and a larger lower part" is specifically that an area of a cavity region corresponding to the fastening part region is less than an area of a cavity region corresponding to the cavity part region. The cavity region corresponding to the fastening part region is for fastening and holding the connection terminal 401, and a cross-sectional area of the cavity region matches a cross-sectional area of the connection terminal 401. To be specific, as shown in FIG. 5b, a cross-sectional area of the region A should be greater than a cross-sectional area of the body of the connection terminal 401, so that the connection terminal 401 is fastened and held. A cross-sectional area of the region B may change with a depth of an empty slot. This is not specifically limited in this application.

Optionally, the empty slot may be in a shape of a truncated cone. To be specific, an area of an opening close to a surface of the semiconductor wafer 101 (that is, an upper end face of the empty slot in FIG. 5b) is greater than an area of an opening away from the surface of the semiconductor wafer 101 (that is, a lower end face of the empty slot in FIG. 5b). A specific size is as follows: A diameter of the lower opening ranges from 0.6 mm to 0.9 mm a diameter of the upper opening ranges from 0.1 mm to 0.5 mm. It can be understood that, because the upper end face of the empty slot is smaller than the lower end face, in a press-fit stage, the cavity part region provides great extension space for solder, and absorbs outward tension of the solder. This greatly alleviates a short circuit problem of a device, and improves reliability of the connection assembly. In this embodiment, the insulator structure is located on an upper surface of a "non-through-groove region" of the solder mask layer. In an example, the insulator structure is in contact with the solder mask layer, or the insulator structure is connected to the connection terminal 401 through loose coupling and is not in contact with the solder mask layer. This is not specifically limited in this application.

In an example, a shape of a single insulator structure may be in a plurality of forms. FIG. 5c shows four possible implementations. It should be understood that a shape of the insulator structure provided in this application is not limited thereto.

Figure 9:
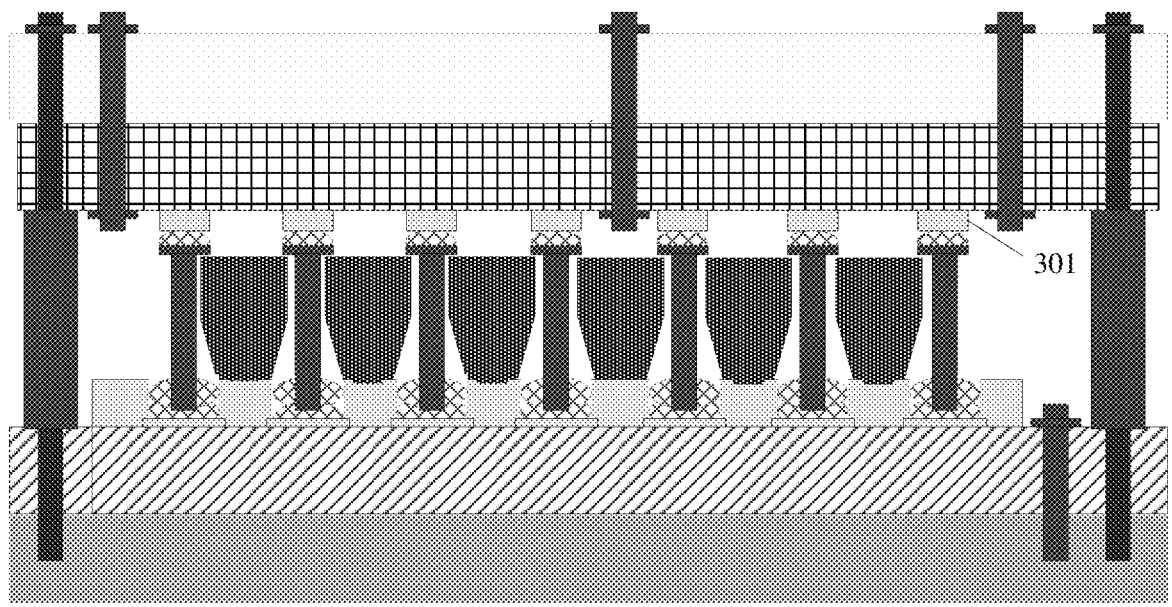
FIG. 9 is an example schematic diagram of another board-level architecture according to an embodiment of this application.

An embodiment of the present technology provides a board-level architecture. As shown in FIG. 9, the board-level architecture 200 (the board-level architecture in FIG. 9 is still shown in a cross-sectional view along a horizontal direction) includes the connection assembly 100 shown in FIG. 8, and a semiconductor wafer (an upper layer substrate 101) and a circuit board (a lower layer substrate 201) that are interconnected through the connection assembly 100. It should be understood that, in actual application, there may not be one connection assembly 100, and there may alternatively be a plurality of connection assemblies 100 arranged in an array form. The board-level architecture shown in the embodiment of FIG. 9 includes only one connection assembly 100 (only one connection assembly 100 that horizontally or vertically extends outward can be seen from the cross-sectional view). The board-level architecture 200 further includes an upper bracket and a lower bracket 400. The upper bracket has an empty slot region corresponding to a position of the connection assembly 100. The connection assembly 100 may be disposed in the empty slot region of the upper bracket in a one-to-one correspondence. In the embodiment of FIG. 2, a size value of the empty slot region may be any size of an area in which at least one connection assembly can be placed. Optionally, a shape of the empty slot region is correspondingly the same as a shape of one connection assembly 100. In an example, a gap region between connection assemblies 100, namely, a non-empty-slot region of the upper bracket, may be for drilling a through hole. An objective of the through hole is to enable a plurality of connection parts 500 to penetrate the upper bracket and reach the lower bracket 400, to fasten the upper bracket and the lower bracket 400 in a press fit. In an embodiment, the connection part 500 may be any fastening structure such as a screw or a nut, and technical effect thereof is to prevent warpage and deformation of the circuit board 201 by using the bracket, so as to avoid problems such as board-level cracking, an electrical open circuit, and a device failure caused by deformation, effectively adjust a gap distance between the circuit board 201 and the semiconductor wafer 101, and improve stability and reliability of signal conduction.

In an example, the lower layer substrate and the lower bracket 400 may also be fastened through a connector. This connector and a connector between the upper bracket and the lower bracket 400 may be a same fastening structure or different fastening structures. An objective thereof is to further improve an anti-deformation capability of the lower layer substrate (the circuit board 201), so as to avoid problems such as board-level cracking, an electrical open circuit, and a device failure caused by deformation.

In an example, the upper layer substrate (the semiconductor wafer 101) may be fastened to a heat sink through a connector. This connector and the connector between the upper bracket and the lower bracket 400 may be a same fastening structure or different fastening structures. The heat sink may serve as a component of a cooling system to reduce operation temperature of the semiconductor wafer 101. Because temperature is one of main causes of expansion and deformation, the heat sink is fastened to the upper layer substrate. This can further fasten a position of the semiconductor wafer, prevent a device failure caused by deformation or a position deviation, and improve operation reliability of the upper layer substrate. This can also facilitate heat dissipation for the semiconductor wafer, and improve system stability.

In an example, the connector and the connection part 500 may be separately mounted, and positions of the connector and the connection part 500 may be adaptively adjusted. This is not further limited in this application. Alternatively, a press-fit between a plurality of layers of structures may be completed at a time only by using the connection part 500 (not shown in FIG. 2). In this case, at least one of the plurality of connection parts 500 may penetrate a top surface of a heat sink on the upper layer substrate 101 and reach a bottom surface of the lower bracket 400, and is fastened by a nut. This connection structure can further ensure press-fit effect of a plurality of layers of boards, and prevent device failures caused by warpage and deformation. In addition, this connection structure is simple and easy to mount, and a press-fit between a plurality of layers of structures may be completed at a time only by using fasteners of uniform specifications. This reduces assembly time, and also reduces procurement costs.

This application further provides a manufacturing method for the connection assembly and the board-level architecture in the foregoing embodiments. Specifically, in an embodiment, in a normal temperature environment, a functional device is assembled on a surface of a lower layer substrate (a printed circuit board 201), a solder mask layer is provided on another surface to form a solder accommodation structure to absorb a height difference on a surface of a printed circuit board and a length error of a copper pin, and a solder pad is mounted on the another surface. A quantity and an arrangement position of solder pads are determined based on the connection assembly. The connection assembly is bonded to the solder pad through welding. Specifically, a plurality of insulator structures are mounted on the surface, on which the solder pad is mounted, of the lower layer substrate. The copper pin is surface-mounted in a cavity of the insulator structure. An insulator mechanism is used to support the copper pin, and ensure coplanarity of an upper surface of the copper pin. The solder ball is disposed at a first end of the connection assembly. In an embodiment, ambient temperature for welding of the solder ball may be any temperature for low-temperature welding, for example, may be approximately 138 degrees or 118 degrees. Specific temperature is not specifically limited in this application. A lower bracket is mounted on the surface, on which the functional device is assembled, of the lower layer substrate. The lower bracket is configured to correct possible deformation of the printed circuit board.

In addition, a solder pad is disposed on a surface, facing the lower layer substrate, of an upper layer substrate (a semiconductor wafer 101), and a quantity and an arrangement position of solder pads are determined based on the connection assembly. In an embodiment, solder paste is printed on the solder pad, and a heat sink or an upper bracket is mounted on another surface of the upper layer substrate. The upper bracket is configured to correct deformation of the semiconductor wafer 101, and the heat sink is configured to dissipate heat for the semiconductor wafer 101.

The upper layer substrate and the lower layer substrate are mounted and welded in alignment. A position of the solder pad on the upper layer substrate is in a one-to-one correspondence with the first end of the connection assembly. Ambient temperature for welding of the solder ball may be any temperature for low-temperature welding, for example, may be approximately 138 degrees or 118 degrees. Specific temperature is not specifically limited in this application.

An embodiment of the present technology provides a board-level architecture in which the foregoing upper bracket is mounted. The upper bracket includes a spacer 302 and an upper bracket body 300. There are a plurality of spacers 302. For example, the spacer 302 includes an upper layer substrate spacer, namely, a first spacer 3021. One end of the first spacer 3021 is fastened to an upper surface of an insulator structure, and another end is fastened to a semiconductor wafer. Optionally, the spacer 302 further includes a lower layer substrate spacer, namely, a second spacer 3022. One end of the lower layer substrate spacer is fastened to a lower surface of the insulator structure, and another end is fastened to a lower layer substrate. In an example, both the first spacer 3021 and the second spacer 3022 may exist in the board-level architecture, or only the first spacer 3021 may exist. In an example, one end of any first spacer 3021 or second spacer 3022 is connected to a contact surface through welding.

In an example, the first spacer 3021 is located between the semiconductor wafer and the upper surface of the insulator structure, and a lower surface of the first spacer 3021 is welded to the upper surface of the insulator structure. A function of the welding is to better determine a position of the spacer along a horizontal direction, to avoid lap welding with a solder ball.

It should be understood that there may be a plurality of first spacers 3021, the first spacers 3021 may form a cylindrical structure, and a cross section at any position is in a circular or polygonal shape. For example, a cross section of the first spacer 3021 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the first spacers 3021 are distributed at an endpoint and a center of the connection assembly. It should be understood that specific position distribution of the first spacers 3021 is not limited. Optionally, the first spacers 3021 are disposed at four endpoints and a center point of each connection assembly. Optionally, a spacer located at the central point is a circular first spacer 3021, and spacers located at the four endpoints are triangular first spacers 3021.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The first spacer 3021 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

It should be understood that there may be a plurality of second spacers 3022, the second spacers 3022 may form a cylindrical structure, and a cross section at any position is in a circular or polygonal shape. For example, a cross section of the second spacer 3022 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the second spacers 3022 are distributed at an endpoint and a center of the connection assembly. It should be understood that specific position distribution of the second spacers 3022 is not limited. Optionally, the second spacers 3022 are disposed at four endpoints and a center point of each connection assembly. Optionally, a spacer located at the central point is a circular second spacer 3022, and spacers located at the four endpoints are triangular second spacers 3022.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The second spacer 3022 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

In an example, materials of the first spacer 3021 and the second spacer 3022 may be any plated metal, or may be metal that does not need to be plated, for example, a copper-nickel-zinc alloy.

Figure 10:
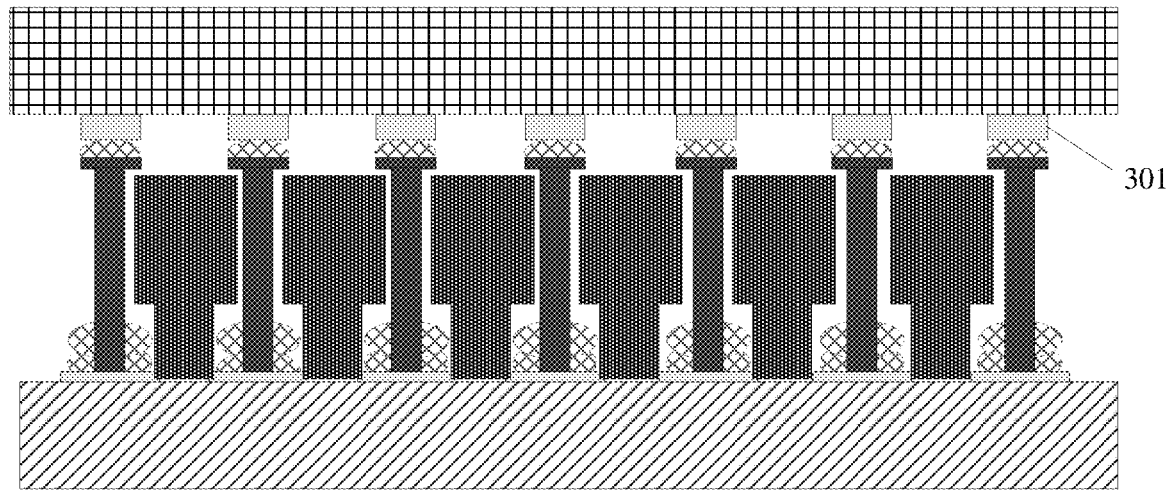
FIG. 10 is an example schematic diagram of another connection assembly according to an embodiment of this application.

An embodiment of the present technology provides a connection assembly 100. FIG. 10 is a cross-sectional view of a connection assembly 100 pressed against by a lower layer substrate and an upper layer substrate that are in a press fit. The connection assembly 100 includes a connection terminal 401 and an insulator structure 301. In an optional embodiment, the lower layer substrate may be a printed circuit board (PCB), a glass substrate, or the like, and the upper layer substrate may also be a printed circuit board or a silicon-based semiconductor wafer. In an example, the semiconductor wafer includes a plurality of interconnected chips, and is manufactured by using a unified photoetching system. For ease of description, in the following embodiments, technical solutions in embodiments of this application are described in detail by using an example in which the upper layer substrate is a semiconductor wafer and the lower layer substrate is a printed circuit board.

As shown in FIG. 10, seven chip solder pads 501 are disposed on a lower surface of a semiconductor wafer 101. Correspondingly, seven circuit board solder pads 108 are disposed on a circuit board 201 at positions corresponding to the chip solder pads 107.

It should be understood that there are not necessary seven groups of solder pads 501. In an embodiment, the semiconductor wafer 101 may include a solder pad array of M rows×N columns, where M and N may be equal or unequal. A quantity and a size of solder pads depend on sizes of the semiconductor wafer 101 and the circuit board 201. In an embodiment of this application, a shape of the semiconductor wafer 101 may be a circular shape, and a size may be any value ranging from 4 inches to 12 inches; or a shape of the semiconductor wafer 101 may be a square shape, and a size may be any value ranging from 10 mm×10 mm to 300 mm×300 mm. Further, a size of the circuit board 201 is greater than a size of the semiconductor wafer 101. Correspondingly, the circuit board 201 includes a circuit board solder pad array of M rows×N columns, and positions of the circuit board solder pads 108 are in a one-to-one correspondence with positions of the chip solder pads 107.

An insulator structure 301 is further fastened to the circuit board 201. In an embodiment of this application, the insulator structure 301 is fastened to the circuit board 201 through an adhesive, or may be bonded to the circuit board through loose coupling. The insulator structure 301 includes an empty slot array (not shown in the figure) of K rows×J columns. As shown in FIG. 1, a colorless region between two units of the insulator structure 301 is an empty slot, the empty slot penetrates the insulator structure 301 along a vertical direction, and a position of the empty slot is in a one-to-one correspondence with a position of the connection terminal 401. It can be simply inferred that, in an example, a position relationship between the connection terminal 401, the solder pad 501, and the empty slot is a one-to-one correspondence. To be specific, projections, mapped along the vertical direction, of the connection terminal 401, the solder pad 501, and the empty slot may coincide. FIG. 1 is used as an example. Along the vertical direction, the seven chip solder pads 107 shown in the figure correspond to the seven circuit board solder pads 108 under the seven chip solder pads 107, and correspond to empty slots surrounding the seven chip solder pads 107 and the seven circuit board solder pads 108.

The following describes in detail the connection terminal 401 in the foregoing embodiment. In an example, the connection terminal 401 may be a "T"-shaped needle-like structure shown in FIG. 4. The "T"-shaped needle-like structure includes a body 4015 and a connection part 4012. The body 4015 is a cylindrical structure. In an example, a height of the body 4015 along the vertical direction is approximately 2 mm (with an error of 0.02 mm). A shape of the body 4015 may be in a plurality of shapes. In an example, the body 4015 may be in a cylindrical or prism shape, and a cross section, of the body 4015, that is perpendicular to the vertical direction may be in a circular or polygonal shape. This is not limited in this application.

An end of the body 4015 is provided with the connection part 4012. As shown in FIG. 4, the connection part 4012 is a cylindrical structure. In an example, a height of the connection part 4012 along the vertical direction is 0.055 mm. A shape of the connection part 4012 may be in a plurality of forms. In an example, the connection part 4012 may be in a cylindrical or prism shape, and a cross section, of the connection part 4012, that is perpendicular to the vertical direction may be in a circular or polygonal shape. This is not limited in this application. In an example, a cross-sectional area of the connection part 4012 is greater than a cross-sectional area of the body 4015. A circular cross section is used as an example. A cross-sectional diameter of the connection part 4012 may be 0.41 mm, and a cross-sectional diameter of the body 4015 may be 0.2 mm. The cross-sectional area in the foregoing embodiment is a cross section perpendicular to the vertical direction. It should be understood that the body 4015 and the connection part 4012 included in the connection terminal 401 may be an integrated structure, or may be organized parts, and may be made of a conductive metal material such as copper, gold, or aluminum.

In an example, the connection part 4012 is located at a first end of the body 4015, to be specific, an end close to the semiconductor wafer 101. In an example, a second end of the body 4015 may not be provided with the connection part 4012. The second end is not specifically limited in this application. It should be understood that the second end may alternatively be provided with a connection part that is the same as or different from that provided at the first end. Based on the descriptions of the foregoing embodiment, the connection part 4012 and the body 4015 constitute a "T"-shaped needle-like structure.

In an example, solder is disposed on an upper surface of the connection part 4012, and the solder is welded to the semiconductor wafer 101, and more specifically, welded to a solder pad fastened to the semiconductor wafer 101. In an example, a ball grid array (BGA) packaging technology is used for the semiconductor wafer 101 and the circuit board 201. An upper surface of the connection part 4012 is provided with a solder ball, and the connection part 4012 is welded to a solder pad on the semiconductor wafer 101 through the solder ball, so that the first end of the connection terminal 401 is electrically connected to the semiconductor wafer 101.

Specifically, solder in BGA packaging further includes solder paste or solder flux. In an example, the solder paste is printed on a solder pad of the semiconductor wafer 101, and then a solder ball with a specific size is added on the solder paste. The solder paste has a function of bonding the solder ball, and makes a contact area of the solder ball larger during heating, so that the solder ball is more quickly and comprehensively heated. This improves welding between the solder ball and a BGA solder pad after the solder ball is melted, and reduces a possibility of poor welding. In addition, in the method in which the solder paste and the solder ball are combined, the solder ball is not likely to move during melting, and is easy to control. In an example, the solder paste may alternatively be replaced with solder flux.

The following describes in detail the insulator structure in the foregoing embodiment. In an example, as shown in FIG. 4, the insulator structure is mounted on an upper surface of the circuit board 201. In an example, the insulator structure may be mounted in a conventional bonding manner, for example, through an adhesive; or may not be in contact with the upper surface of the circuit board 201. The entire insulator structure is bonded to the connection terminal 401 through loose coupling. The insulator structure includes a plurality of empty slots provided at spacings. As shown in FIG. 5b, a position of the empty slot is in a one-to-one correspondence with a position of the connection terminal 401. In an example, a high-precision alignment operation may be performed based on coordinate points during mounting, and a range of an alignment error between the chip solder pad array and the support body should be less than or equal to ±0.1 mm. In an example, as shown in FIG. 5c, the insulator structure includes a fastening part region and a cavity part region that are stacked along the vertical direction, and the fastening part region is located above the cavity part region. It should be understood that the "region" provided in this embodiment is a virtual range. In an example, the insulator structure may be an integrated structure or a plurality of discrete structures, and there may be no actual boundary division between the two regions. This is not limited in this application. A division principle is determined based on definitions of the fastening part region and the cavity part region in this application. In an example, the insulator structure may have no fastening part region at all, or may have no cavity part region at all.

In an example, as shown in FIG. 5b, the fastening part region is for fastening a position of the body of the connection terminal. It should be understood that the fastening part region has a function of fastening and holding the connection terminal 401, and is for fastening a position of the connection terminal 401 and a connection status between the connection terminal 401 and the substrate. In an example, the connection status is that the connection terminal 401 is upright along the vertical direction, and two ends are welded to the circuit board 201 and the semiconductor wafer 101. This can effectively avoid tilting, bending, or cracking of the connection terminal caused by a position deviation during press-fitting of the connection assembly, and therefore avoid problems such as a device failure and an open circuit or a short circuit of an electrical connection, and greatly improve reliability of the connection assembly. In an example, the cavity part region is for providing abundant filling space for solder. In a board press-fit process, stress applied by the connection terminals to the solder increases. In this case, the solder naturally extends to a surrounding gap. This increases a risk of lap welding between the connection terminals, and therefore causes a short circuit of a device. The cavity part region can greatly alleviate the foregoing problem. In a press-fit stage, the cavity part region provides great extension space for the solder, and absorbs outward tension of the solder. This greatly alleviates a short circuit problem of the device, and improves reliability of the connection assembly. Based on the foregoing descriptions, it can be inferred that a cross-sectional diameter of the fastening part region should be greater than a cross-sectional diameter of the cavity part region Certainly, that the cross-sectional diameters of the fastening part region and the fastening part region are equal or that the cross-sectional diameter of the fastening part region should be less than the cross-sectional diameter of the cavity part region also falls within the protection scope of this application.

In an example, a structure enclosed by an empty slot corresponding to the fastening part region is a cylindrical structure, cross-sectional areas of the cylindrical structure remain the same, and a shape of a cross section of the cylindrical structure may be in a plurality of forms. In an example, the shape of the cross section of the cylindrical structure may be a circular shape, an elliptic shape, or a polygonal shape. In an example, a structure enclosed by an empty slot corresponding to the cavity part region may be a structure with "a smaller upper part and a larger lower part". As shown in FIG. 5b, the structure with "a smaller upper part and a larger lower part" is specifically that an area of a cavity region corresponding to the fastening part region is less than an area of a cavity region corresponding to the cavity part region. The cavity region corresponding to the fastening part region is for fastening and holding the connection terminal 401, and a cross-sectional area of the cavity region matches a cross-sectional area of the connection terminal 401. To be specific, as shown in FIG. 5b, a cross-sectional area of the region A should be greater than a cross-sectional area of the body of the connection terminal 401, so that the connection terminal 401 is fastened and held. A cross-sectional area of the region B may change with a depth of an empty slot. This is not specifically limited in this application.

Optionally, the empty slot may be in a shape of a truncated cone. To be specific, an area of an opening close to a surface of the semiconductor wafer 101 (that is, an upper end face of the empty slot in FIG. 5b) is greater than an area of an opening away from the surface of the semiconductor wafer 101 (that is, a lower end face of the empty slot in FIG. 5b). A specific size is as follows: A diameter of the lower opening ranges from 0.6 mm to 0.9 mm a diameter of the upper opening ranges from 0.1 mm to 0.5 mm. It can be understood that, because the upper end face of the empty slot is smaller than the lower end face, in a press-fit stage, the cavity part region provides great extension space for solder, and absorbs outward tension of the solder. This greatly alleviates a short circuit problem of a device, and improves reliability of the connection assembly.

In an example, a shape of a single insulator structure may be in a plurality of forms. FIG. 5c shows four possible implementations. It should be understood that a shape of the insulator structure provided in this application is not limited thereto.

The following describes in detail the solder accommodation structure in the foregoing embodiment. In an example, as shown in FIG. 10, the second end of the body 4015 is provided with a solder structure. In an example, the solder structure includes solder and a solder accommodation structure, and the solder is injected into the solder accommodation structure. In an example, the solder accommodation structure is space enclosed by a cavity part region in the insulator structure and an upper surface of the circuit board 201. The space may accommodate filler solder, and a quantity of the filler solder may be adjusted based on actual application. The second end of the body 4015 is located in the solder accommodation structure, and a part of the body is covered by the filler solder. In an example, the second end of the body 4015 may not be in full contact with a bottom surface of a metal box, but is covered by the solder. Because both the solder structure and the solder ball have a stress absorption capability, when the circuit board 201 and the semiconductor wafer 101 are aligned in a press fit, the connection assembly may be adaptively adjusted based on a relative inter-board distance at a position of the connection assembly. As shown in FIG. 5, if a horizontal height of the substrate at a local position is large, tensile stress on the connection terminal at the position is also large. In this case, the second end of the body 4015 may be away from the solder structure, and vice versa. In this way, stress to be transferred to a chip is absorbed by the connection assembly.

In an entire process, a press-fit stress or a retention force of thousands of kg applied in a conventional manner is not needed. This avoids device failures and board-level cracking caused by ultra-large stress, and also reduces power consumption and costs of a device. It should be understood that, during press-fitting, positions of solder pads on the circuit board 201 and solder pads on the semiconductor wafer 101 should be accurately determined, and a tolerance of alignment precision should not exceed ±0.1 mm. Specifically, the positions may be accurately determined in plurality of manners. In an example, a plurality of mark points may be set on the semiconductor wafer 101 and the circuit board 201 for point-to-point positioning.

Figure 11:
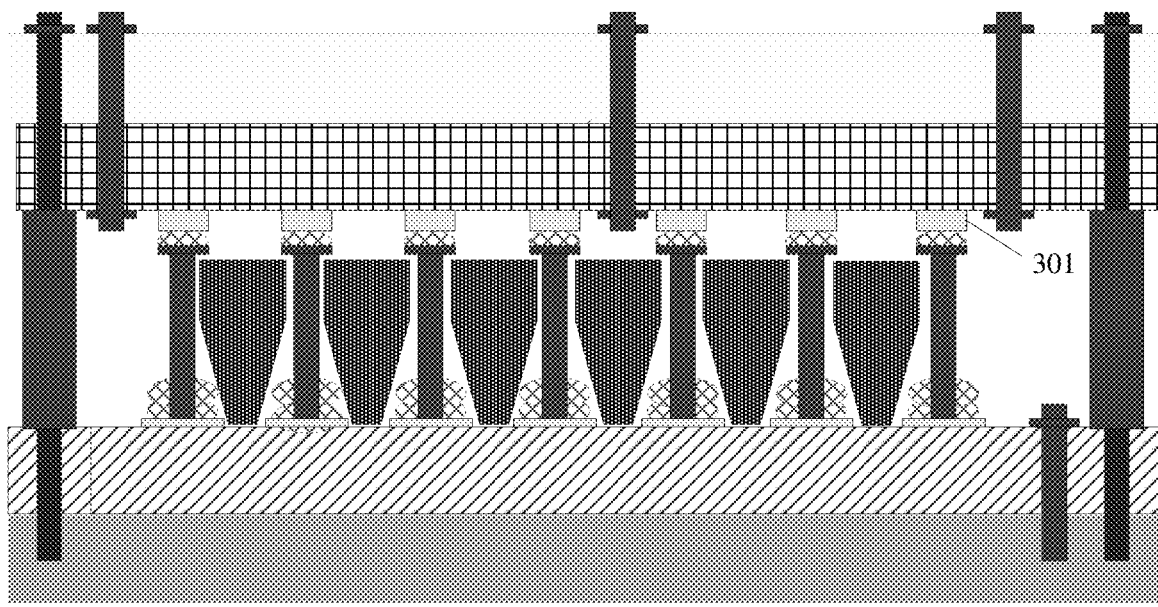
FIG. 11 is an example schematic diagram of another board-level architecture according to an embodiment of this application.

An embodiment of the present technology provides a board-level architecture. As shown in FIG. 11, the board-level architecture 200 (the board-level architecture in FIG. 11 is still shown in a cross-sectional view along a horizontal direction) includes the connection assembly 100 shown in FIG. 10, and a semiconductor wafer (an upper layer substrate 101) and a circuit board (a lower layer substrate 201) that are interconnected through the connection assembly 100. It should be understood that, in actual application, there may not be one connection assembly 100, and there may alternatively be a plurality of connection assemblies 100 arranged in an array form. The board-level architecture shown in the embodiment of FIG. 11 includes only one connection assembly 100 (only one connection assembly 100 that horizontally or vertically extends outward can be seen from the cross-sectional view). The board-level architecture 200 further includes an upper bracket and a lower bracket 400. The upper bracket has an empty slot region corresponding to a position of the connection assembly 100. The connection assembly 100 may be disposed in the empty slot region of the upper bracket in a one-to-one correspondence. In the embodiment of FIG. 11, a size value of the empty slot region may be any size of an area in which at least one connection assembly can be placed. Optionally, a shape of the empty slot region is correspondingly the same as a shape of one connection assembly 100. In an example, a gap region between connection assemblies 100, namely, a non-empty-slot region of the upper bracket, may be for drilling a through hole. An objective of the through hole is to enable a plurality of connection parts 500 to penetrate the upper bracket and reach the lower bracket 400, to fasten the upper bracket and the lower bracket 400 in a press fit. In an embodiment, the connection part 500 may be any fastening structure such as a screw or a nut, and technical effect thereof is to prevent warpage and deformation of the circuit board 201 by using the bracket, so as to avoid problems such as board-level cracking, an electrical open circuit, and a device failure caused by deformation, effectively adjust a gap distance between the circuit board 201 and the semiconductor wafer 101, and improve stability and reliability of signal conduction.

In an example, the lower layer substrate and the lower bracket may also be fastened through a connector. This connector and a connector between the upper bracket and the lower bracket may be a same fastening structure or different fastening structures. An objective thereof is to further improve an anti-deformation capability of the lower layer substrate (the circuit board 201), so as to avoid problems such as board-level cracking, an electrical open circuit, and a device failure caused by deformation.

In an example, the upper layer substrate (the semiconductor wafer 101) may be fastened to a heat sink through a connector. This connector and the connector between the upper bracket and the lower bracket may be a same fastening structure or different fastening structures. The heat sink may serve as a component of a cooling system to reduce operation temperature of the semiconductor wafer 101. Because temperature is one of main causes of expansion and deformation, the heat sink is fastened to the upper layer substrate. This can further fasten a position of the semiconductor wafer, prevent a device failure caused by deformation or a position deviation, and improve operation reliability of the upper layer substrate. This can also facilitate heat dissipation for the semiconductor wafer, and improve system stability.

In an example, the connector and the connection part 500 may be separately mounted, and positions of the connector and the connection part 500 may be adaptively adjusted. This is not further limited in this application. Alternatively, a press-fit between a plurality of layers of structures may be completed at a time only by using the connection part 500 (not shown in FIG. 2). In this case, at least one of the plurality of connection parts 500 may penetrate a top surface of a heat sink on the upper layer substrate 101 and reach a bottom surface of the lower bracket, and is fastened by a nut. This connection structure can further ensure press-fit effect of a plurality of layers of boards, and prevent device failures caused by warpage and deformation. In addition, this connection structure is simple and easy to mount, and a press-fit between a plurality of layers of structures may be completed at a time only by using fasteners of uniform specifications. This reduces assembly time, and also reduces procurement costs.

This application further provides a manufacturing method for the connection assembly and the board-level architecture in the foregoing embodiments. Specifically, in an embodiment, in a normal temperature environment, a functional device is assembled on a surface of a lower layer substrate (a printed circuit board 201), and a solder pad is mounted on another surface. A quantity and an arrangement position of solder pads are determined based on the connection assembly. The connection assembly is bonded to the solder pad through welding. The solder ball is disposed at a first end of the connection assembly. In an embodiment, ambient temperature for welding of the solder ball may be any temperature for low-temperature welding, for example, may be approximately 138 degrees or 118 degrees. Specific temperature is not specifically limited in this application. A lower bracket is mounted on the surface, on which the functional device is assembled, of the lower layer substrate. The lower bracket is configured to correct possible deformation of the printed circuit board.

In addition, a solder pad is disposed on a surface, facing the lower layer substrate, of an upper layer substrate (a semiconductor wafer 101), and a quantity and an arrangement position of solder pads are determined based on the connection assembly. In an embodiment, solder paste is printed on the solder pad, and a heat sink or an upper bracket is mounted on another surface of the upper layer substrate. The upper bracket is configured to correct deformation of the semiconductor wafer 101, and the heat sink is configured to dissipate heat for the semiconductor wafer 101.

The upper layer substrate and the lower layer substrate are mounted and welded in alignment. A position of the solder pad on the upper layer substrate is in a one-to-one correspondence with the first end of the connection assembly. Ambient temperature for welding of the solder ball may be any temperature for low-temperature welding, for example, may be approximately 138 degrees or 118 degrees. Specific temperature is not specifically limited in this application.

An embodiment of the present technology provides a board-level architecture in which the foregoing upper bracket is mounted. The upper bracket includes a spacer 302 and an upper bracket body 300. There are a plurality of spacers 302. For example, the spacer 302 includes an upper layer substrate spacer, namely, a first spacer 3021. One end of the first spacer 3021 is fastened to an upper surface of an insulator structure, and another end is fastened to a semiconductor wafer. Optionally, the spacer 302 further includes a lower layer substrate spacer, namely, a second spacer 3022. One end of the lower layer substrate spacer is fastened to a lower surface of the insulator structure, and another end is fastened to a lower layer substrate. In an example, both the first spacer 3021 and the second spacer 3022 may exist in the board-level architecture, or only the first spacer 3021 may exist. In an example, one end of any first spacer 3021 or second spacer 3022 is connected to a contact surface through welding.

In an example, the first spacer 3021 is located between the semiconductor wafer and the upper surface of the insulator structure, and a lower surface of the first spacer 3021 is welded to the upper surface of the insulator structure. A function of the welding is to better determine a position of the spacer along a horizontal direction, to avoid lap welding with a solder ball.

It should be understood that there may be a plurality of first spacers 3021, the first spacers 3021 may form a cylindrical structure, and a cross section at any position is in a circular or polygonal shape. For example, a cross section of the first spacer 3021 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the first spacers 3021 are distributed at an endpoint and a center of the connection assembly. It should be understood that specific position distribution of the first spacers 3021 is not limited. Optionally, the first spacers 3021 are disposed at four endpoints and a center point of each connection assembly. Optionally, a spacer located at the central point is a circular first spacer 3021, and spacers located at the four endpoints are triangular first spacers 3021.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The first spacer 3021 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

It should be understood that there may be a plurality of second spacers 3022, the second spacers 3022 may form a cylindrical structure, and a cross section at any position is in a circular or polygonal shape. For example, a cross section of the second spacer 3022 may be in a polygonal shape.

Optionally, the polygonal shape may be a triangular shape. Compared with a circular spacer, a triangular spacer has higher customizability and a larger area, provides better support, and can fully utilize a gap region on a connection assembly. In an example, the second spacers 3022 are distributed at an endpoint and a center of the connection assembly. It should be understood that specific position distribution of the second spacers 3022 is not limited. Optionally, the second spacers 3022 are disposed at four endpoints and a center point of each connection assembly. Optionally, a spacer located at the central point is a circular second spacer 3022, and spacers located at the four endpoints are triangular second spacers 3022.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The second spacer 3022 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

In an example, materials of the first spacer 3021 and the second spacer 3022 may be any plated metal, or may be metal that does not need to be plated, for example, a copper-nickel-zinc alloy.

Figure 12A:
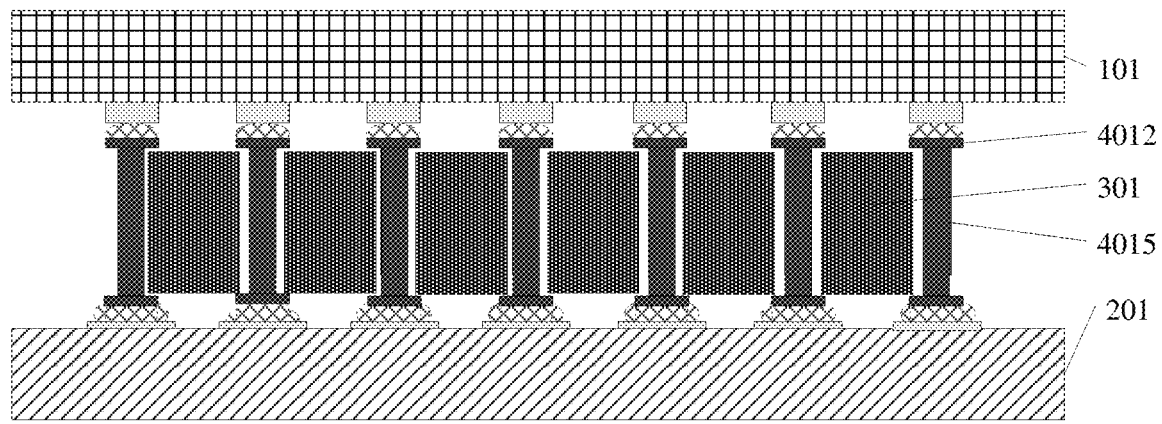
FIG. 12a is an example schematic diagram of another connection assembly according to an embodiment of this application.
Figure 12B:
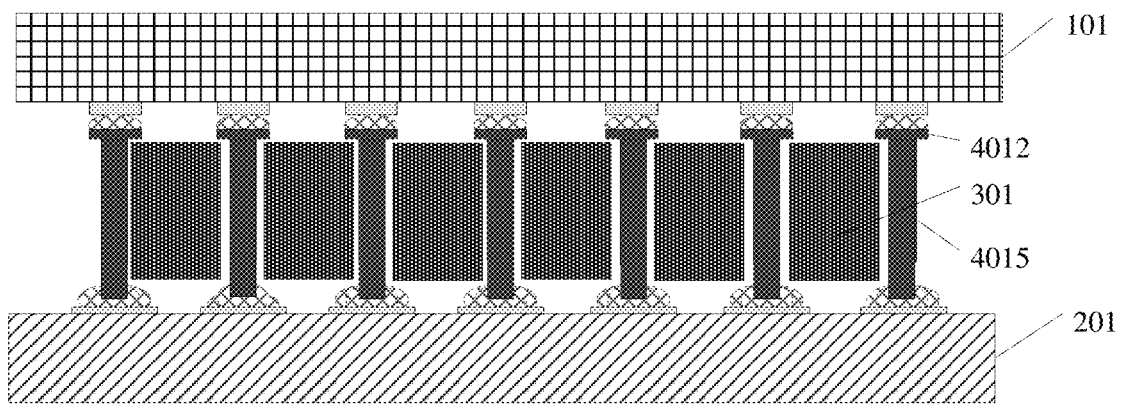
FIG. 12b is an example schematic diagram of another connection assembly according to an embodiment of this application.

An embodiment of the present technology provides a connection assembly 100, as shown in FIG. 12a and FIG. 12b. FIG. 12a is a cross-sectional view of a connection assembly 100 pressed against by a lower layer substrate and an upper layer substrate that are in a press fit. The connection assembly 100 includes a connection terminal 401 and an insulator structure 301. In an optional embodiment, the lower layer substrate may be a printed circuit board (PCB), a glass substrate, or the like, and the upper layer substrate may also be a printed circuit board or a silicon-based semiconductor wafer. In an example, the semiconductor wafer includes a plurality of interconnected chips, and is manufactured by using a unified photoetching system. For ease of description, in the following embodiments, technical solutions in embodiments of this application are described in detail by using an example in which the upper layer substrate is a semiconductor wafer and the lower layer substrate is a printed circuit board.

As shown in FIG. 12a and FIG. 12b, seven chip solder pads 501 are disposed on a lower surface of a semiconductor wafer 101. Correspondingly, seven circuit board solder pads 108 are disposed on a circuit board 201 at positions corresponding to the chip solder pads 107.

It should be understood that there are not necessary seven groups of solder pads 501. In an embodiment, the semiconductor wafer 101 may include a solder pad array of M rows×N columns, where M and N may be equal or unequal. A quantity and a size of solder pads depend on sizes of the semiconductor wafer 101 and the circuit board 201. In an embodiment of this application, a shape of the semiconductor wafer 101 may be a circular shape, and a size may be any value ranging from 4 inches to 12 inches; or a shape of the semiconductor wafer 101 may be a square shape, and a size may be any value ranging from 10 mm×10 mm to 300 mm×300 mm. Further, a size of the circuit board 201 is greater than a size of the semiconductor wafer 101. Correspondingly, the circuit board 201 includes a circuit board solder pad array of M rows×N columns, and positions of the circuit board solder pads 108 are in a one-to-one correspondence with positions of the chip solder pads 107.

An insulator structure 301 is further fastened to the circuit board 201. In an embodiment of this application, the insulator structure 301 is fastened to the circuit board 201 through an adhesive, or may be loosely coupled to the circuit board without fastening. The insulator structure 301 includes an empty slot array (not shown in the figure) of K rows×J columns. As shown in FIG. 1, a colorless region between two units of the insulator structure 301 is an empty slot, the empty slot penetrates the insulator structure 301 along a vertical direction, and a position of the empty slot is in a one-to-one correspondence with a position of the connection terminal 401. It can be simply inferred that, in an example, a position relationship between the connection terminal 401, the solder pad 501, and the empty slot is a one-to-one correspondence, and projections, mapped along the vertical direction, of the connection terminal 401, the solder pad 501, and the empty slot may or may not coincide. FIG. 1 is used as an example. Along the vertical direction, the seven chip solder pads 107 shown in the figure correspond to the seven circuit board solder pads 108 under the seven chip solder pads 107, and correspond to empty slots surrounding the seven chip solder pads 107 and the seven circuit board solder pads 108.

The following describes in detail the connection terminal 401 in the foregoing embodiment. In an example, the connection terminal 401 may be a "T"-shaped needle-like structure shown in FIG. 12a. The "T"-shaped needle-like structure includes a body 4015 and a connection part 4012. The body 4015 is a cylindrical structure. In an example, a height of the body 4015 along the vertical direction is approximately 2 mm (with an error of 0.02 mm). A shape of the body 4015 may be in a plurality of shapes. In an example, the body 4015 may be in a cylindrical or prism shape, and a cross section, of the body 4015, that is perpendicular to the vertical direction may be in a circular or polygonal shape. This is not limited in this application.

An end of the body 4015 is provided with the connection part 4012. As shown in FIG. 12a, the connection part 4012 is a cylindrical structure. In an example, a height of the connection part 4012 along the vertical direction is 0.055 mm. A shape of the connection part 4012 may be in a plurality of forms. In an example, the connection part 4012 may be in a cylindrical or prism shape, and a cross section, of the connection part 4012, that is perpendicular to the vertical direction may be in a circular or polygonal shape. This is not limited in this application. In an example, a cross-sectional area of the connection part 4012 is greater than a cross-sectional area of the body 4015. A circular cross section is used as an example. A cross-sectional diameter of the connection part 4012 may be 0.41 mm, and a cross-sectional diameter of the body 4015 may be 0.2 mm. The cross-sectional area in the foregoing embodiment is a cross section perpendicular to the vertical direction. It should be understood that the body 4015 and the connection part 4012 included in the connection terminal 401 may be an integrated structure, or may be organized parts, and may be made of a conductive metal material such as copper, gold, or aluminum.

In an example, the connection part 4012 is located at a first end of the body 4015, to be specific, an end close to the semiconductor wafer 101. In an example, a second end of the body 4015 may also be provided with the connection part 4012. The second end is not specifically limited in this application. It should be understood that the second end may alternatively be provided with a connection part that is the same as or different from that provided at the first end. Based on the descriptions of the foregoing embodiment, the connection part 4012 and the body 4015 constitute an "I"-shaped needle-like structure.

In an example, the second end of the body 4015 may alternatively not be provided with the connection part. As shown in FIG. 12b, based on this, the connection part 4012 and the body 2015 constitute a "T"-shaped needle-like structure, and a part of the second end of the body 4015 is covered by solder. Compared with the "I"-shaped needle-like structure, this structure is simpler, and processing costs and difficulty are lower.

In an example of this application, the connection terminal 401 has a bending capability. When a first end and a second end of the connection terminal 401 are subject to press-fit stress, the body 4015 of the connection terminal 401 can implement column buckling. In the column buckling form, a height of the connection terminal 401 is reduced, so that some stress transferred to the semiconductor wafer is absorbed. In an entire process, a press-fit stress or a retention force of thousands of kg applied in a conventional manner is not needed. This avoids device failures and board-level cracking caused by ultra-large stress, and also reduces power consumption and costs of a device.

In an example, solder is disposed on an upper surface of the connection part 4012, and the solder is welded to the semiconductor wafer 101, and more specifically, welded to a solder pad fastened to the semiconductor wafer 101. In an example, a ball grid array (BGA) packaging technology is used for the semiconductor wafer 101 and the circuit board 201. An upper surface of the connection part 4012 is provided with a solder ball, and the connection part 4012 is welded to a solder pad on the semiconductor wafer 101 through the solder ball, so that the first end of the connection terminal 401 is electrically connected to the semiconductor wafer 101.

Specifically, solder in BGA packaging further includes solder paste or solder flux. In an example, the solder paste is printed on a solder pad of the semiconductor wafer 101, and then a solder ball with a specific size is added on the solder paste. The solder paste has a function of bonding the solder ball, and makes a contact area of the solder ball larger during heating, so that the solder ball is more quickly and comprehensively heated. This improves welding between the solder ball and a BGA solder pad after the solder ball is melted, and reduces a possibility of poor welding. In addition, in the method in which the solder paste and the solder ball are combined, the solder ball is not likely to move during melting, and is easy to control. In an example, the solder paste may alternatively be replaced with solder flux.

The following describes in detail the insulator structure in the foregoing embodiment. In an example, as shown in FIG. 4, the insulator structure is mounted on an upper surface of the circuit board 201. In an example, the insulator structure may be mounted in a conventional bonding manner, for example, through an adhesive; or may not be in contact with the upper surface of the circuit board 201. The entire insulator structure is bonded to the connection terminal 401 through loose coupling. The insulator structure includes a plurality of empty slots provided at spacings. As shown in FIG. 5b, a position of the empty slot is in a one-to-one correspondence with a position of the connection terminal 401. In an example, a high-precision alignment operation may be performed based on coordinate points during mounting, and a range of an alignment error between the chip solder pad array and the support body should be less than or equal to ±0.1 mm. In an example, as shown in FIG. 5c, the insulator structure includes a fastening part region and a cavity part region that are stacked along the vertical direction, and the fastening part region is located above the cavity part region. It should be understood that the "region" provided in this embodiment is a virtual range. In an example, the insulator structure may be an integrated structure or a plurality of discrete structures, and there may be no actual boundary division between the two regions. This is not limited in this application. A division principle is determined based on definitions of the fastening part region and the cavity part region in this application. In an example, the insulator structure may have no fastening part region at all, or may have no cavity part region at all.

In an example, as shown in FIG. 5b, the fastening part region is for fastening a position of the body of the connection terminal. It should be understood that the fastening part region has a function of fastening and holding the connection terminal 401, and is for fastening a position of the connection terminal 401 and a connection status between the connection terminal 401 and the substrate. In an example, the connection status is that the connection terminal 401 is upright along the vertical direction, and two ends are welded to the circuit board 201 and the semiconductor wafer 101. This can effectively avoid tilting, bending, or cracking of the connection terminal caused by a position deviation during press-fitting of the connection assembly, and therefore avoid problems such as a device failure and an open circuit or a short circuit of an electrical connection, and greatly improve reliability of the connection assembly. In an example, the cavity part region is for providing abundant filling space for solder. In a board press-fit process, stress applied by the connection terminals to the solder increases. In this case, the solder naturally extends to a surrounding gap. This increases a risk of lap welding between the connection terminals, and therefore causes a short circuit of a device. The cavity part region can greatly alleviate the foregoing problem. In a press-fit stage, the cavity part region provides great extension space for the solder, and absorbs outward tension of the solder. This greatly alleviates a short circuit problem of the device, and improves reliability of the connection assembly. Based on the foregoing descriptions, it can be inferred that a cross-sectional diameter of the fastening part region should be greater than a cross-sectional diameter of the cavity part region Certainly, that the cross-sectional diameters of the fastening part region and the fastening part region are equal or that the cross-sectional diameter of the fastening part region should be less than the cross-sectional diameter of the cavity part region also falls within the protection scope of this application.

In an example, a structure enclosed by an empty slot corresponding to the fastening part region is a cylindrical structure, cross-sectional areas of the cylindrical structure remain the same, and a shape of a cross section of the cylindrical structure may be in a plurality of forms. In an example, the shape of the cross section of the cylindrical structure may be a circular shape, an elliptic shape, or a polygonal shape. In an example, a structure enclosed by an empty slot corresponding to the cavity part region may be a structure with "a smaller upper part and a larger lower part". As shown in FIG. 5b, the structure with "a smaller upper part and a larger lower part" is specifically that an area of a cavity region corresponding to the fastening part region is less than an area of a cavity region corresponding to the cavity part region. The cavity region corresponding to the fastening part region is for fastening and holding the connection terminal 401, and a cross-sectional area of the cavity region matches a cross-sectional area of the connection terminal 401. To be specific, as shown in FIG. 5b, a cross-sectional area of the region A should be greater than a cross-sectional area of the body of the connection terminal 401, so that the connection terminal 401 is fastened and held. A cross-sectional area of the region B may change with a depth of an empty slot. This is not specifically limited in this application.

Optionally, a size enclosed by the empty slot may be in a shape of a truncated cone. To be specific, an area of an opening close to a surface of the semiconductor wafer 101 (that is, an upper end face of the empty slot in FIG. 5b) is greater than an area of an opening away from the surface of the semiconductor wafer 101 (that is, a lower end face of the empty slot in FIG. 5b). A specific size is as follows: A diameter of the lower opening ranges from 0.6 mm to 0.9 mm a diameter of the upper opening ranges from 0.1 mm to 0.5 mm. It can be understood that, because the upper end face of the empty slot is smaller than the lower end face, in a press-fit stage, the cavity part region provides great extension space for solder, and absorbs outward tension of the solder. This greatly alleviates a short circuit problem of a device, and improves reliability of the connection assembly.

In an example, a shape of a single insulator structure may be in a plurality of forms. FIG. 5c shows four possible implementations. It should be understood that a shape of the insulator structure provided in this application is not limited thereto.

In an example, as shown in FIG. 10, the second end of the body 4015 is provided with a solder structure. In an example, the solder structure includes solder and a solder accommodation structure, and the solder is injected into the solder accommodation structure. In an example, the solder accommodation structure is space enclosed by a cavity part region in the insulator structure and an upper surface of the circuit board 201. The space may accommodate filler solder, and a quantity of the filler solder may be adjusted based on actual application. The second end of the body 4015 is located in the solder accommodation structure, and a part of the body is covered by the filler solder. In an example, the second end of the body 4015 may not be in full contact with a bottom surface of a metal box, but is covered by the solder. Because both the solder structure and the solder ball have a stress absorption capability, when the circuit board 201 and the semiconductor wafer 101 are aligned in a press fit, the connection assembly may be adaptively adjusted based on a relative inter-board distance at a position of the connection assembly. As shown in FIG. 5, if a horizontal height of the substrate at a local position is large, tensile stress on the connection terminal at the position is also large. In this case, the second end of the body 4015 may be away from the solder structure, and vice versa. In this way, stress to be transferred to a chip is absorbed by the connection assembly. In an entire process, a press-fit stress or a retention force of thousands of kg applied in a conventional manner is not needed. This avoids device failures and board-level cracking caused by ultra-large stress, and also reduces power consumption and costs of a device. It should be understood that, during press-fitting, positions of solder pads on the circuit board 201 and solder pads on the semiconductor wafer 101 should be accurately determined, and a tolerance of alignment precision should not exceed ±0.1 mm. Specifically, the positions may be accurately determined in plurality of manners. In an example, a plurality of mark points may be set on the semiconductor wafer 101 and the circuit board 201 for point-to-point positioning.

Figure 13:
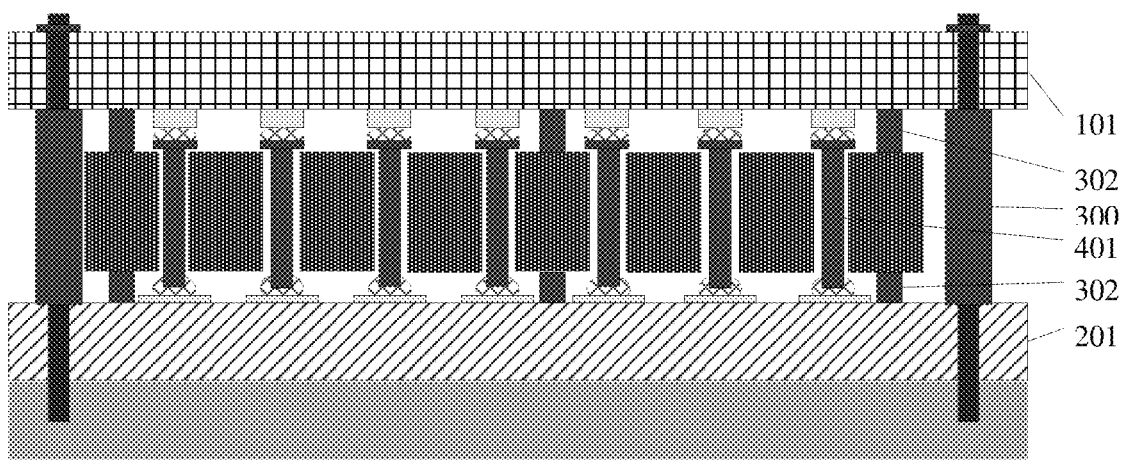
FIG. 13 is an example schematic diagram of another board-level architecture according to an embodiment of this application.
Figure 14:
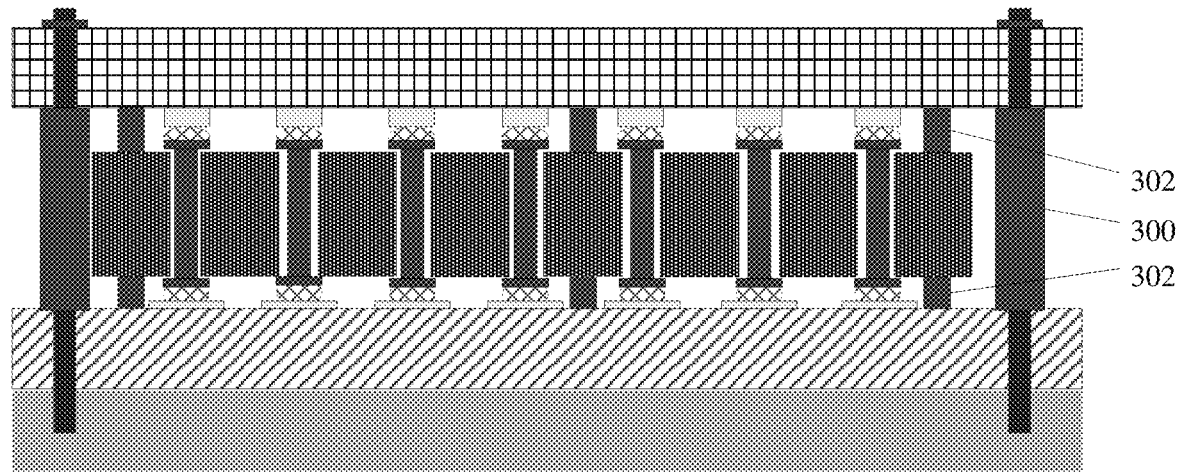
FIG. 14 is an example schematic diagram of another board-level architecture according to an embodiment of this application.

An embodiment of the present technology provides a board-level architecture. As shown in FIG. 13, the board-level architecture 200 (the board-level architecture in FIG. 13 is still shown in a cross-sectional view along a horizontal direction) includes the connection assembly 100 shown in FIG. 12a, and a semiconductor wafer (an upper layer substrate 101) and a circuit board (a lower layer substrate 201) that are interconnected through the connection assembly 100. It should be understood that, in actual application, there may not be one connection assembly 100, and there may alternatively be a plurality of connection assemblies 100 arranged in an array form. The board-level architecture shown in the embodiment of FIG. 13 includes only one connection assembly 100 (only one connection assembly 100 that horizontally or vertically extends outward can be seen from the cross-sectional view). The board-level architecture 200 further includes an upper bracket and a lower bracket. The upper bracket has an empty slot region corresponding to a position of the connection assembly 100. The connection assembly 100 may be disposed in the empty slot region of the upper bracket in a one-to-one correspondence. In the embodiment of FIG. 13, a size value of the empty slot region may be any size of an area in which at least one connection assembly can be placed. Optionally, a shape of the empty slot region is correspondingly the same as a shape of one connection assembly 100. In an example, a gap region between connection assemblies 100, namely, a non-empty-slot region of the upper bracket, may be for drilling a through hole. An objective of the through hole is to enable a plurality of connection parts 500 to penetrate the upper bracket and reach the lower bracket, to fasten the upper bracket and the lower bracket in a press fit. In an embodiment, the connection part 500 may be any fastening structure such as a screw or a nut, and technical effect thereof is to prevent warpage and deformation of the circuit board 201 by using the bracket, so as to avoid problems such as board-level cracking, an electrical open circuit, and a device failure caused by deformation, effectively adjust a gap distance between the circuit board 201 and the semiconductor wafer 101, and improve stability and reliability of signal conduction.

In an example, the lower layer substrate and the lower bracket may also be fastened through a connector. This connector and a connector between the upper bracket and the lower bracket may be a same fastening structure or different fastening structures. An objective thereof is to further improve an anti-deformation capability of the lower layer substrate (the circuit board 201), so as to avoid problems such as board-level cracking, an electrical open circuit, and a device failure caused by deformation.

In an example, the upper layer substrate (the semiconductor wafer 101) may be fastened to a heat sink through a connector. This connector and the connector between the upper bracket and the lower bracket may be a same fastening structure or different fastening structures. The heat sink may serve as a component of a cooling system to reduce operation temperature of the semiconductor wafer 101. Because temperature is one of main causes of expansion and deformation, the heat sink is fastened to the upper layer substrate. This can further fasten a position of the semiconductor wafer, prevent a device failure caused by deformation or a position deviation, and improve operation reliability of the upper layer substrate. This can also facilitate heat dissipation for the semiconductor wafer, and improve system stability.

In an example, the connector and the connection part 500 may be separately mounted, and positions of the connector and the connection part 500 may be adaptively adjusted. This is not further limited in this application. Alternatively, a press-fit between a plurality of layers of structures may be completed at a time only by using the connection part 500 (not shown in FIG. 2). In this case, at least one of the plurality of connection parts 500 may penetrate a top surface of a heat sink on the upper layer substrate 101 and reach a bottom surface of the lower bracket, and is fastened by a nut. This connection structure can further ensure press-fit effect of a plurality of layers of boards, and prevent device failures caused by warpage and deformation. In addition, this connection structure is simple and easy to mount, and a press-fit between a plurality of layers of structures may be completed at a time only by using fasteners of uniform specifications. This reduces assembly time, and also reduces procurement costs.

This application further provides a manufacturing method for the connection assembly and the board-level architecture in the foregoing embodiments. Specifically, in an embodiment, in a normal temperature environment, a functional device is assembled on a surface of a lower layer substrate (a printed circuit board 201), and a solder pad is mounted on another surface. A quantity and an arrangement position of solder pads are determined based on the connection assembly. The connection assembly is bonded to the solder pad through welding. The solder ball is disposed at a first end of the connection assembly. In an embodiment, ambient temperature for welding of the solder ball may be any temperature for low-temperature welding, for example, may be approximately 138 degrees or 118 degrees. Specific temperature is not specifically limited in this application. A lower bracket is mounted on the surface, on which the functional device is assembled, of the lower layer substrate. The lower bracket is configured to correct possible deformation of the printed circuit board.

In addition, a solder pad is disposed on a surface, facing the lower layer substrate, of an upper layer substrate (a semiconductor wafer 101), and a quantity and an arrangement position of solder pads are determined based on the connection assembly. In an embodiment, solder paste is printed on the solder pad, and a heat sink or an upper bracket is mounted on another surface of the upper layer substrate. The upper bracket is configured to correct deformation of the semiconductor wafer 101, and the heat sink is configured to dissipate heat for the semiconductor wafer 101.

The upper layer substrate and the lower layer substrate are mounted and welded in alignment. A position of the solder pad on the upper layer substrate is in a one-to-one correspondence with the first end of the connection assembly. Ambient temperature for welding of the solder ball may be any temperature for low-temperature welding, for example, may be approximately 138 degrees or 118 degrees. Specific temperature is not specifically limited in this application.

An embodiment of the present technology provides a board-level architecture in which the foregoing upper bracket is mounted. The upper bracket includes a spacer 302 and an upper bracket body 300. There are a plurality of spacers 302. For example, the spacer 302 includes an upper layer substrate spacer, namely, a first spacer 3021. One end of the first spacer 3021 is fastened to an upper surface of an insulator structure, and another end is fastened to a semiconductor wafer. Optionally, the spacer 302 further includes a lower layer substrate spacer, namely, a second spacer 3022. One end of the lower layer substrate spacer is fastened to a lower surface of the insulator structure, and another end is fastened to a lower layer substrate. In an example, both the first spacer 3021 and the second spacer 3022 may exist in the board-level architecture, or only the first spacer 3021 may exist. In an example, one end of any first spacer 3021 or second spacer 3022 is connected to a contact surface through welding.

In an example, the first spacer 3021 is located between the semiconductor wafer and the upper surface of the insulator structure, and a lower surface of the first spacer 3021 is welded to the upper surface of the insulator structure. A function of the welding is to better determine a position of the spacer along a horizontal direction, to avoid lap welding with a solder ball.

It should be understood that there may be a plurality of first spacers 3021, the first spacers 3021 may form a cylindrical structure, and a cross section at any position is in a circular or polygonal shape. For example, a cross section of the first spacer 3021 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the first spacers 3021 are distributed at an endpoint and a center of the connection assembly. It should be understood that specific position distribution of the first spacers 3021 is not limited. Optionally, the first spacers 3021 are disposed at four endpoints and a center point of each connection assembly. Optionally, a spacer located at the central point is a circular first spacer 3021, and spacers located at the four endpoints are triangular first spacers 3021.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The first spacer 3021 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

It should be understood that there may be a plurality of second spacers 3022, the second spacers 3022 may form a cylindrical structure, and a cross section at any position is in a circular or polygonal shape. For example, a cross section of the second spacer 3022 may be in a polygonal shape. Optionally, the polygonal shape may be a triangular shape. Compared with a circular spacer, a triangular spacer has higher customizability and a larger area, provides better support, and can fully utilize a gap region on a connection assembly. In an example, the second spacers 3022 are distributed at an endpoint and a center of the connection assembly. It should be understood that specific position distribution of the second spacers 3022 is not limited. Optionally, the second spacers 3022 are disposed at four endpoints and a center point of each connection assembly. Optionally, a spacer located at the central point is a circular second spacer 3022, and spacers located at the four endpoints are triangular second spacers 3022.

A function of disposing the spacers is to more flexibly adjust a tolerance at each position. Because a tolerance absorbed by the upper bracket is a sum of tolerances at two ends of a connection terminal and a tolerance of the insulator structure, the cumulative tolerance eventually causes an excessively large overall tolerance of the connection assembly, or an excessively large difference between tolerances at local positions. The second spacer 3022 is configured to absorb a tolerance from the upper surface of the insulator structure to the semiconductor wafer, and the second spacer 3022 is configured to absorb a tolerance from the lower surface of the insulator structure to the semiconductor wafer. This can ensure that deformation stress eventually applied to the upper bracket is not excessively large, and further improve a stress absorption capability of the board-level architecture, and effectively prevent device loss in the case of a large tolerance and large stress.

In addition, the spacers have a small size and can adaptively adjust a local tolerance difference, so that an overall tolerance absorption amount is more uniform, and local loss caused by an excessively large local tolerance is prevented.

In an example, materials of the first spacer 3021 and the second spacer 3022 may be any plated metal, or may be metal that does not need to be plated, for example, a copper-nickel-zinc alloy.

For example, the spacers 302 are located at four endpoints and a central point of a single connection assembly. It should be understood that position distribution of the spacers 302 is not strictly limited. Because an inter-board tolerance is large and tolerance distribution is not the same, the spacers are disposed locally. Compared with an upper bracket located between connection assemblies, the spacers can further absorb a local tolerance, to significantly resolve problems such as an open circuit, a board-level failure, and damage caused by an excessively large tolerance, and further improve assembly quality and assembly reliability.

Figure 15:
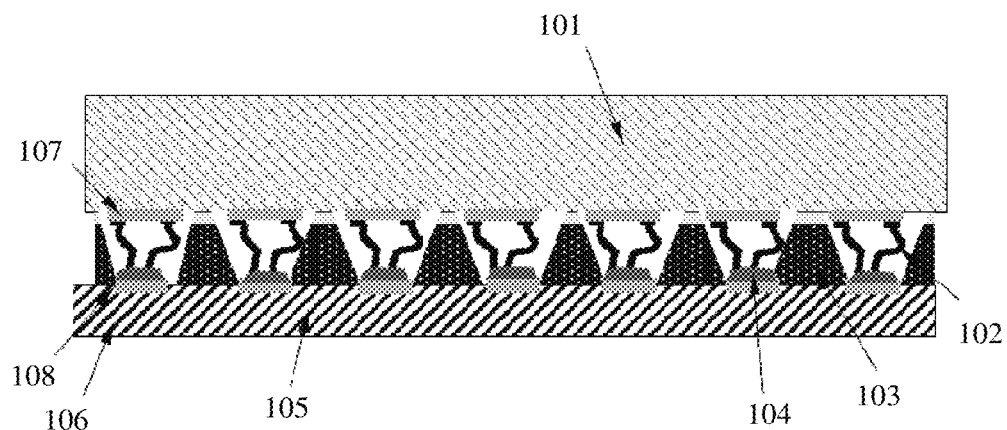
FIG. 15 is an example schematic cross-sectional view of a connection assembly according to an embodiment of this application.

This application provides a connection assembly. An embodiment of the present technology provides a connection assembly. FIG. 15 is a cross-sectional view of a connection assembly pressed against by a circuit board 105 and a chip 101 that are in a press fit. The chip may alternatively be a single chip, a large-sized chip, or the like. The circuit board may be a substrate such as a printed circuit board (PCB) or a glass substrate. For ease of description, technical solutions in embodiments of this application are described in detail by using the chip and the circuit board as examples.

As shown in FIG. 15, seven chip solder pads 107 are disposed on a surface of the chip 101. Correspondingly, seven circuit board solder pads 108 are disposed on the circuit board 105 at positions corresponding to the chip solder pads 107.

It should be understood that there are not necessary seven solder pads 108 or seven solder pads 107. FIG. 15 shows an embodiment only from a cross-sectional view. The chip 101 includes a solder pad array of M rows×N columns, where M and N may be equal or unequal. A quantity and a size of solder pads depend on sizes of the chip 101 and the circuit board 105. In an embodiment of this application, a shape of the chip 101 (or a large-sized chip 101, or the like) may be a circular shape, and a size may be any value ranging from 4 inches to 12 inches; or a shape of the semiconductor wafer 101 may be a square shape, and a size may be any value ranging from 10 mm×10 mm to 300 mm×300 mm. Further, a size of the circuit board 105 is greater than a size of the chip 101.

Correspondingly, the circuit board 105 includes a circuit board solder pad array of M rows×N columns, and positions of the circuit board solder pads 108 remain in a one-to-one correspondence with positions of the chip solder pads 107.

A support body 103 is further fastened to the circuit board 105. In an embodiment of this application, the support body 103 is fastened to the circuit board 105 through an adhesive. The support body 103 includes an empty slot array of K rows×J columns. As shown in FIG. 15, a colorless region between the chip 101 and the circuit board 105 is the empty slot array, empty slots penetrate the support body 103 along a vertical direction, positions of the empty slots are in a one-to-one correspondence with the positions of the circuit board solder pad 108, and the circuit board solder pads 108 are disposed in the empty slots. It can be simply inferred that the positions of the empty slots also remain in a one-to-one correspondence with the positions of chip solder pads 107. FIG. 15 is used as an example. Along the vertical direction, the seven chip solder pads 107 shown in the figure correspond to the seven circuit board solder pads 108 under the seven chip solder pads 107, and correspond to empty slots surrounding the seven chip solder pads 107 and the seven circuit board solder pads 108.

Figure 16:
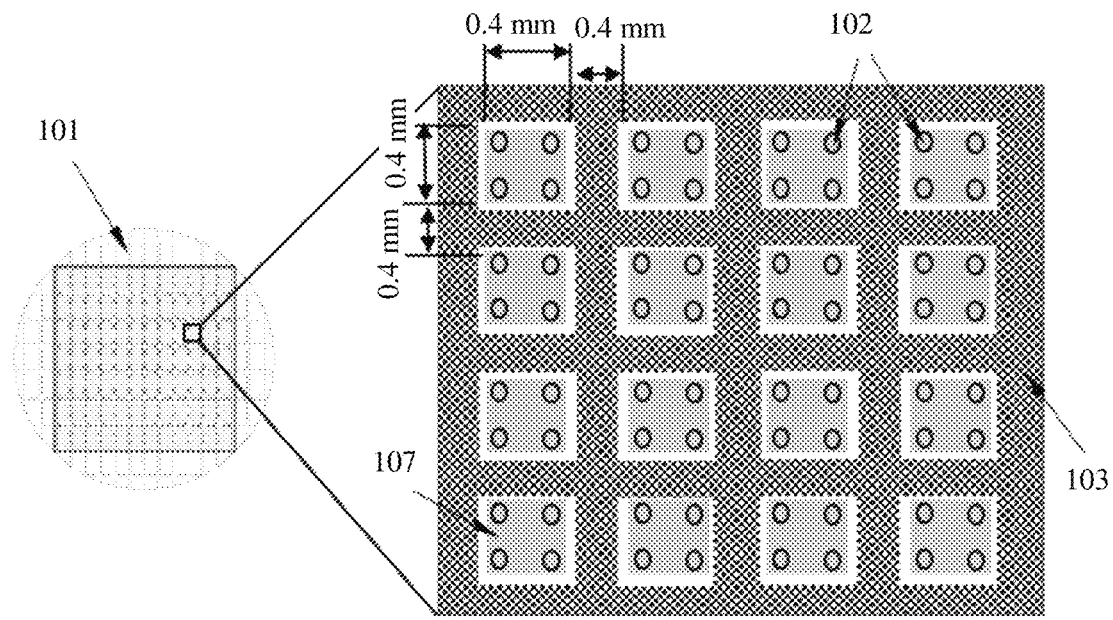
FIG. 16 is an example top view of a structure in which a connection assembly is connected to a chip according to an embodiment of this application.

For ease of understanding a combined structure of the circuit board solder pads, the chip solder pads, and the support body, FIG. 16 is a partial top view of interconnection between the chip and the circuit board. A rectangular array on a right side of the figure is a partial structure in the chip 101 on a left side of FIG. 16. It can be more clearly seen from FIG. 16 that the array of the chip solder pads 107 remains in a one-to-one correspondence with the empty slot array of the support body 103. In an example shown in FIG. 16, the empty slot is in a rectangular shape, an array spacing is 0.4 mm, and a side length of the rectangular empty slot is 0.4 mm.

Figure 17:
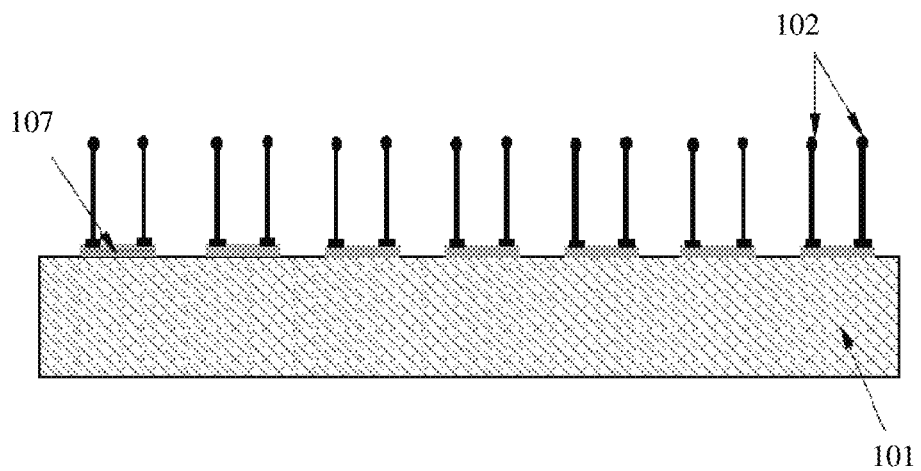
FIG. 17 to FIG. 21 are example schematic diagrams of structures of a connection assembly in different stages of a manufacturing process according to an embodiment of this application.

The circuit board solder pad 108 is connected to the chip solder pad 107 through a flexible metal wire 102. As shown in FIG. 15, the flexible metal wire 102 is bent and deformed in a press-fit state. Before the circuit board 105 and the chip 101 are in a press fit, the flexible metal wire 102 is shown in FIG. 17. One end of the flexible metal wire 102 is electrically connected to the chip solder pad 107 through ultrasonic welding. It should be understood that there may be a plurality of connection modes. For example, in another embodiment, the electrical connection may be implemented through solder welding. The flexible metal wire extends along the vertical direction toward a direction away from the chip solder pad 107. A material of the flexible metal wire 102 may be any conductive material with a flexible deformation capability, for example, a copper wire, a gold wire, or an aluminum wire. A diameter of the flexible metal wire 102 is any value ranging from 10 μm to 300 μm, and a length of the flexible metal wire 102 is any value ranging from 0.3 mm to 3 mm. It should be understood that a quantity of flexible metal wires 102 may be in a plurality of forms. In the embodiments shown in FIG. 15 and FIG. 17, there are four flexible metal wires 102 (only two flexible metal wires can be seen from the cross-sectional view), and the flexible metal wires 102 are arranged in an array. The quantity of flexible metal wires 102 may be any value ranging from 1 to 100.

Still as shown in FIG. 15, a part of the support body 103 other than the empty slots is made of an insulation material. The part is used to isolate flexible metal wires 102 of solder pads, to avoid a short circuit caused by a connection between the flexible metal wires 102 of the solder pads. In addition, along the vertical direction, the part is in contact with the circuit board 105 on one side, and is in contact with the chip 101 on another side, to control a gap between the chip 101 and the circuit board 105.

A reason why the flexible metal wire 102 in FIG. 15 is bent and deformed is that the length of the flexible metal wire 102 is greater than a thickness of the support body. Specifically, a difference between the length of the flexible metal wire 102 and the thickness of the support body 103 is greater than or equal to 0.1 mm and less than or equal to 9.9 mm.

When the circuit board 105 and the chip 101 are aligned in a press fit, the flexible metal wire 102 is deformed under an external press-fit force. Because devices with different sizes are disposed on the circuit board, distances between local surfaces of the circuit board and the chip are also different. Because the flexible metal wire has a good bending capability, the flexible metal wire may be adaptively bent based on a relative inter-board distance at a position of the flexible metal wire during press-fitting. In an example, if a height of the circuit board at a position is large, stress applied to the flexible metal wire 102 at the position is also large, and the flexible metal wire 102 is greatly bent, and vice versa. In this way, stress to be transferred to the chip is absorbed by the flexible metal wire. In a conventional manner, a press-fit retention force of thousands of kg is needed to ensure reliability of inter-board press-fitting, leading to problems such as device loss, high power consumption, and high costs. The foregoing problems can be effectively resolved in the solution provided in this application. During press-fitting, positions of the circuit board solder pads 108 and the chip solder pads 107 should be accurately determined, and an allowed deviation of alignment precision does not exceed ±0.1 mm. Specifically, the positions may be accurately determined in plurality of manners. In an example, a plurality of mark points may be set on the chip 101 and the circuit board 105 for point-to-point positioning.

Solder paste is applied to the circuit board solder pad 108, and the solder paste is used to weld the flexible metal wire 102 to the circuit board solder pad 108 to form an electrical connection. It should be understood that the electrical connection may be in a plurality of forms. In an example, soldering tin may be pre-made on the circuit board solder pad, and then solder is applied; and the flexible metal wire is connected to the circuit board through welding.

It can be learned from FIG. 15 that, for a cavity region of the support body 103, a size of an opening close to the chip (referred to as a lower opening below) is greater than a size of an opening away from the chip 101 (referred to as an upper opening below). In the example shown in FIG. 15, a shape of the cavity region may be a truncated cone or a truncated pyramid. Specifically, a diameter or a side length of the lower opening may range from 0.6 mm to 0.9 mm, and a diameter or a side length of the upper opening may range from 0.1 mm to 0.5 mm. An objective of the shape is as follows: The flexible metal wire 102 is gathered by the upper opening, so that the flexible metal wire 102 can be accurately electrically connected to the circuit board solder pad more easily. In addition, this also avoids out-of-control deformation such as outward splitting of an array of a plurality of flexible metal wires 102 during press-fitting, and therefore avoids consequences such as a connection failure or a short circuit with the circuit board. It can be understood that a shape of the empty slot may be in a plurality of forms, for example, a truncated pyramid, a prism, or a cylinder, and sizes of an upper opening and a lower opening of the empty slot may alternatively be the same.

In addition, as shown in FIG. 15, the circuit board 105 and the chip 101 are further fastened by a screw and a nut, to correct a deviation of horizontal or vertical displacement between the chip 101 and the circuit board 105. It should be noted that the flexible metal wire 102 also has a good bending and deformation capability along a horizontal direction, and can absorb horizontal stress generated due to relative displacement during press-fitting. A high fitting interface tolerance capability is achieved, and an allowable deviation may be greater than 0.5 mm or even 1 mm. The flexible metal wire 102 and the support body 103 ensure efficient interconnection between the circuit board 105 and the chip 101. Compared with a conventional connection solution, this greatly reduces costs, provides an ultra-large press-fit retention force, reduces power consumption, and saves floor space. In addition, a reliability problem caused by a mismatch between coefficients of thermal expansion (CTE) or vibration during a temperature cycle test or operation at extreme temperature (high temperature or low temperature) after the chip and a board are connected is resolved.

Refer to FIG. 17 to FIG. 21. Another embodiment of the present technology provides a manufacturing method for a connection assembly. The method includes the following steps.

As shown in FIG. 17, a flexible metal wire is disposed on a solder pad array on a surface of a chip 101. In an example, the flexible metal wire may be connected through a metal bonding process or in another manner, for example, through solder welding. The flexible metal wire may be made of a metal material with conductivity, for example, a copper wire, an aluminum wire, or a gold wire. A diameter of the flexible metal wire may range from 10 μm to 300 μm, and a length of the flexible metal wire may range from 0.3 mm to 3 mm. One end of the flexible metal wire is connected to the solder pad array on the surface of the chip 101, and the other end extends along a direction perpendicular to the surface of the chip 101.

Figure 18:
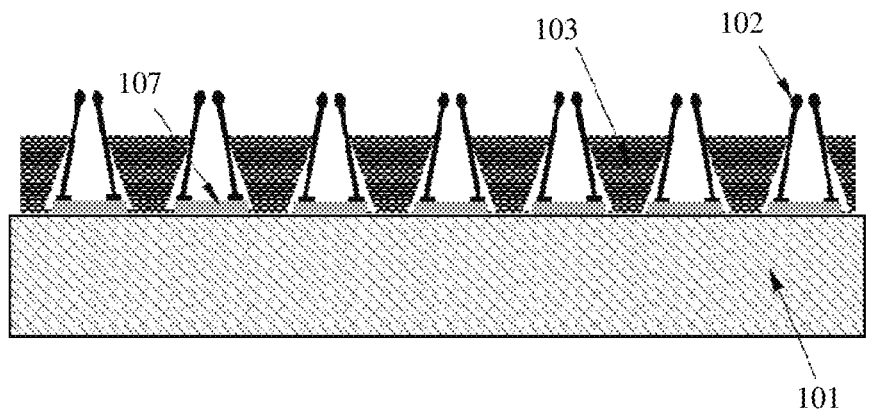

As shown in FIG. 18, a support body is mounted on the surface of the chip 101. Optionally, the support body may be mounted in a conventional bonding manner, for example, through an adhesive. The empty slots are in a one-to-one correspondence with the chip solder pads 107. In an example, a high-precision alignment operation may be performed based on coordinate points during mounting, and a range of an alignment error between the chip solder pad array and the support body should be less than or equal to ±0.1 mm.

Optionally, the empty slot may be in a shape of a truncated cone. To be specific, an area of an opening away from the surface of the chip 101 (referred to as a lower opening below) is greater than an area of an opening away from the surface of the chip 101 (referred to as an upper opening below). A specific size is as follows: A diameter of the lower opening ranges from 0.6 mm to 0.9 mm a diameter of the upper opening ranges from 0.1 mm to 0.5 mm. It can be understood that, because the upper opening of the empty slot is smaller than the lower opening, when the flexible metal wire extends from the lower opening to the upper opening, the flexible metal wire is gathered by the smaller opening to some extent. In this way, an end of the flexible metal wire that is away from the chip 101 can be more easily and accurately connected to the solder pad of the circuit board 105 in a subsequent press-fitting step. This reduces a connection deviation, prevents poor contact caused by outward splitting of the flexible metal wire during press-fitting, and effectively improves connection reliability.

Figure 19:
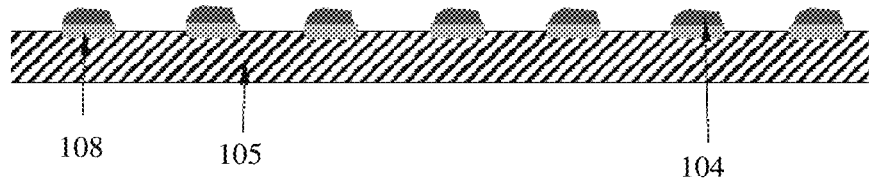
Figure 22:
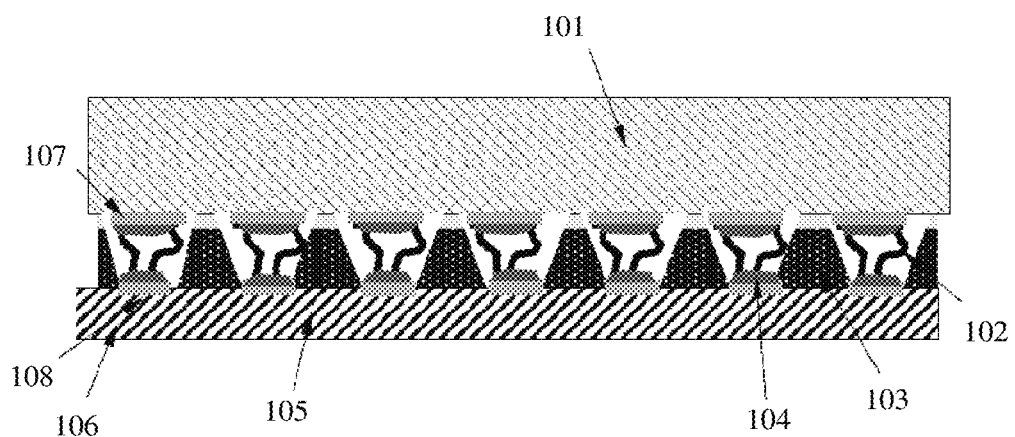
FIG. 22 is an example schematic flowchart of a manufacturing method for a connection assembly according to an embodiment of this application.
Figure 23:
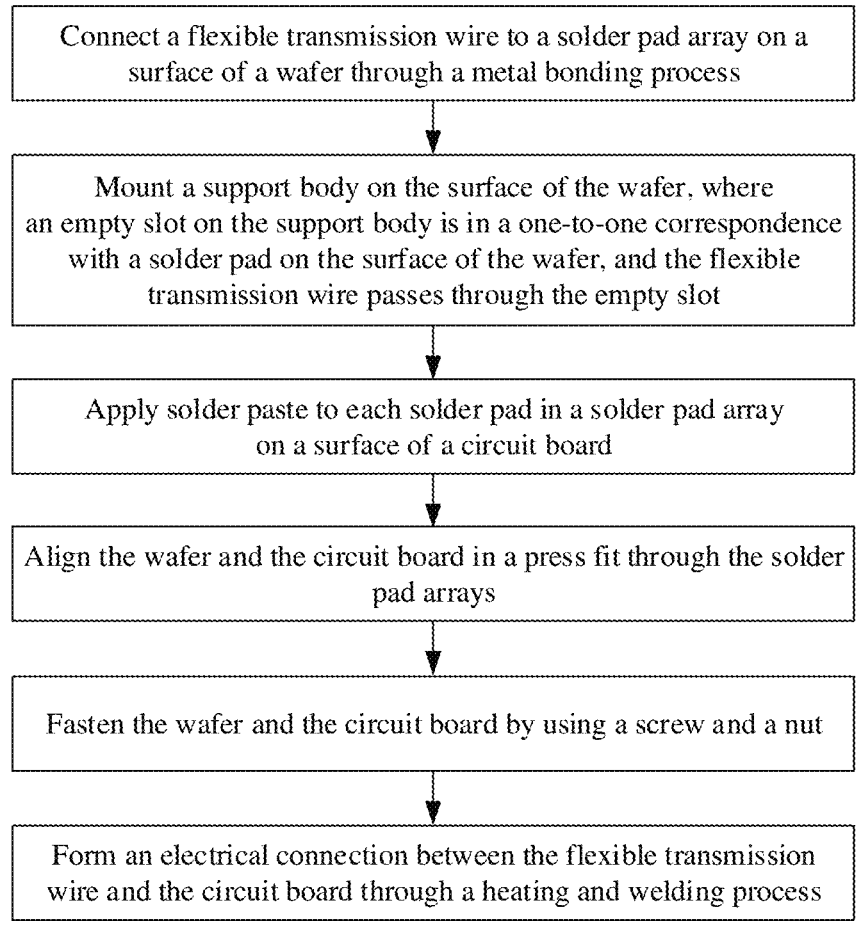
FIG. 23 is an example schematic diagram of a connection mode of another connection assembly according to an embodiment of this application.

As shown in FIG. 19, solder paste is applied to each solder pad in a solder pad array on a surface of the circuit board 105, and the solder paste is used to weld the flexible metal wire 102 to the circuit board solder pad 108 to form an electrical connection. It should be understood that the electrical connection may be in a plurality of forms. In an example, as shown in FIG. 22, solder paste is applied to each solder pad of the circuit board and the chip. The solder paste is used to weld the flexible metal wire 102 to the circuit board solder pad 108, and is also used to weld the flexible metal wire 102 to the chip solder pad 107, to form electrical connections at two ends of the flexible metal wire 102.

Figure 20:
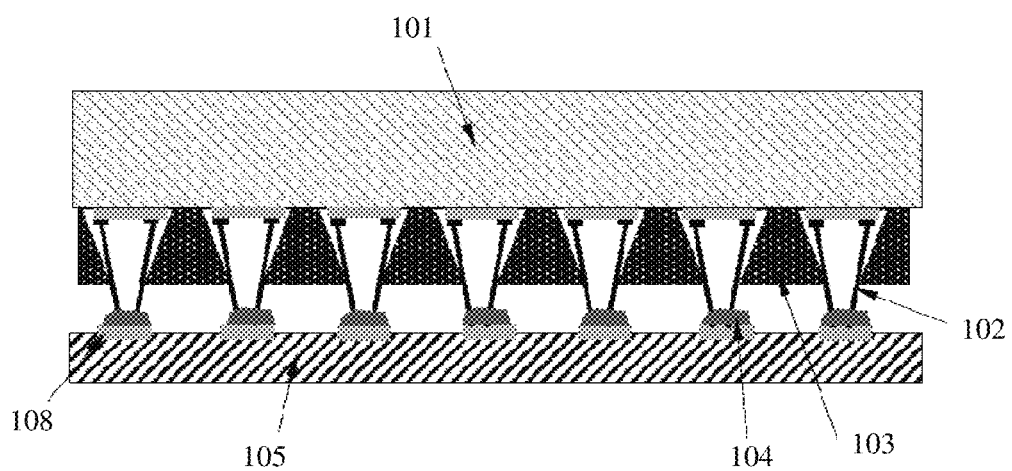

As shown in FIG. 20, the chip 101 and the circuit board 105 are aligned through the solder pad arrays. During alignment and press-fitting, positions of the circuit board solder pads 108 and the chip solder pads 107 should be accurately determined, and an allowed deviation of alignment precision does not exceed ±0.1 mm. Specifically, the positions may be accurately determined in plurality of manners. In an example, a plurality of mark points may be set on the chip 101 and the circuit board 105 for point-to-point positioning.

Figure 21:
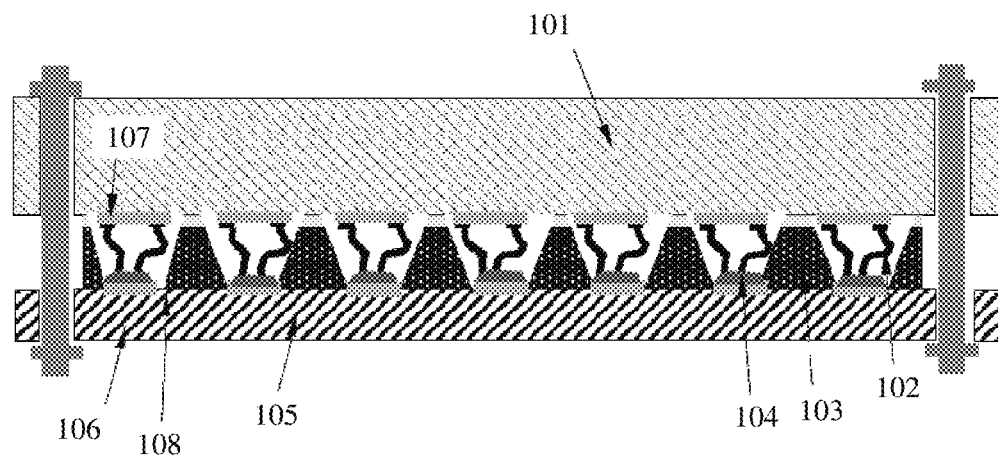

As shown in FIG. 21, press-fitting is performed between the chip 101 and the circuit board 105 that are aligned. In this process, a surface of the support body is in contact with the chip 101, and another surface is in contact with the circuit board 105. Specifically, the support body is configured to control a gap between the circuit board 105 and the chip 101, to implement insulation and isolation between the circuit board 105 and the chip 101 in a non-solder-pad-array region. The flexible metal wire extends to the solder pad array on the circuit board 105 through a cavity array, and is in contact with solder paste. In this way, the circuit board 105 and the chip 101 are aligned in a press fit, the flexible metal wire is adaptively deformed based on a relative distance between the circuit board 105 and the chip 101, and the solder pad array on the circuit board 105 is connected to the solder pad array on the chip 101. The chip 101 and the circuit board 105 are fastened by a screw and a nut along a vertical direction. The screw penetrates the circuit board 105 and the chip 101, and is fastened by a corresponding nut. An objective is to further correct deformation of the chip and the circuit board 105, and control a vertical gap between the chip and the circuit board 105 by using the support body. It can be understood that, during fastening by the screw, the flexible metal wire is used to further adjust a fitting error along a horizontal direction and the vertical direction, and the screw can further improve reliability and connection strength of the connection assembly. It should be understood that there may be a plurality of fastening manners. In addition to fastening by using the screw and the nut, other fastening manners are also applicable to embodiments of this application.

FIG. 22 is a schematic diagram of another connection mode in which the connection assembly is used. As shown in FIG. 22, solder is applied to a surface of a chip solder pad 107 and a surface of a circuit board solder pad 108, where the solder may be a conventional welding material such as a tin alloy, and two ends of a flexible metal wire are welded. A difference from the connection mode of the connection assembly shown in FIG. 15 (to be specific, solder is applied only to a solder pad of a chip or a solder pad of a circuit board, and another side is connected in another manner, for example, a metal bonding manner) lies in that this connection mode is more convenient for processing, while achieving same effect as that of the connection solution in FIG. 15. Adaptively, as shown in the flowchart of the manufacturing method in FIG. 19, solder paste is applied to each solder pad of the circuit board and the chip. The solder paste is used to weld the flexible metal wire 102 to the circuit board solder pad 108, and is also used to weld the flexible metal wire 102 to the chip solder pad 107, to form electrical connections at two ends of the flexible metal wire 102.

Figure 24:
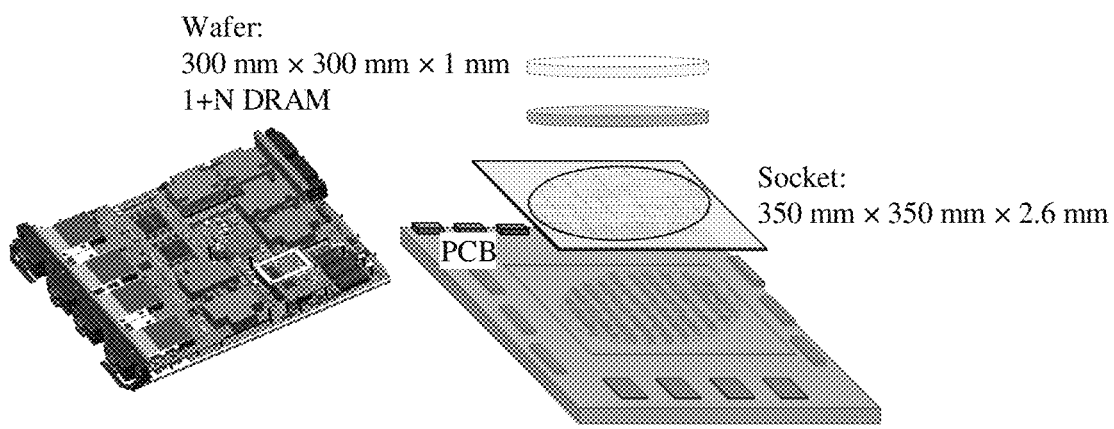
FIG. 24 is an example schematic diagram of a product in which a connection assembly is integrated according to an embodiment of this application.

FIG. 24 is a schematic diagram of a product to which the connection assembly is applied. As shown in FIG. 24, a chip-on-board packaging solution in the conventional technology is shown on a left side, where a plurality of chips are arranged on a board, and the chips are connected through internal wiring of a PCB. A schematic diagram of an SoW product corresponding to the present technology is shown on a right side. All chips are integrated into one chip, and chips with different functions are connected through wiring on the chip. This can greatly improve product performance and reduce transmission loss.

The foregoing descriptions are specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A connection assembly configured to connect a semiconductor wafer and a lower layer substrate, the semiconductor wafer and the lower layer substrate are disposed opposite to each other, and the connection assembly comprising:

an insulator structure; and a plurality of connection terminals disposed at spacings, wherein a connection terminal, of the plurality of connection terminals, includes a first end and a second end, and the first end and the second end each are provided with a welding structure, the first end and the second end are opposite ends of the connection terminal, the first end is welded to the semiconductor wafer through the welding structure, the second end is welded to the lower layer substrate through the welding structure, the insulator structure includes a plurality of empty slots provided at the spacings, positions of the plurality of empty slots are in a one-to-one correspondence with positions of the plurality of connection terminals, at least one of the pluralities of connection terminals is disposed in a corresponding empty slot, from the plurality of empty slots, to fasten a position of the connection terminal, each empty slot, from the plurality of empty slots, of the insulator structure includes a fastening part region and a cavity part region, the fastening part region and the cavity part region are divided along a vertical direction of the plurality of empty slots, an area of any cress section of an empty slot in the fastening part region is less than an area of any cross section of an empty slot in the cavity part region along the vertical direction, and the fastening part region is configured to fasten a position of the body of the connection terminal.

2. The connection assembly according to claim 1, wherein the connection terminal includes a body and a connection part, the connection part is located at, at least, one end of the body, and the connection part is combined with the welding structure.

3. The connection assembly according to claim 2, wherein the body and the connection part form cylindrical structures, the connection part is disposed at the first end of the connection terminal, an area of any cross section of the connection part along a vertical direction is greater than an area of any cross section of the body along the vertical direction, and a height of the connection part along the vertical direction is less than a height of the body along the vertical direction.

4. The connection assembly according to claim 3, wherein the welding structure is a solder ball.

5. The connection assembly according to claim 2, wherein the body is a deformable structure configured to adjust a height of the connection terminal along a vertical direction or displacement of the connection terminal along a horizontal direction.

6. The connection assembly according to claim 2, wherein the connection part is located at the first end and the second end, and at least one of the first end and the second end is covered by a solder ball.

7. The connection assembly according to claim 5, wherein the deformable structure is a spring structure.

8. The connection assembly according to claim 5, wherein the deformable structure is a loop structure including a plurality of "C"-shaped structures connected head to tail along the vertical direction.

9. The connection assembly according to claim 5, wherein the deformable structure is a flexible metal wire, and a length of the flexible metal wire along the vertical direction is greater than or equal to a thickness of the insulator structure along the vertical direction.

10. The connection assembly according to claim 3, wherein the welding structure includes a solder ball and a solder structure, a surface of the connection part away from the body is provided with the solder ball, the second end of the connection terminal is provided with the solder structure, and the solder structure covers a part of the body to fasten the connection terminal.

11. The connection assembly according to claim 10, wherein the solder structure includes solder and a solder accommodation structure, the solder is injected into the solder accommodation structure, and a part of the body of the connection terminal is located in the solder accommodation structure and the part of the body of the connection terminal is covered by the solder.

12. The connection assembly according to claim 11, wherein the solder accommodation structure is a metal enclosure frame with a side surface; or the solder accommodation structure is a metal box with a side surface and a bottom surface, and the bottom surface faces the lower layer substrate.

13. The connection assembly according to claim 11, wherein the connection assembly further includes a solder mask layer, the solder mask layer and the insulator structure are stacked, the solder mask layer includes a plurality of through grooves provided at the spacings, positions of the plurality of through grooves are in a one-to-one correspondence with the positions of the plurality of connection terminals, the plurality of through grooves form the solder accommodation structure, and at least one of the plurality of connection terminals penetrates a corresponding empty slot of the insulator structure and the at least one of the plurality of connection terminals is disposed in a corresponding through groove, to fasten a position of the connection terminal.

14. A board-level architecture, comprising:

a semiconductor wafer;

a lower layer substrate; and the connection assembly according to claim 11, wherein the lower layer substrate includes a plurality of blind slots provided at spacings, positions of the plurality of blind slots are in a one-to-one correspondence with positions of a plurality of connection terminals, and the plurality of blind slots form slots form a solder accommodation structure.

15. The connection assembly according to claim 1, wherein the cavity part region is configured to form the solder accommodation structure.

16. The connection assembly according to claim 1, wherein the welding structure is a solder ball, and the connection terminal is welded to the semiconductor wafer and the lower layer substrate through the solder ball.

17. The connection assembly according to of claim 1, wherein at least four of the plurality of connection terminals form a connection terminal array of M rows×N columns, M and N are integers greater than or equal to 2, at least four of the plurality of empty slots of the insulator structure form an empty slot array of K rows×J columns, and K and J are integers greater than or equal to 2.

18. A board-level architecture, comprising:

a semiconductor wafer;

a lower layer substrate;

an upper bracket;

a lower bracket; and a connection assembly having an insulator structure and a plurality of connection terminals disposed at spacings, wherein a connection terminal, of the plurality of connection terminals, includes a first end and a second end, and the first end and the second end each are provided with a welding structure, the first end and the second end are opposite ends of the connection terminal, the first end is welded to the semiconductor wafer through the welding structure, the second end is welded to the lower layer substrate through the welding structure, the insulator structure includes a plurality of empty slots provided at the spacings, positions of the plurality of empty slots are in a one-to-one correspondence with positions of the plurality of connection terminals, and at least one of the plurality of connection terminals is disposed in a corresponding empty slot, from the plurality of empty slots, to fasten a position of the connection terminal, wherein the connection assembly is disposed between the semiconductor wafer and the lower layer substrate, to connect the semiconductor wafer to the lower layer substrate, a plurality of first solder pads are disposed on a surface of the semiconductor wafer close to the connection terminal, a plurality of second solder pads are disposed on a surface of the lower layer substrate close to the connection terminal, the plurality of first solder pads and the plurality of second solder pads are respectively connected to first ends and second ends of a plurality of corresponding connection terminals, the upper bracket is fastened to an upper surface of the lower layer substrate through a connection part, the lower bracket is fastened to a lower surface of the lower layer substrate through the connection part, and the upper bracket comprises at least one empty slot region provided at spacings, and at least one connection assembly is disposed in a corresponding empty slot region.

19. The board-level architecture according to claim 18, further comprising:
a first spacer, wherein
the first spacer is located on the connection assembly and the first spacer is located between the semiconductor wafer and an upper surface of the insulator structure, and
a lower surface of the first spacer is welded to the upper surface of the insulator structure.

20. The board-level architecture according to claim 19, wherein a cross section at any position on the first spacer is circular or triangular.

21. The board-level architecture according to claim 19, further comprising:
a plurality of first spacers, wherein the first spacers are located at, at least, three endpoints of the connection assembly.

22. The board-level architecture according to claim 18, further comprising:
a second spacer, wherein
the second spacer is located on the lower layer substrate and the second spacer is located between the upper surface of the lower layer substrate and a lower surface of the insulator structure, and
a lower surface of the second spacer is welded to the lower layer substrate.

23. The board-level architecture according to claim 22, wherein a cross section at any position on the second spacer is in a circular or triangular shape.

24. The board-level architecture according to claim 23, further comprising:
a plurality of second spacers, wherein the plurality of second spacers are located at, at least, three endpoints of the connection assembly.

25. The board-level architecture according to claim 18, wherein
the semiconductor wafer includes a chip, a wafer, a wafer assembly, or a printed circuit board provided with a wafer, and
the lower layer substrate is a printed circuit board.

26. A computing device, comprising:
a cooling system; and
a board-level architecture, wherein the board-level architecture includes a semiconductor wafer, a lower layer substrate, an upper bracket, a lower bracket, and a connection assembly having an insulator structure and a plurality of connection terminals disposed at spacings, wherein
a connection terminal, of the plurality of connection terminals, includes a first end and a second end, and the first end and the second end each are provided with a welding structure, the first end and the second end are opposite ends of the connection terminal, the first end is welded to the semiconductor wafer through the welding structure, and the second end is welded to the lower layer substrate through the welding structure,
the insulator structure includes a plurality of empty slots provided at the spacings, positions of the plurality of empty slots are in a one-to-one correspondence with positions of the plurality of connection terminals, at least one of the plurality of connection terminals is disposed in a corresponding empty slot, from the plurality of empty slots, to fasten a position of the connection terminal, and the connection assembly is disposed between the semiconductor wafer and the lower layer substrate, to connect the semiconductor wafer to the lower layer substrate,
a plurality of first solder pads are disposed on a surface of the semiconductor wafer close to the connection terminal, a plurality of second solder pads are disposed on a surface of the lower layer substrate close to the connection terminal, and the plurality of first solder pads and the plurality of second solder pads are respectively connected to first ends and second ends of a plurality of corresponding connection terminals,
the upper bracket is fastened to an upper surface of the lower layer substrate through a connection part, and the lower bracket is fastened to a lower surface of the lower layer substrate through the connection part, and
the upper bracket includes at least one empty slot region provided at the spacings, at least one connection assembly is disposed in a corresponding empty slot region, and the cooling system is disposed on an upper surface of a semiconductor wafer to dissipate heat for a wafer structure.

* * * * *